US008937828B2

(12) United States Patent
Mattausch et al.

(10) Patent No.: US 8,937,828 B2
(45) Date of Patent: Jan. 20, 2015

(54) ASSOCIATIVE MEMORY

(75) Inventors: Hans Juergen Mattausch, Higashihiroshima (JP); Tetsushi Koide, Higashihiroshima (JP); Masahiro Yasuda, Higashihiroshima (JP); Seiryu Sasaki, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 386 days.

(21) Appl. No.: 13/466,381

(22) Filed: May 8, 2012

(65) Prior Publication Data

US 2013/0114322 A1     May 9, 2013

(30) Foreign Application Priority Data

Nov. 7, 2011    (JP) ................................. 2011-243733

(51) Int. Cl.
     *G11C 15/00*      (2006.01)
     *G11C 15/04*      (2006.01)

(52) U.S. Cl.
     CPC ........................................ *G11C 15/04* (2013.01)
     USPC .................... 365/49.17; 365/49.1; 365/49.18

(58) Field of Classification Search
     USPC ................................... 365/19.1, 49.17, 49.18
     See application file for complete search history.

(56) References Cited

U.S. PATENT DOCUMENTS 7,852,652 B1 *   12/2010   Fabry ........................... 365/49.17
8,587,980 B2 *   11/2013   Mattausch et al. ........... 365/49.17
2002/0125500 A1 *   9/2002   Mattausch et al. ............. 257/200
2005/0162878 A1 *   7/2005   Koide et al. ...................... 365/49
2009/0141531 A1 *   6/2009   Abedin et al. .............. 365/49.17

OTHER PUBLICATIONS

S. Sasaki et al., "Compact Multi-Bit Encoder for High-Speed Frequency-Mapping Associative Memory." Extended Abstracts of the 2011 International Conference on Solid State Devices and Materials (SSDM' 2011), 1071-1072, Sep. 28, 2011.

Y. Oike et al., "A High-Speed and Low-Voltage Associative Co-Processor with Exact Hamming/Manhattan-Distance Estimation Using Word-Parallel and Hierarchical Search Architecture." IEEE Journal of Solid-State Circuits, vol. 39, No. 8, pp. 1383-1387, Aug. 2004.

M.A. Abedin et al., "Nearest-Euclidean-Distance Search Associative Memory with Fully Parallel Mixed Digital-Analog Match Circuitry," Extended Abstracts of the 2006 International Conference on Solid State Devices and Materials, Yokohama, pp. 282-283, 2006.

* cited by examiner

*Primary Examiner* — Son Dinh
*Assistant Examiner* — Uyen B Tran
(74) *Attorney, Agent, or Firm* — Lowe Hauptman & Ham, LLP

(57) ABSTRACT

An associative memory that can reduce search errors is provided. An associative memory includes R distance/time conversion circuits $DT_1$ to $DT_R$. The R distance/time conversion circuits $DT_1$ to $DT_R$ each include a NAND circuit 40 and N bit stages 41 to 4k. The N bit stages 41 to 4k delay a signal from the NAND circuit 40 by longer delay time as the distance between reference data and search data is greater and oscillate the signal. Among R oscillation signals output from the distance/time conversion circuits $DT_1$ to $DT_R$, the earliest changing oscillation signal is detected as an oscillation signal for the Winner row.

9 Claims, 39 Drawing Sheets

ASSOCIATIVE MEMORY

RELATED APPLICATIONS

The present application is based on, and claims priority from, Japanese Application Number 2011-243733, filed Nov. 7, 2011, the disclosure of which is hereby incorporated by reference herein in its entirety.

TECHNICAL FIELD

The present invention relates to an associative memory.

BACKGROUND OF THE INVENTION

In recent years, applications that need pattern matching such as character recognition and image recognition have attracted much attention. If implemented on LSIs (Large Scale Integrated Circuits), the pattern matching may be applicable to highly functional applications such as artificial intelligence and mobile equipment in the future, which particularly gathers considerable attention.

The pattern matching includes "exact match search processing" to search a plurality of reference data pieces stored in a database for an exact match with the search data and "most similar match search processing" to search for the most similar pattern to the search data.

The former is called CAM "Contents Addressable Memory" and used e.g. for exact-much search with an IP address table in network routers or for implementing caches and virtual memory in a processor. In order to have a computer carry out flexible search/comparison like what is carried out by human brain, implementation of the latter "most similar match search processing" is imperative. A memory capable of implementing such flexible comparison is specially called "associative memory."

Proposed means for implementing an associative memory includes (1) a digital way of implementation (Non-Patent Document 1), (2) an analog way of implementation, and (3) a mixed digital-analog way of implementation (Non-Patent Document 2).

PRIOR ART DOCUMENT

Non-Patent Documents

[Non-Patent Document 1]
Y. Oike, et al., "A High-Speed and Low-Voltage Associative Co-Processor with Exact Hamming/Manhattan-Distance Estimation Using Word-Parallel and Hierarchical Search Architecture," IEEE J. Solid-State Circuits, vol. 39, no. 8, pp. 1383-1387, 2004.

[Non-patent Document 2]
M. A. Abedin, et al., "Nearest-euclidean-distance search associative memory with fully parallel mixed digital-analog match circuitry," Proc. of SSDM2006, pp. 282-283, 2006.

SUMMARY OF THE INVENTION

In a conventional analog associative memory, however, a distance representing similarity between search data and reference data is converted into voltage, which can cause search errors.

The present invention is directed to a solution to the problem and it is an object of the invention to provide an associative memory that can reduce such search errors.

According to an embodiment of the present invention, an associative memory includes a reference data storage cell circuit, a comparator circuit, R conversion circuits, R selection circuits, and a detection circuit. The reference data storage cell circuit stores R (R: an integer not less than 2) reference data piece each having a W (W: an integer not less than 2) bit length. The comparator circuit compares search data to be searched for and having a W bit length to each of the R reference data pieces on a bit basis, and outputs R distance signals each representing a distance between search data and reference data and consisting of a bit value for W bit as a result of comparison between the search data and R reference data pieces. The R conversion circuits are provided corresponding to the R distance signals, and each includes an oscillation circuit having k (k: an integer that satisfies W/N or (W/N)+1, N: an integer not less than 3) delay circuits connected in a ring shape. The R selection circuits are provided corresponding to the R distance signals and the R conversion circuits and each include k path selection circuits. The detection circuit detects the earliest changing output signal among the R output signals, output from the R conversion circuits, and outputs the detected output signal as a signal representing the most similar reference data to the search data.

The R selection circuits each produce k selection signals used to select one delay path from N+1 delay paths in each of the k delay circuits based on said corresponding W-bit distance signal so that delay time in the k delay circuits is shorter as a distance represented by a corresponding W-bit distance signal is smaller and delay time in the k delay circuits is longer as the distance represented by the corresponding W-bit distance signal is greater and outputs the produced k selection signals to the corresponding conversion circuit. Upon receiving the k selection signals from the corresponding selection circuit, the R conversion circuits each oscillate through k delay paths selected by the received k selection signals and outputs the oscillated oscillation signals as an output signal to the detection circuit.

According to the embodiment of the present invention, an associative memory includes a reference storage cell circuit, a comparator circuit, R conversion circuits, and a detection circuit. The reference data storage cell circuit stores W×R reference data pieces, W reference data pieces having K (K: an integer not less than 2) bit length are arranged in column direction and R (R: an integer not less than 2) reference data pieces are arranged in row direction. The comparator circuit compares search data having a K bit length and each of the W×R reference data pieces on a bit basis, and outputs W×R distance signals each representing a distance between the search data and the reference data and each consisting of a bit value for K bit as a comparison result between the search data and the W×R reference data pieces. The R conversion circuits are provided, corresponding to the R distance signals that represent the results of comparison between W reference data pieces each arranged in the column direction and the search data. The R selection circuits provided corresponding to the R distance signals and the R conversion circuits. The detection circuit detects the earliest changing output signal among R output signals output from the R conversion circuits and outputs the detected output signal as a signal representing the most similar reference data to the search data. The R selection circuits each produce, based on W×K bit values of a corresponding distance signal among the R distance signals, a selection signal used to select a first delay path having first delay time when the same order bits of the reference data and the search data are different and a second delay path having second delay time shorter than the delay time when the same order bits match. The R conversion circuits each convert the distance signal into an oscillation signal sequentially from the first distance signal to the second distance signal using the first or second delay paths selected by a selection signal received from the corresponding selection circuit so that delay time is sequentially reduced and frequency is sequentially raised from a first distance signal that represents a distance between the most significant bits of the reference data and the search data to a second distance signal that represents a distance between the least significant bits of the reference data and the search data, and outputs the converted oscillation signal to the detection circuit as an output signal.

According to the embodiment of the present invention, the associative memory converts a distance signal that represents a distance between reference data and search data into an oscillation signal that is a time domain signal, and the earliest changing oscillation signal among the converted oscillation signals is output as an oscillation signal for the Winner row (that indicates that the reference data and the search data are the most similar). In this way, the most similar reference data to the search data is searched for. The signal differences in the time domain can be set infinitely large. As a result, the time difference between the Winner row and a Loser row (that indicates that the reference data and search data are not as similar as for the case of Winner row) can be detectable.

Therefore, search errors can be reduced.

MODE TO CARRY OUT THE INVENTION

Figure 1:
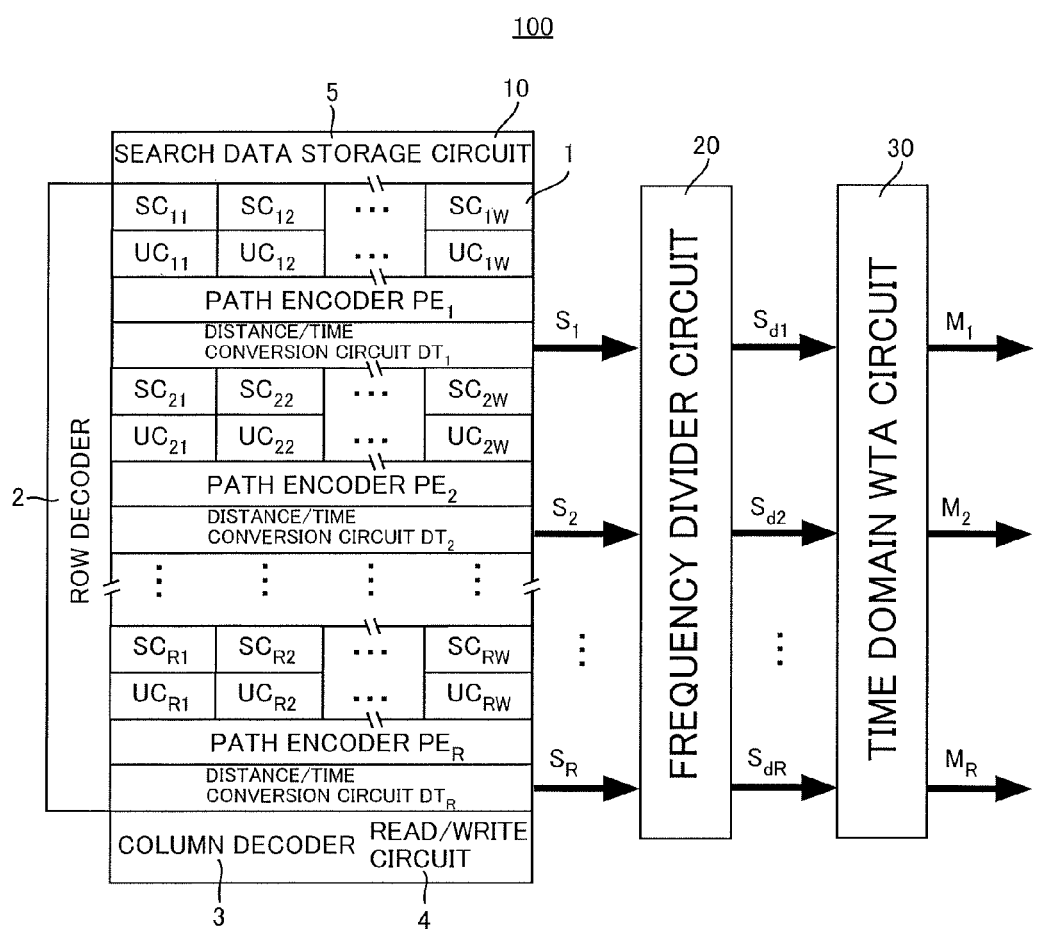
FIG. 1 is a schematic block diagram of the structure of an associative memory according to a first embodiment of the present invention.

Embodiments of the present invention will be described in detail in conjunction with the accompanying drawings, in which the same or corresponding portions are denoted by the same reference characters and their description will not be repeated.

First Embodiment

FIG. 1 is a schematic block diagram of the structure of an associative memory according to a first embodiment of the present invention. Referring to FIG. 1, an associative memory 100 according to the first embodiment of the present invention includes a memory array unit 10, a frequency divider circuit 20, and a time domain WTA (Winner Take All) circuit 30.

The memory array unit 10 includes a memory portion 1, a row decoder 2, a column decoder 3, a read/write circuit 4, and a search data storage circuit 5.

The memory portion 1 includes reference data storage cell (SC) circuits $SC_{11}$ to $SC_{1W}$, $SC_{21}$ to $SC_{2W}$, . . . , and $SC_{R1}$ to $SC_{RW}$, unit comparator (UC) circuits $UC_{11}$ to $UC_{1W}$, $UC_{21}$ to $UC_{2W}$, . . . , and $UC_{R1}$ to $UC_{RW}$, path encoders $PE_1$ to $PE_R$, and distance/time conversion circuits $DT_1$ to $DT_R$. Note that W and R are each an integer not less than 2.

The unit comparator circuits $UC_{11}$ to $UC_{1W}$ are provided corresponding to the reference data storage cell circuits $SC_{11}$ to $SC_{1W}$, respectively. The unit comparator circuits $UC_{21}$ to $UC_{2W}$ are provided corresponding to the reference data storage cell circuits $SC_{21}$ to $SC_{2W}$, respectively. Thereafter, in the same manner, the unit comparator circuits $UC_{R1}$ to $UC_{RW}$ are provided corresponding to the reference data storage cell circuits $SC_{R1}$ to $SC_{RW}$, respectively.

The path encoder $PE_1$ is provided corresponding to the reference storage circuits $SC_{11}$ to $SC_{1W}$ and the unit comparator circuits $UC_{11}$ to $UC_{1W}$. The path encoder $PE_2$ is provided corresponding to the reference data storage cell circuit $SC_{21}$ to $SC_{2W}$ and the unit comparator circuits $UC_{21}$ to $UC_{2W}$. Thereafter, in the same manner, the path encoder $PE_R$ is provided corresponding to the reference data storage cell circuits $SC_{R1}$ to $SC_{RW}$ and the unit comparator circuits $UC_{R1}$ to $UC_{RW}$.

The distance/time conversion circuit $DT_1$ is provided corresponding to the path encoder $PE_1$. The distance/time conversion circuit $DT_2$ is provided corresponding to the path encoder $PE_2$. Thereafter, in the same manner, the distance/time conversion circuit $DT_R$ is provided corresponding to the path encoder $PE_R$.

The reference data storage cell circuits $SC_{11}$ to $SC_{1W}$, $SC_{21}$ to $SC_{2W}$, . . . , and $SC_{R1}$ to $SC_{RW}$ store reference data written by the row decoder 2, the column decoder 3 and the read/write circuit 4. In this case, the reference data storage cell circuits $SC_{11}$ to $SC_{1W}$ store W-bit reference data 1, the reference data storage cell circuits $SC_{21}$ to $SC_{2W}$ store W-bit reference data 2, and thereafter in the same manner, the reference data storage cell circuits $SC_{R1}$ to $SC_{RW}$ store W-bit reference data R. More specifically, the reference data storage cell circuits $SC_{11}$ to $SC_{1W}$, $SC_{21}$ to $SC_{2W}$, . . . , and $SC_{R1}$ to $SC_{RW}$ each store one bit of the reference data.

The unit comparator circuits $UC_{11}$ to $UC_{1W}$ compare the W-bit reference data 1 stored in the reference data storage cell circuits $SC_{11}$ to $SC_{1W}$ and W-bit search data stored in the search data storage circuit 5. The unit comparator circuits $UC_{21}$ to $UC_{2W}$ compare the W-bit reference data 2 stored in the reference data storage cell circuits $SC_{21}$ to $SC_{2W}$ and W-bit search data stored in the search data storage circuit 5. Thereafter, in the same manner, the unit comparator circuits $UC_{R1}$ to $UC_{RW}$ compare the W-bit reference data R stored in the reference data storage cell circuits $SC_{R1}$ to $SC_{RW}$ and the W-bit search data stored in the search data storage circuit 5.

Comparison between reference data and search data in the unit comparator circuits $UC_{11}$ to $UC_{1W}$, the unit comparator circuits $UC_{21}$ to $UC_{2W}$, . . . , and $UC_{R1}$ to $UC_{RW}$ is carried out in parallel.

The unit comparator circuits $UC_{11}$ to $UC_{1W}$ output a result of comparison between the reference data 1 and search data as a W-bit distance signal to the path encoder $PE_1$, the unit comparator circuits $UC_{21}$ to $UC_{2W}$ output a result of comparison between the reference data 2 and the search data as a W-bit distance signal to the path encoder $PE_2$, and thereafter in the same manner, the unit comparator circuits $UC_{R1}$ to $UC_{RW}$ output a result of comparison between the reference data R and the search data as a W-bit distance signal to the path encoder $PE_R$. These R distance signals each represent the distance between the reference data and the search data.

Note that comparison between reference data and search data in the unit comparator circuits $UC_{11}$ to $UC_{1W}$, the unit comparator circuits $UC_{21}$ to $UC_{2W}$, . . . , and the unit comparator circuits $UC_{R1}$ to $UC_{RW}$ is carried out using Hamming distance.

More specifically, the unit comparator circuits $UC_{11}$ to $UC_{1W}$, $UC_{21}$ to $UC_{2W}$, . . . , and $UC_{R1}$ to $UC_{RW}$ use the following expression to carry out comparison between search data and reference data.

$$D_h = \sum_{j=1}^{W} |A_j \oplus B_j| \quad (1)$$

In Expression (1), $D_h$ represents a Hamming distance, $A_j$ represents reference data, and $B_j$ represents search data. $A_j$ and $B_j$ each consist of one bit.

The path encoder $PE_1$ receives a W-bit distance signal from the unit comparator circuits $UC_{11}$ to $UC_{1W}$, produces a selection signal used to select a delay path in the distance/time conversion circuit $DT_1$ based on the received W-bit distance signal according to a method that will be described and outputs the produced selection signal to the distance/time conversion circuit $DT_1$. The path encoder $PE_2$ receives the W-bit distance signal from the unit comparator circuits $UC_{21}$ to $UC_{2W}$, produces a selection signal used to select a delay path in the distance/time conversion circuit $DT_2$ based on the received W-bit distance signal according to the method that will be described and outputs the produced signal to the distance/time conversion circuit $DT_2$. Thereafter, in the same manner, the path encoder $PE_R$ receives a W-bit distance signal from the unit comparator circuits $UC_{R1}$ to $UC_{RW}$, produces a selection signal used to select a delay path in the distance/time conversion circuit $DT_R$ based on the received W-bit selection signal according to the method that will be described and outputs the produced selection signal to the distance/time conversion circuit $DT_R$.

The distance/time conversion circuit $DT_1$ receives the selection signal from the path encoder $PE_1$, produces an oscillation signal $S_1$ delayed by a delay amount for the delay path selected based on the received selection signal and outputs the produced oscillation signal $S_1$ to the frequency divider circuit 20. The distance/time conversion circuit $DT_2$ receives the selection signal from the path encoder $PE_2$, produces an oscillation signal $S_2$ delayed by a delay amount for the delay path selected based on the received selection signal and outputs the produced oscillation signal $S_2$ to the frequency divider circuit 20. Thereafter, in the same manner, the distance/time conversion circuit $DT_R$ receives the selection signal from the path encoder $PE_R$, produces an oscillation signal $S_R$ delayed by a delay amount for the delay path selected based on the received selection signal and outputs the produced oscillation signal $S_R$ to the frequency divider circuit 20.

Therefore, the memory unit 1 carries out comparison between each of the plurality of reference data pieces 1 to R and the search data in parallel, produces the plurality of oscillation signals $S_1$ to $S_R$ representing the results of comparison for output to the frequency divider circuit 20.

The row decoder 2 specifies an address in the row direction of the memory portion 1. The column decoder 3 specifies an address in the column direction of the memory portion 1. The read/write circuit 4 writes reference data in the reference data storage cell circuits $SC_{11}$ to $SC_{1W}$, $SC_{21}$ to $SC_{1W}$, . . . , and $SC_{R1}$ to $SC_{RW}$ specified by the row decoder 2 and the column decoder 3 and search data in the search data storage circuit 5.

The search data storage circuit 5 stores the search data (W-bit data) written by the read/write circuit 4.

The frequency divider circuit 20 receives the oscillation signals $S_1$ to $S_R$ from the distance/time conversion circuit $DT_1$ to $DT_R$, respectively, frequency-divides the received oscillation signals $S_1$ to $S_R$ and outputs the frequency-divided signals $S_{d1}$ to $S_{dR}$ to the time domain WTA circuit 30.

The time domain WTA circuit 30 receives the oscillation signals $S_{d1}$ to $S_{dR}$ from the frequency divider circuit 20 and detects the earliest changing oscillation signal (one of the oscillation signals $S_{d1}$ to $S_{dR}$) among the received oscillation signals $S_{d1}$ to $S_{dR}$. The time domain WTA circuit 30 determines that the row corresponding to the earliest changing oscillation signal is the Winner row (=1), and the rows corresponding to the oscillation signals other than the earliest changing oscillation signal are the Loser rows (=0) and outputs match signals $M_1$ to $M_R$.

Figure 2:
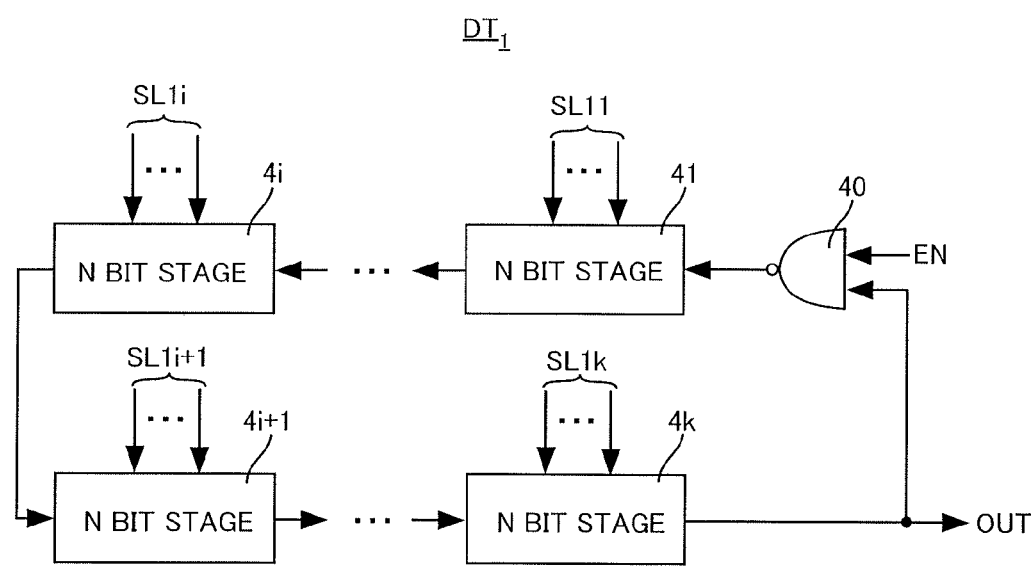
FIG. 2 is a block diagram of the configuration of the distance/time conversion circuit shown in FIG. 1.

FIG. 2 is a block diagram of the configuration of the distance/time conversion circuit $DT_1$ shown in FIG. 1. Referring to FIG. 2, the distance/time conversion circuit $DT_1$ includes a NAND circuit 40 and N bit stages 41 to 4k. Here, N is an integer not less than 3, k is an integer that satisfies k=W/N or (W/N)+1, and $2 \le i \le k$.

The NAND circuit 40 and the N bit stages 41 to 4k are connected in a ring shape. The NAND circuit 40 receives an enable signal EN (=1) from a control circuit (not shown) for the associative memory 100 and an oscillation signal from the N bit stage 4k. The NAND circuit 40 obtains the logical product of the enable signal EN and the oscillation signal and outputs an inverted signal of the operated logical product to the N bit stage 41.

The N bit stages 41 to 4k receive selection signals SL11 to SL1k from the path encoder $PE_1$. The N bit stage 41 delays the signal from the NAND circuit 40 by a delay amount for a delay path selected by the selection signal SL11 and outputs the delayed signal to the N bit stage 42. The N bit stage 4i delays the input signal by a delay amount for the delay path selected by the selection signal SL1i and outputs the delayed signal to the N bit stage 4i+1. Thereafter, in the same manner, the N bit stage 4k delays an input signal by a delay amount for a delay path selected by the selection signal SL1k and outputs the delayed signal to the NAND circuit 40 or to the outside (=the frequency divider circuit 20).

Note that the distance/time conversion circuits $DT_2$ to $DT_R$ each have the same configuration as that of the distance/time conversion circuit $DT_1$ shown in FIG. 2.

Figure 3:
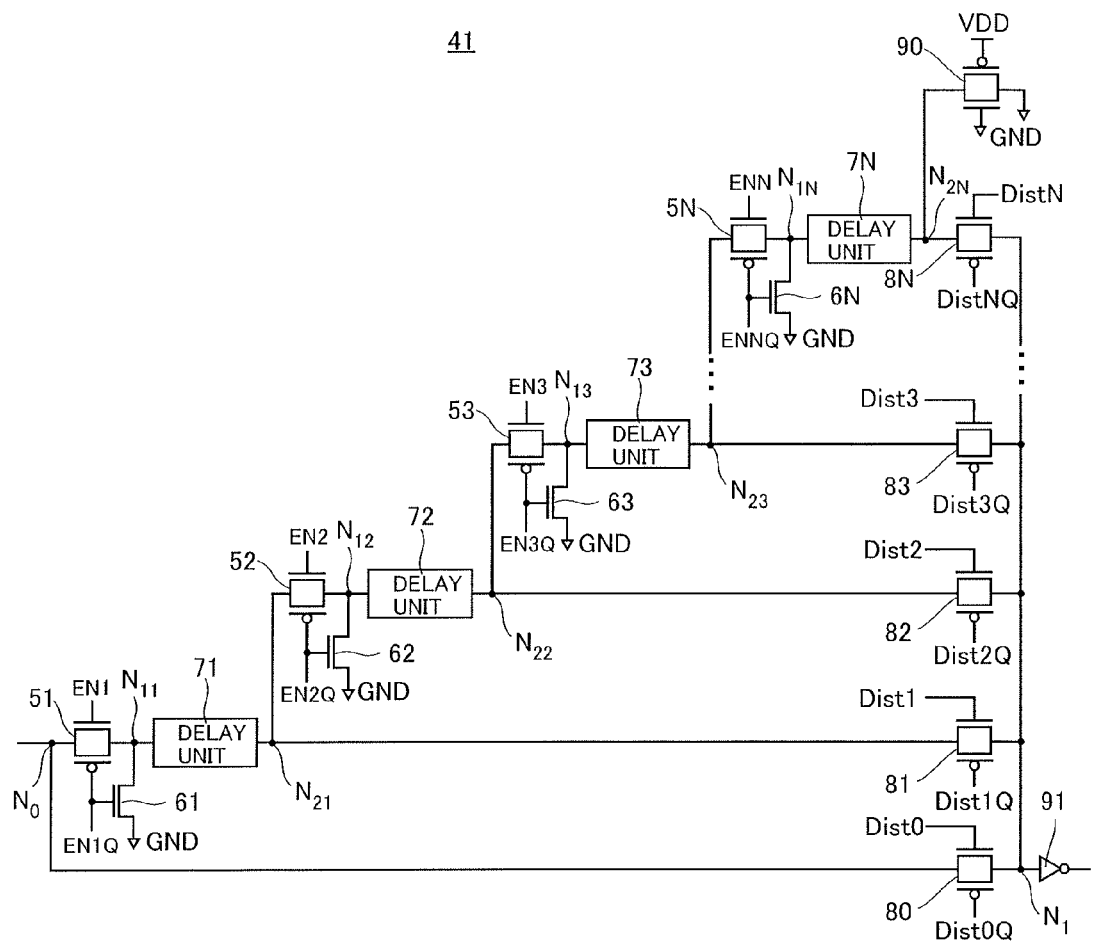
FIG. 3 is a circuit diagram showing the configuration of the N bit stage shown in FIG. 2.

FIG. 3 is a circuit diagram showing the configuration of the N bit stage 41 shown in FIG. 2. Referring to FIG. 3, the N bit stage 41 includes transfer gates 51 to 5N, 80 to 8N and 90, N-type MOS (Metal Oxide Semiconductor) transistors 61 to 6N, delay units 71 to 7N, and an inverter 91.

The transfer gates 51 to 5N, 80 to 8N and 90 each include a parallel connection of an N-type MOS transistor A and a P-type MOS transistor B.

The transfer gate 51 is connected between a node $N_0$ as an input terminal and a node $N_{11}$. The transfer gate 52 is connected between a node $N_{21}$ and a node $N_{12}$. The transfer gate 53 is connected between a node $N_{22}$ and a node $N_{13}$. Thereafter, in the same manner, the transfer gate 5N is connected between a node $N_{2N-1}$ and a node $N_{1N}$. In this way, the transfer gates 52 to 5N are connected to the output side of the delay units 71 to 7N−1.

The N-type MOS transistors 61 to 6N have their drain terminals connected to the nodes $N_{11}$ to $N_{1N}$, respectively, their source terminals connected to a ground node GND, and their gates terminals connected to the gate terminals of the P-type MOS transistors B of the transfer gates 51 to 5N, respectively.

The delay unit 71 is connected between the node $N_{11}$ and the node $N_{21}$, the delay unit 72 is connected between the node $N_{12}$ and the node $N_{22}$, the delay unit 73 is connected between the node $N_{13}$ and the node $N_{23}$, and thereafter, in the same manner, the delay unit 7N is connected between the node $N_{1N}$ and the node $N_{2N}$. The delay units 71 to 7N each include a series-connection of an even number of inverters.

The transfer gate 80 is connected between the nodes $N_0$ and $N_1$, the transfer gate 81 is connected between the nodes $N_{21}$ and $N_1$, the transfer gate 82 is connected between the nodes $N_{22}$ and $N_1$, the transfer gate 83 is connected between the node $N_{23}$ and the node $N_1$, and thereafter, in the same manner, the transfer gate 8N is connected between the nodes $N_{2N}$ and $N_1$. The transfer gate 90 is a dummy connected between the node $N_{2N}$ and the ground node GND.

The inverter 91 has its input terminal connected to the node $N_1$.

The transfer gates 51 to 5N receive signals EN1, EN1Q to ENN, and ENNQ from the path encoder $PE_1$, respectively. In this case, the N-type MOS transistors A of the transfer gates 51 to 5N receive the signals EN1 to ENN, respectively, at their gate terminals and the P-type MOS transistors B of the transfer gates 51 to 5N receive the signals EN1Q to ENNQ, respectively at their gate terminals.

The transfer gates 80 to 8N receive signals Dist0, Dist0Q to DistN, and DistNQ from the path encoder $PE_1$. In this case, the N-type MOS transistors A of the transfer gates 80 to 8N receive the signals Dist0 to DistN at their gate terminals, and the N-type MOS transistors B of the transfer gates 80 to 8N receive the signals Dist0Q to DistNQ at their gate terminals.

Note that the N-type MOS transistor A of the transfer gate 90 has its gate terminal connected to the ground node GND and the P-type MOS transistor B of the transfer gate 90 has its gate terminal connected to a power supply node VDD, so that the transfer gate 90 is constantly in an off state.

The signals Dist0 to DistN, Dist0Q to DistNQ, EN1 to ENN, and EN1Q to ENNQ form a selection signal SL11 shown in FIG. 2. The Dist0Q to DistNQ are the inverse of the signals Dist0 to DistN, respectively, and the signals EN1Q to ENNQ are the inverse of the signals EN1 to ENN, respectively.

If the signals Dist0, Dist1Q to DistNQ, and EN1Q to ENNQ are all "1" (=logical high, which holds in the following), and the signals Dist0Q, Dist1 to DistN, and EN1 to ENN are all "0" (=logical low, which holds in the following), the transfer gate 80 is opened, the transfer gates 51 to 5N and 81 to 8N are closed, and the N-type MOS transistors 61 to 6N are turned on.

As a result, the signals are input into the inverter 91 through the transfer gate 80 from the node $N_0$, inverted by the inverter 91 and output. In this case, the potentials of the nodes $N_{11}$ to $N_{1N}$ are equal to the potential of the ground node GND.

When the signals Dist1, Dist0Q, Dist2Q to DistNQ, EN1, and EN2Q to ENNQ are all "1" and the signals DistNQ, Dist0, Dist2 to DistN, EN1Q, and EN2 to ENN are all "0", the transfer gates 51 and 81 are opened, the transfer gates 52 to 5N, 80, and 82 to 8N are closed, the N-type MOS transistor 61 is turned off, and the N-type MOS transistors 62 to 6N are turned on.

As a result, the signals are input to the delay unit 71 through the transfer gate 51 from the node $N_0$, delayed by prescribed time by the delay unit 71, then input to the inverter 91 through the transfer gate 81, and inverted by the inverter 91 for output. In this case, the potential of the node $N_{11}$ is equal to the potential of the input signals, and the potentials of the nodes $N_{12}$ to $N_{1N}$ are equal to the potential of the ground node GND.

Furthermore, when the signals Dist2, Dist0Q, Dist1Q, Dist3Q to DistNQ, EN1, EN2, and EN3Q to ENNQ are all "1" and the signals Dist2Q, Dist0, Dist1, Dist3 to DistN, EN1Q, EN2Q, and EN3 to ENN are all "0", the transfer gates 51, 52, and 82 are opened, the transfer gates 53 to 5N, 80, 81, and 83 to 8N are closed, the N-type MOS transistors 61 and 62 are turned off, and the N-type MOS transistors 63 to 6N are turned on.

As a result, the signals are input to the delay unit 71 through the transfer gate 51 from the node $N_0$, delayed by prescribed time by the delay unit 71, then input to the delay unit 72 through the transfer gate 52, further delayed by a prescribed time by the delay unit 72, input to the inverter 91 through the transfer gate 82, and inverted by the inverter 91 for output. In this case, the signals are delayed by the two delay units 71 and 72 and input to the inverter 91, where the signals are inverted and output. More specifically, the potentials of the node $N_{11}$ and $N_{12}$ are equal to the potentials of the input signals, and the potentials of the nodes $N_{13}$ to $N_{1N}$ are equal to the potential of the ground node GND.

Thereafter, in the same manner, when the signals DistN, Dist0Q to DistN–1Q, and EN1 to ENN are all "1" and the signals DistNQ, Dist0 to DistN–1, and EN1Q to ENNQ are all "0", the transfer gates 51 to 5N and 8N are opened, the transfer gates 80 to 8N–1 are closed, and the N-type MOS transistors 61 to 6N are turned off.

As a result, the signals are passed through the transfer gate 51 from the node $N_0$, then delayed by all of the delay units 71 to 7N, input to the inverter 91 through the transfer gate 8N, and inverted by the inverter 91 for output. In this case, the potentials of the nodes $N_{11}$ to $N_{1N}$ are equal to the potentials of the input signals.

As described above, the delay units 71 to 7N each include a series-connection of an even number of inverters and a signal inevitably passes through the inverter 91, whichever path is selected by the selection signal SL11, so that the N bit stage 41 inverts the signal an odd-number of times for output whichever path is selected by the selection signal SL11. In this way, the N bit stage 41 delays the signal by a delay amount corresponding to the path selected by the selection signal SL11. More specifically, in FIG. 3, the N bit stage 41 delays a signal by the minimum delay amount for output when the lowermost path is selected and delays the signal by the maximum delay amount for output when the uppermost path is selected.

Note that the N bit stages 42 to 4k shown in FIG. 2 each have the same configuration as that of the N bit stage 41 shown in FIG. 3.

Referring back to FIG. 2, the N bit stages 41 to 4k delay a signal by delay amounts for delay paths selected by the selection signals SL11 to SL1k for output. More specifically, the N bit stages 41 to 4k invert the signal by amounts for the number of inverters (an odd number) included in delay paths selected by the selection signals SL11 to SL1k for output. The N bit stages 41 to 4k and the NAND circuit 40 are connected in a ring shape. Therefore, the N bit stages 41 to 4k and the NAND circuit 40 produce an oscillation signal and output the produced oscillation signal.

In this way, the distance/time conversion circuit $DT_1$ includes an oscillation circuit having k N bit stages 41 to 4k (=k delay circuits) connected in a ring shape. Similarly, the distance/time conversion circuits $DT_2$ to $DT_R$ each include an oscillation circuit having k N bit stages 41 to 4k (=k delay circuits) connected in a ring shape.

Figure 4:
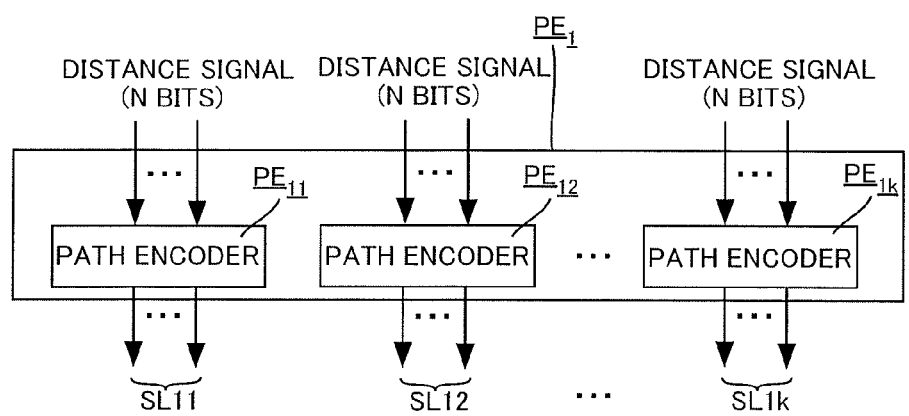
FIG. 4 is a block diagram of the configuration of the path encoder shown in FIG. 1.

FIG. 4 is a block diagram of the configuration of the path encoder $PE_1$ shown in FIG. 1. Referring to FIG. 4, the path encoder $PE_1$ includes path encoders $PE_{11}$ to $PE_{1k}$.

The path encoder $PE_{11}$ receives an N bit distance signal from the unit comparator circuits $UC_{11}$ to $UC_{1N}$. The path encoder $PE_{11}$ then produces a selection signal SL11 based on the N bit distance signal according to a method that will be described and outputs the produced selection signal SL11 to the N bit stage 41.

The path encoder $PE_{12}$ receives an N bit distance signal from the unit comparator circuits $UC_{1N+1}$ to $UC_{12N}$. The path encoder $PE_{12}$ then produces a selection signal SL12 based on the N bit distance signal according to the method that will be described and outputs the produced selection signal SL12 to the N bit stage 42.

Thereafter, in the same manner, the path encoder $PE_{1k}$ receives an N bit distance signal from the unit comparator circuits $UC_{1W-N}$ to $UC_{1W}$. The path encoder $PE_{1k}$ then produces a selection signal SL1k based on the N bit distance signal according to the method that will be described and outputs the produced selection signal SL1k to the N bit stage 4k.

Figure 5:
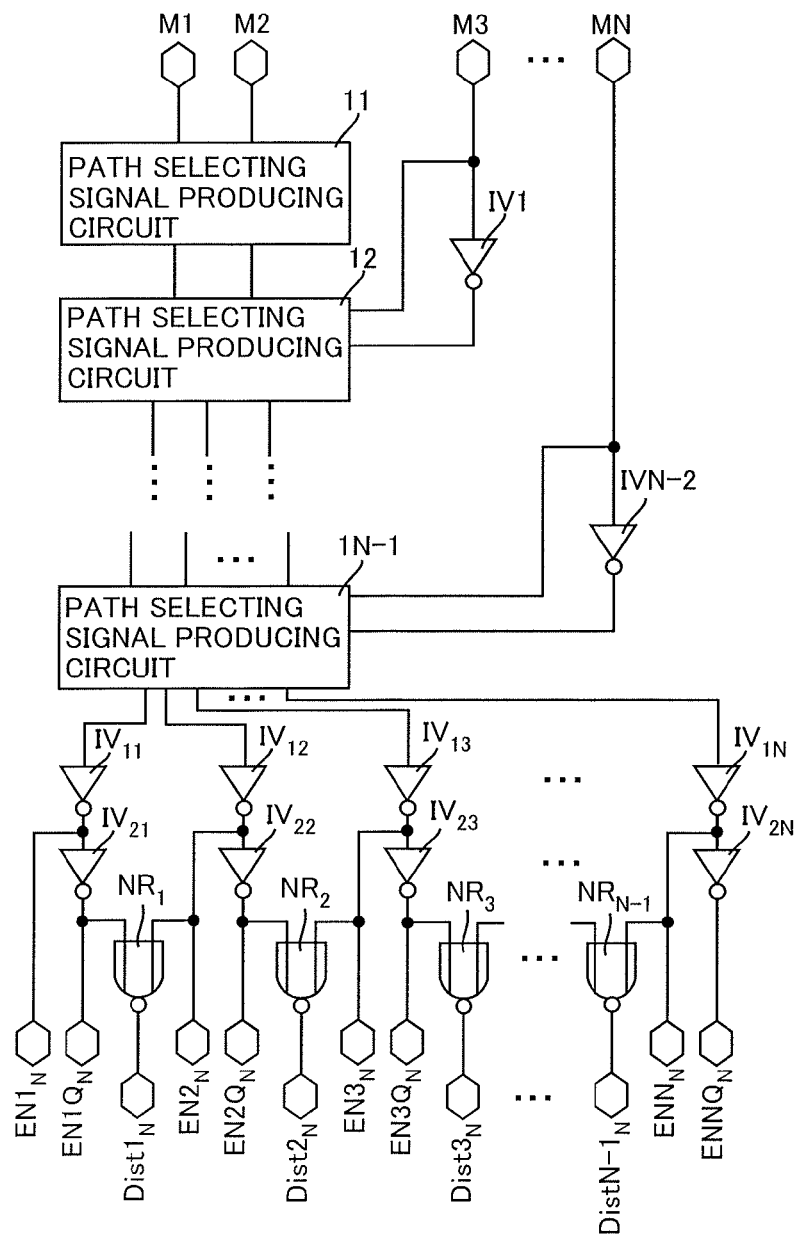
FIG. 5 shows the configuration of the path encoder shown in FIG. 4.

FIG. 5 shows the configuration of the path encoder $PE_{11}$ shown in FIG. 4. Referring to FIG. 5, the path encoder $PE_{11}$ includes path selection signal producing circuits 11 to 1N–1, inverters IV1 to IVN–2, $IV_{11}$ to $IV_{1N}$, $IV_{21}$ to $IV_{2N}$, and NOR circuits $NR_1$ to $NR_{N-1}$.

The path selection signal producing circuits 11 to 1N–1 are connected in series. The path selection signal producing circuit 11 receives 2-bit distance signals M1 and M2 among the N bit distance signals M1 to MN from the unit comparator circuits $UC_{11}$ and $UC_{12}$. The path selection signal producing circuit 11 produces 2-bit selection signals $EN1Q_2$ and $EN2Q_2$ and outputs the produced 2-bit selection signals $EN1Q_2$ and $EN2Q_2$ to the path selection signal producing circuit 12.

The path selection signal producing circuit 12 receives the selection signals $EN1Q_2$ and $EN2Q_2$ from the path selection signal producing circuit 11, the distance signal M3 from the unit comparator circuit $UC_{13}$ and an inverted signal /M3 of the distance signal M3 from the inverter IV1. The path selection signal producing circuit 12 produces 3-bit selection signals $EN1Q_3$, $EN2Q_3$, and $EN3Q_3$ based on the selection signals $EN1Q_2$ and $EN2Q_2$, the distance signal M3 and the inverted signal /M3, and outputs the produced selection signals $EN1Q_3$, $EN2Q_3$, and $EN3Q_3$ to a path selection signal producing circuit 13 (not shown).

Thereafter, in the same manner, the path selection signal producing circuit 1N–1 receives N–1 bit selection signals $EN1Q_{N-1}$, $EN2Q_{N-1}$, ..., and $ENN-1Q_{N-1}$ from the path selection signal producing circuit 1N–2, a distance signal MN from the unit comparator circuit $UC_{1N}$ and the inverted signal /MN of the distance signal MN from the inverter IVN–2. Then, the path selection signal producing circuit 1N–1 produces N-bit selection signals $EN1Q_N$, $EN2Q_N$, ..., and $ENNQ_N$ based on the selection signals $EN1Q_{N-1}$, $EN2Q_{N-1}$, ..., and $ENN-1Q_{N-1}$, the distance signal MN and the inverted signal /MN and outputs the produced selection signals $EN1Q_N$, $EN2Q_N$, ..., and $ENNQ_N$ to the inverters $IV_{11}$ to $IV_{1N}$, respectively.

The inverters IV1 to IVN–2 invert the distance signals M3 to MN, respectively and outputs the inverted signals /M3 to /MN to the path selection signal producing circuits 12 to 1N–1, respectively.

The inverters $IV_{11}$ to $IV_{1N}$ receive the selection signals $EN1Q_N$, $EN2Q_N$, ..., and $ENNQ_N$ and invert these received selection signals $EN1Q_N$, $EN2Q_N$, ..., and $ENNQ_N$. The inverters $IV_{11}$ to $IV_{1N}$ output the inverted signals $EN1_N$ to ENN$_N$ to the N bit stage 41, and output the inverters IV$_{21}$ to IV$_{2N}$, respectively. The inverters IV$_{12}$ to IV$_{1N}$ output these inverted signals EN2$_N$ to ENN$_N$ to the NOR circuits NR$_1$ to NR$_{N-1}$, respectively.

The inverters IV$_{21}$ to IV$_{2N}$ invert the signals EN1$_N$ to ENN$_N$ and output the inverted signals EN1Q$_N$, EN2Q$_N$, ..., and ENNQ$_N$ to the N bit stage 41. The inverters IV$_{21}$ to IV$_{2N-1}$ output the inverted signals EN1Q$_N$, EN2Q$_N$, ..., and ENNQ$_{N-1}$ to the NOR circuits NR$_1$ to NR$_{N-1}$, respectively.

The NOR circuit NR$_1$ operates the logical sum of the signals EN1Q$_N$ and EN2$_N$ and outputs the inverse of the operated logical sum as an inverted signal Dist1$_N$ to the N bit stage 41. The NOR circuit NR$_2$ operates the logical sum of the signal EN2Q$_N$ and a signal EN3$_N$ and outputs the inverse of the operated logical sum as a signal Dist2$_N$ to the N bit stage 41. Thereafter, in the same manner, the NOR circuit NR$_{N-1}$ operates the logical sum of the signals ENN−1Q$_N$ and ENN$_N$ and outputs the inverse of the operated logical sum as a signal DistN−1$_N$ to the N bit stage 41.

Note that in FIG. 5, the signal Dist0 and DistN shown in FIG. 3 are not produced, but the signal Dist0 is equal to the inverse of the signal EN1$_N$ and the signal DistN is equal to the signal ENN$_N$. Therefore, the path encoder PE$_{11}$ outputs the signal EN1$_N$ to the transfer gate 51 in the N bit stage 41 and the inverted signal of the signal EN1$_N$ to the transfer gate 80. The path encoder PE$_{11}$ outputs the signal ENN$_N$ to the transfer gates 5N and 8N.

Figure 6:
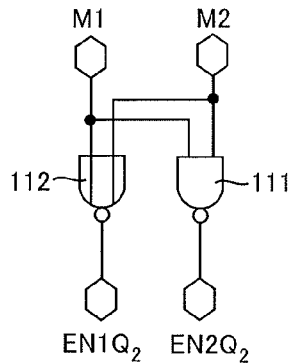
FIG. 6 is a circuit diagram of the path selection signal producing circuit shown in FIG. 5.

FIG. 6 is a circuit diagram of the path selection signal producing circuit 11 shown in FIG. 5. Referring to FIG. 6, the path selection signal producing circuit 11 includes a NAND circuit 111 and a NOR circuit 112. The NAND circuit 111 operates the logical product of the distance signals M1 and M2, produces a signal EN2Q$_2$ by inverting the operated logical product, and outputs the produced signal EN2Q$_2$.

The NOR circuit 112 operates the logical sum of the distance signals M1 and M2, produces a signal EN1Q$_2$ by inverting the operated logical sum, and outputs the produced signal EN1Q$_2$.

Figure 7:
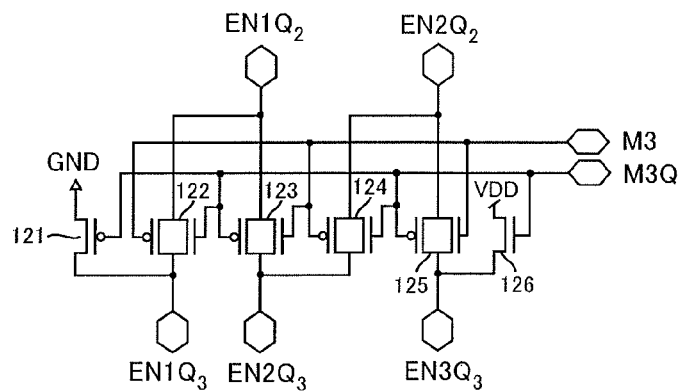
FIG. 7 is a circuit diagram of the path selection signal producing circuit shown in FIG. 5.

FIG. 7 is a circuit diagram of the path selection signal producing circuit 12 shown in FIG. 5. Referring to FIG. 7, the path selection signal producing circuit 12 includes a P-type MOS transistor 121, transfer gates 122 to 125, and an N-type MOS transistor 126.

The transfer gates 122 to 125 each include a parallel connection of the P-type MOS transistor and the N-type MOS transistor.

The P-type MOS transistor 121 has its source terminal connected to the ground node GND and its drain terminal connected to an output terminal of the transfer gate 122 and receives the inverted signal M3Q of the distance signal M3 at its gate terminal.

The transfer gate 122 receives the signal EN1Q$_2$ at its input terminal. The P-type MOS transistor of the transfer gate 122 receives the distance signal M3 at its gate terminal and the N-type MOS transistor of the transfer gate 122 receives the inverted signal M3Q at its gate terminal.

The transfer gate 123 receives the signal EN1Q$_2$ at its input terminal. The P-type MOS transistor of the transfer gate 123 receives the inverted signal M3Q at its gate terminal, and the N-type MOS transistor of the transfer gate 123 receives the distance signal M3 at its gate terminal.

The transfer gate 124 receives the signal EN2Q$_2$ at its input terminal. The P-type MOS transistor of the transfer gate 124 receives the distance signal M3 at its gate terminal and the N-type MOS transistor of the transfer gate 124 receives the inverted signal M3Q at its gate terminal.

The transfer gate 125 receives the signal EN2Q$_2$ at its input terminal. The P-type MOS transistor of the transfer gate 125 receives the inverted signal M3Q at its gate terminal and the N-type MOS transistor of the transfer gate 125 receives the distance signal M3 at its gate terminal.

The N-type MOS transistor 126 has its source terminal connected to the power supply node VDD and its drain terminal connected to the output terminal of the transfer gate 125.

If the distance signal M3 is "0" and the inverted signal M3Q is "1", the transfer gates 123 and 125 are closed, the P-type MOS transistor 121 is turned off, the N-type MOS transistor 126 is turned on, and the transfer gates 122 and 124 are opened. Therefore, EN1Q$_3$=EN1Q$_2$, EN2Q$_3$=EN2Q$_2$, and EN3Q$_3$=1.

On the other hand, if the distance signal M3 is "1" and the inverted signal M3Q is "0", the transfer gates 122 and 124 are closed, the N-type MOS transistor 126 is turned off, the P-type MOS transistor 121 is turned on, and the transfer gates 123 and 125 are opened. Therefore, EN1Q$_3$=0, EN2Q$_3$=EN1Q$_2$, and EN3Q$_3$=EN2Q$_2$.

The relation between the output signals EN1Q$_3$ to EN3Q$_3$ of the path selection signal producing circuit 12 and the distance signal M3 is given in Table 1.

TABLE 1

| M3 | M3Q | EN1Q$_3$ | EN2Q$_3$ | EN3Q$_3$ |
|---|---|---|---|---|
| 0 | 1 | EN1Q$_2$ | EN2Q$_2$ | 1 |
| 1 | 0 | 0 | EN1Q$_2$ | EN2Q$_2$ |

As can be understood from Table 1, the path selection signal producing circuit 12 outputs the signals EN1Q$_2$ and EN2Q$_2$ directly if the distance signal M3 is "0", and shifts the signals EN1Q$_2$ and EN2Q$_2$ by one bit for output if the distance signal M3 is "1".

Figure 8:
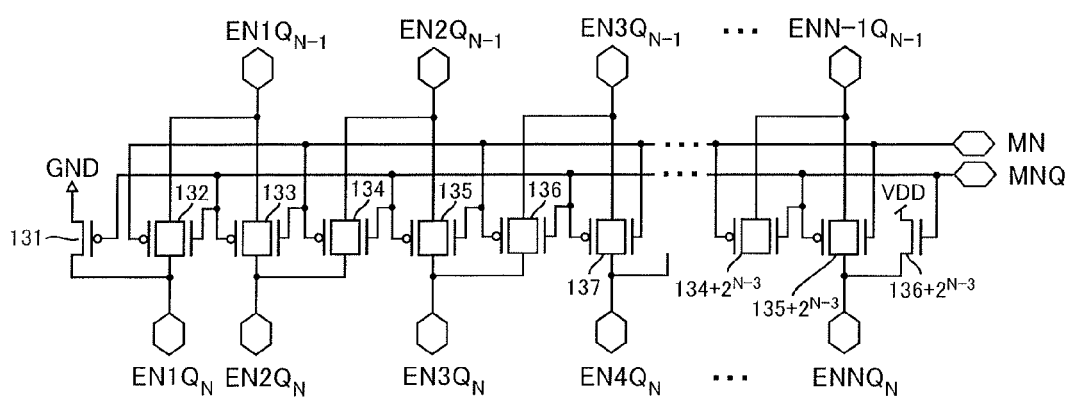
FIG. 8 is a circuit diagram of the path selection signal producing circuit shown in FIG. 5.

FIG. 8 is a circuit diagram of the path selection signal producing circuit 1N−1 shown in FIG. 5. Referring to FIG. 8, the path selection signal producing circuit 1N−1 includes a P-type MOS transistor 131, transfer gates 132 to 135+2$^{N-3}$ and N-type MOS transistor 136+2$^{N-3}$.

The P-type MOS transistor 131 has its source terminal connected to the ground node GND and its drain terminal connected to an output terminal of the transfer gate 132 and receives an inverted signal MNQ of the distance signal MN at its gate terminal.

The transfer gates 132 to 135+2$^{N-3}$ each include a P-type MOS transistor and an N-type MOS transistor connected in parallel.

The transfer gates 132, 133, 134, 135, 136, 137 ..., 134+2$^{N-3}$, and 135+2$^{N-3}$ receive the signals EN1Q$_{N-1}$ to ENN−1Q$_{N-1}$ at their input terminals.

IN the transfer gates 132, 134, 136, ..., and 134+2$^{N-3}$, the P-type MOS transistors each receive the distance signal MN at their gate terminals and the N-type MOS transistors each receive the inverted signal MNQ of the distance signal MN at their gate terminals.

In the transfer gates 133, 135, 137, ..., and 135+2$^{N-3}$, the P-type MOS transistors each receive the inverted signal MNQ at their gate terminals and the N-type MOS transistors each receive the distance signal MN at their gate terminals.

The N-type MOS transistor 136+2$^{N-3}$ has its source terminal connected to the power supply node VDD and its drain terminal connected to the output terminal of the transfer gate 135+2$^{N-3}$ and receives the inverted signal MNQ at its gate terminal.

If the distance signal MN is "0" and the inverted signal MNQ is "1", the transfer gates 133, 135, 137, . . . , and $135+2^{N-3}$ are closed, the P-type MOS transistor 131 is turned off, the N-type MOS transistor $136+2^{N-3}$ is turned on, and the transfer gates 132, 134, 136, . . . , $134+2^{N-3}$ are opened. Therefore, $EN1Q_N=EN1Q_{N-1}$, $EN2Q_N=EN2Q_{N-1}$, $EN3Q_N=EN3Q_{N-1}$, . . . , and $ENN-1Q_N=ENN-1Q_{N-1}$ and $ENNQ_N$="1".

On the other hand, if the distance signal MN is "1" and the inverted signal MNQ is "0", the transfer gates 132, 134, 136, . . . , and $134+2^{N-3}$ are closed, the N-type MOS transistor $136+2^{N-3}$ is turned off, the P-type MOS transistor 131 is turned on, and the transfer gates 133, 135, 137, . . . , $135+2^{N-3}$ are opened. Therefore, $EN1Q_N=0$, $EN2Q_N=EN1Q_{N-1}$, $EN3Q_N=EN2Q_{N-1}$, . . . , and $ENNQ_N=ENN-1Q_{N-1}$.

The relation between the output signals $EN1Q_N$ to $ENNQ_N$ of the path selection signal producing circuit 1N-1 and the distance signal MN is given in Table 2.

TABLE 2

| MN | MNQ | $EN1Q_N$ | $EN2Q_N$ | $EN3Q_N$ | ... | $ENN-1Q_N$ | $ENNQ_N$ |
|---|---|---|---|---|---|---|---|
| 0 | 1 | $EN1Q_{N-1}$ | $EN2Q_{N-1}$ | $EN3Q_{N-1}$ | ... | $ENN-1Q_{N-1}$ | 1 |
| 1 | 0 | 0 | $EN1Q_{N-1}$ | $EN2Q_{N-1}$ | ... | $ENN-2Q_{N-1}$ | $ENN-1Q_{N-1}$ |

As can be understood from Table 2, the path selection signal producing circuit 1N-1 outputs the signals $EN1Q_{N-1}$ to $ENN-1Q_{N-1}$ directly if the distance signal MN is "0" and shifts the signals $EN1Q_{N-1}$ to $ENN-1Q_{N-1}$ by one bit amount for output if the distance signal MN is "1".

Figure 9:
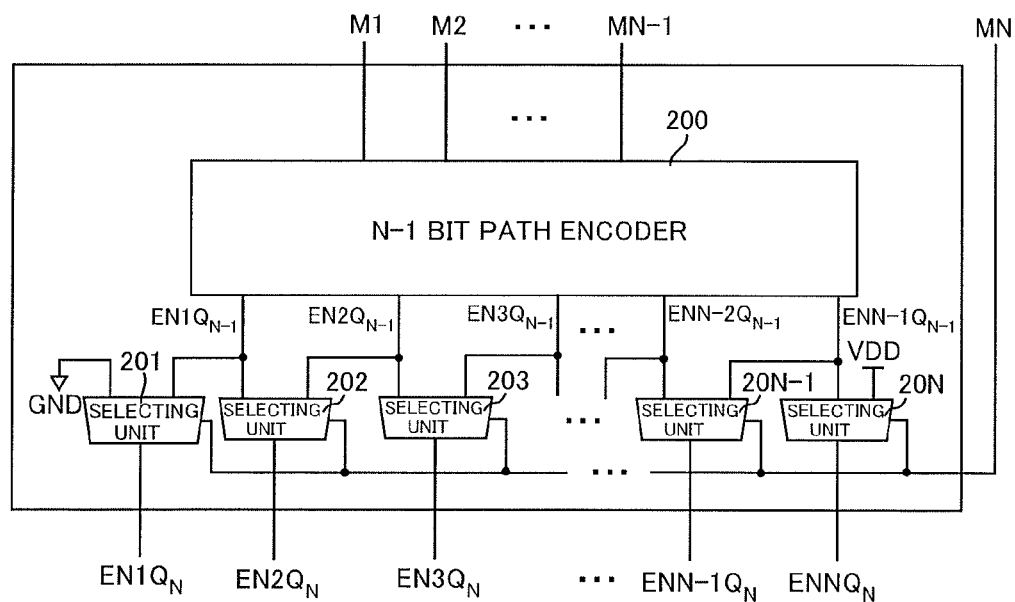
FIG. 9 is a diagram showing a general concept of the path encoder shown in FIG. 4.

FIG. 9 is a diagram showing a general concept of the path encoder $PE_{11}$ shown in FIG. 4. Referring to FIG. 9, the path encoder $PE_{11}$ includes N-1 bit path encoder 200 and selecting units 201 to 20N.

The N-1 bit path encoder 200 produces N-1 bit signals $EN1Q_{N-1}$ to $ENN-1Q_{N-1}$ based on N-1 bit distance signals M1 to MN-1 and outputs the produced N-1 bit signals $EN1Q_{N-1}$ to $ENN-1Q_{N-1}$.

The selecting unit 201 receives the signals $EN1Q_{N-1}$ and the distance signal MN. The selecting unit 201 outputs a signal $EN1Q_N$ consisting of the signal $EN1Q_{N-1}$ if the distance signal MN is "0" and a signal consisting of the potential of the ground node GND (=0) as the signal $EN1Q_N$ if the distance signal MN is "1".

The selecting unit 202 receives the signals $EN1Q_{N-1}$ and $EN2Q_{N-1}$ and the distance signal MN. The selecting unit 202 outputs a signal $EN2Q_N$ consisting of the signal $EN2Q_{N-1}$ if the distance signal MN is "0" and a signal $EN2Q_N$ consisting of the signal $EN1Q_{N-1}$ if the distance signal MN is "1".

The selecting unit 203 receives the signals $EN2Q_{N-1}$ and $EN3Q_{N-1}$ and the distance signal MN. The selecting unit 203 outputs a signal $EN3Q_N$ consisting of the signal $EN3Q_{N-1}$ if the distance signal MN is "0" and a signal $EN3Q_N$ consisting of the signal $EN2Q_{N-1}$ if the distance signal MN is "1".

Thereafter, in the same manner, the selecting unit 20N-1 receives the signals $ENN-2Q_{N-1}$ and $ENN-1Q_{N-1}$ and the distance signal MN. The selecting unit 20N-1 outputs a signal $ENN-1Q_N$ consisting of the signal $ENN-1Q_{N-1}$ if the distance signal MN is "0" and a signal $ENN-1Q_N$ consisting of the signal $ENN-2Q_{N-1}$ if the distance signal MN is "1". The selecting unit 20N receives the signal $ENN-1Q_{N-1}$ and the distance signal MN. The selecting unit 20N outputs a signal consisting of the potential of the ground node GND (=1) as the signal $ENNQ_N$ if the distance signal MN is "0" and a signal $ENNQ_N$ consisting of the signal $ENN-1Q_{N-1}$ if the distance signal MN is "1".

If the path encoder P11 consists of a 3-bit path encoder, the N-1 bit path encoder 200 consists of a 2-bit path encoder, and more specifically of the path selection signal producing circuit 11 shown in FIG. 6. Therefore, the N-1 bit path encoder 200 outputs the signals $EN1Q_2$ and $EN2Q_2$.

The transfer gate 122 shown in FIG. 7 outputs the signal $EN1Q_2$ as a signal $EN1Q_3$ if the distance signal M3 is "0" and the P-type MOS transistor 121 shown in FIG. 7 outputs a signal of "0" as the signal $EN1Q_3$ if the distance signal M3 is "0". Therefore, the P-type MOS transistor 121 and the transfer gate 122 form the selecting unit 201.

The transfer gate 124 shown in FIG. 7 outputs the signal $EN2Q_2$ as a signal $EN2Q_3$ if the distance signal M3 is "0" and the transfer gate 123 shown in FIG. 7 outputs the signal $EN1Q_2$ as the $EN2Q_3$ if the signal M3 is "1". Therefore, the transfer gates 123 and 124 form the selecting unit 202.

Furthermore, the N-type MOS transistor 126 shown in FIG. 7 outputs a signal of "1" as a signal $EN3Q_3$ if the distance M3 is "0", and the transfer gate 125 shown in FIG. 7 outputs the signal $EN2Q_2$ as the signal $EN3Q_3$ if the distance M3 is "1". Therefore, the transfer gates 125 and the N-type MOS transistor 126 form the selecting unit 203.

If the path encoder $PE_{11}$ consists of an N-bit path encoder, the N-1 bit path encoder 200 includes path selection signal producing circuits 11 to 1N-2 and outputs N-1 bit signals $EN1Q_{N-1}$ to $ENN-1 Q_{N-1}$.

The transfer gate 132 shown in FIG. 8 outputs the signal $EN1Q_{N-1}$ as the signal $EN1Q_N$ if the distance signal MN is "0" and the P-type MOS transistor 131 shown in FIG. 8 outputs a signal of "0" as the signal $EN1Q_N$ if the distance signal MN is "1". Therefore, the P-type MOS transistor 131 and the transfer gate 131 form the selecting unit 201.

The transfer gate 134 shown in FIG. 8 outputs the signal $EN2Q_{N-1}$ as the signal $EN2Q_N$ if the distance signal MN is "0" and the transfer gate 133 shown in FIG. 8 outputs the signal $EN1Q_{N-1}$ as the signal $EN2Q_N$ if the distance signal MN is "1". Therefore, the transfer gates 133 and 134 form the selecting unit 202.

The transfer gate 136 shown in FIG. 8 outputs the signal $EN3Q_{N-1}$ as the signal $EN3Q_N$ if the distance signal MN is "0" and the transfer gate 135 shown in FIG. 8 outputs the signal $EN2Q_{N-1}$ as the signal $EN3Q_N$ if the distance signal MN is "1". Therefore, the transfer gates 135 and 136 form the selecting unit 203.

The N-type MOS transistor $136+2^{N-3}$ shown in FIG. 8 outputs a signal of "1" as the signal $ENNQ_N$ if the distance signal MN is "0" and the transfer gate $135+2^{N-3}$ shown in FIG. 8 outputs the signal $ENN-1Q_{N-1}$ as the signal $ENNQ_N$ if the distance signal MN is "1". Therefore, the transfer gates $135+2^{N-3}$ and the N-type MOS transistor $136+2^{N-3}$ form the selecting unit 20N.

In this way, the path encoder $PE_{11}$ described in conjunction with FIGS. 5 to 8 generally includes the N-1 bit path encoder 200 and the selecting units 201 to 20N shown in FIG. 9. The path encoder $PE_{11}$ produces the signals $EN1_N$ to $ENN_N$, $EN1Q_N$ to $ENNQ_N$ and $Dist0_N$ to $DistN_N$ based on the N-bit distance signals M1 to MN according to the above-described method and outputs the produced signals $EN1_N$ to $ENN_N$, $EN1Q_N$ to $ENNQ_N$ and $Dist0_N$ to $DistN_N$ to the N bit stage 41. Therefore, the signals $EN1_N$ to $ENN_N$, $EN1Q_N$ to $ENNQ_N$ and $Dist0_N$ to $DistN_N$ form the selecting signal SL11.

Note that the path encoders $PE_{12}$ to $PE_{1k}$ each have the same configuration as that of the path encoder $PE_{11}$ shown in FIGS. 5 to 9. Therefore, the signals $EN1_N$ to $ENN_N$, $EN1Q_N$ to $ENNQ_N$ and $Dist0_N$ to $DistN_N$ output from the path encoders $PE_{12}$ to $PE_{1k}$, form the selection signals SL12 to SL1k.

Referring back to FIG. 4, the path encoders $PE_{11}$ to $PE_{1k}$ each receive an N-bit distance signal in the W-bit distance signal output to the path encoder $PE_1$. The path encoders $PE_{11}$ to $PE_{1k}$ produce the selection signals SL11 to SL1k, respectively based on the received N-bit distance signal according to the above-described method and output the produced signals SL11 to SL1k to the N bit stages 41 to 4k. Therefore, the N-bit stages 41 to 4k are provided corresponding to the path encoders $PE_{11}$ to $PE_{1k}$.

Figure 10:
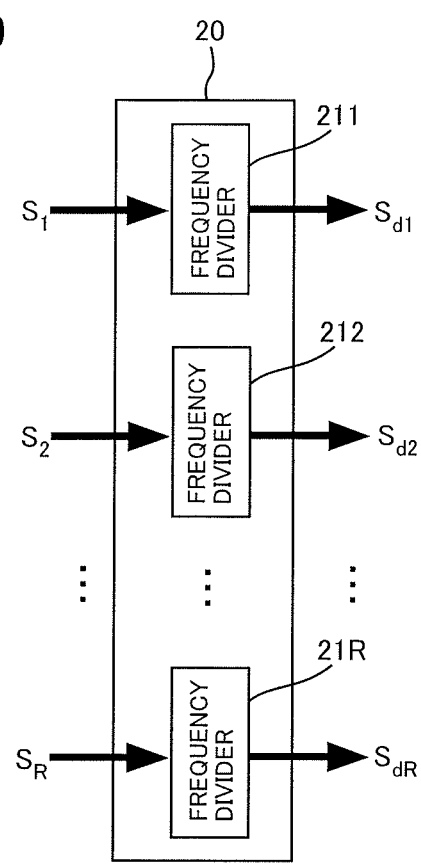
FIG. 10 is a diagram of the configuration of the frequency-divider circuit shown in FIG. 1.

FIG. 10 is a diagram of the configuration of the frequency-divider circuit 20 shown in FIG. 1. Referring to FIG. 10, the frequency divider circuit 20 includes frequency dividers 211 to 21R.

The frequency dividers 211 to 21R are provided corresponding to the distance/time conversion circuits $DT_1$ to $DT_R$. The frequency dividers 211 to 21R receive oscillation signals $S_1$ to $S_R$ from the distance/time conversion circuits $DT_1$ to $DT_R$ and frequency-divide the oscillation signals $S_1$ to $S_R$ by a desired number of times. The frequency dividers 211 to 21R output the frequency-divided oscillation signals $S_{d1}$ to $S_{dR}$ to the time domain WTA circuit 30.

Figure 11:
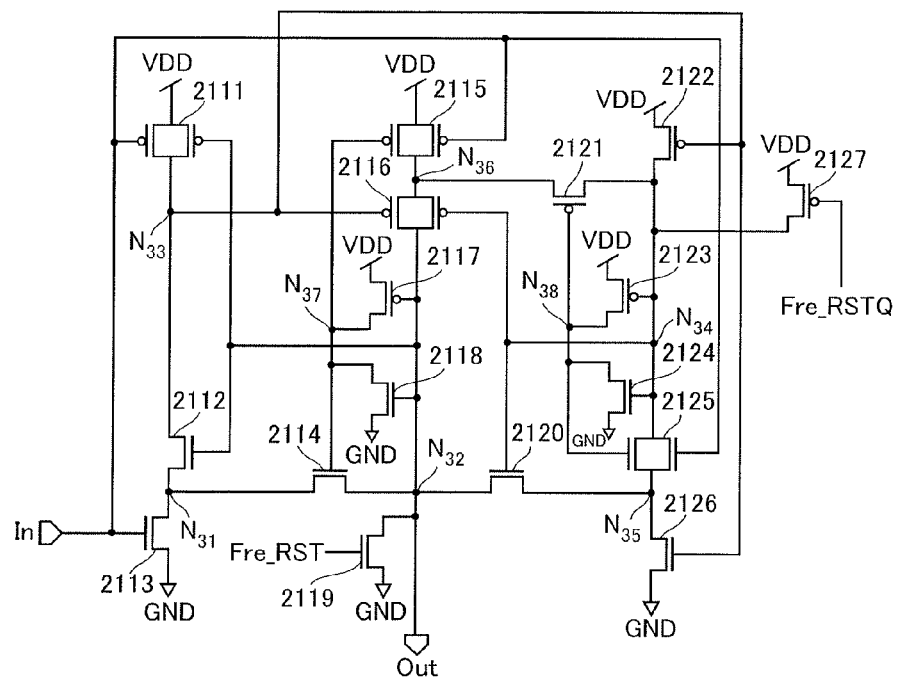
FIG. 11 is a circuit diagram of the frequency-divider shown in FIG. 10.

FIG. 11 is a circuit diagram of the frequency-divider 211 shown in FIG. 10. Referring to FIG. 11, the frequency-divider 211 includes transfer gates 2111, 2115, 2116 and 2125, N-type MOS transistors 2112, 2113, 2114, 2118, 2119, 2120, 2124, and 2126, and P-type MOS transistors 2117, 2121, 2122, 2123, and 2127.

The transfer gates 2111, 2115, and 2116 each include two P-type MOS transistors connected in parallel and the transfer gate 2125 includes two N-type MOS transistors connected in parallel.

The transfer gate 2111 and the N-type MOS transistors 2122 and 2113 are connected in series between the power supply node VDD and the ground node GND. One P-type MOS transistor (the left P-type MOS transistor in FIG. 11) of the transfer gate 2111 and the N-type MOS transistor 2113 have their gate terminals connected to the input terminal In. The other P-type MOS transistor (the right P-type MOS in FIG. 11) of the transfer gate 2111 has its gate terminal connected to the gate terminal of the N-type MOS transistor 2112 and a node $N_{32}$.

The N-type MOS transistor 2114 is connected between a node $N_{31}$ and the node $N_{32}$. The N-type MOS transistor 2114 has its gate terminal connected to the gate terminal of one P-type MOS transistor of the transfer gate 2115 (the left P-type MOS transistor in FIG. 11).

The transfer gates 2115 and 2116 are connected in series between the power supply node VDD and the node $N_{32}$. The other P-type MOS transistor of the transfer gate 2115 (the right P-type MOS transistor in FIG. 11) has its gate terminal connected to the input terminal In. One P-type MOS transistor of the transfer gate 2116 (the left P-type MOS transistor in FIG. 11) has its gate terminal connected to a node $N_{33}$ and the gate terminals of the P-type MOS transistor 2112 and the N-type MOS transistor 2126. The other P-type MOS transistor of the transfer gate 2116 (the right P-type MOS transistor in FIG. 11) has its gate terminal connected to the gate terminal of the N-type MOS transistor 2120 and a node $N_{34}$.

The P-type MOS transistor 2117 is connected between the power supply node VDD and a node $N_{37}$. The P-type MOS transistor 2117 has its gate terminal connected to the node $N_{32}$.

The N-type MOS transistor 2118 is connected between the node $N_{37}$ and the ground node GND. The N-type MOS transistor 2118 has its gate terminal connected to the node $N_{32}$.

The N-type MOS transistor 2119 is connected between the node $N_{32}$ and the ground node GND. The N-type MOS transistor 2119 receives a reset signal Fre_RST at its gate terminal.

The N-type MOS transistor 2120 is connected between the node $N_{32}$ and a node $N_{35}$. The N-type MOS transistor has its gate terminal connected to the gate terminal of the other P-type MOS transistor of the transfer gate 2116 (the right P-type MOS transistor in FIG. 11) and the node $N_{34}$.

The P-type MOS transistor 2121 is connected between the nodes $N_{34}$ and $N_{36}$. The P-type MOS transistor 2121 has its gate terminal connected to the gate terminal of one N-type MOS transistor of the transfer gate 2125 (the left N-type MOS transistor in FIG. 11).

The P-type MOS transistor 2122 and the transfer gate 2125 are connected in series between the power supply node VDD and the node $N_{35}$. The P-type MOS transistor 2122 has its gate terminal connected to the node $N_{33}$ and the gate terminal of one P-type MOS transistor of the transfer gate 2116 (the left P-type MOS transistor in FIG. 11).

One N-type MOS transistor of the transfer gate 2125 (the left N-type MOS transistor in FIG. 11) has its gate terminal connected to the gate terminal of the P-type MOS transistor 2121. The other N-type MOS transistor of the transfer gate 2125 (the right N-type MOS transistor in FIG. 11) has its gate terminal connected to the input terminal In and the other P-type MOS transistor of the transfer gate 2115 (the right P-type MOS transistor in FIG. 11).

The P-type MOS transistor 2123 is connected between the power supply node VDD and a node $N_{38}$. The P-type MOS transistor 2123 has its gate terminal connected to the node $N_{34}$.

The N-type MOS transistor 2124 is connected between the node $N_{38}$ and the ground node GND. The N-type MOS transistor 2124 has its gate terminal connected to the node $N_{34}$.

The N-type MOS transistor 2126 is connected between the node $N_{35}$ and the ground node GND. The N-type MOS transistor 2126 has its gate terminal connected to the node $N_{33}$ and the gate terminal of the P-type MOS transistor 2122.

The P-type MOS transistor 2127 is connected between the power supply node VDD and the node $N_{34}$. The P-type MOS transistor 2127 receives the inverted signal Fre_RSTQ of the reset signal Fre_RST at its gate terminal.

The output terminal Out is connected to the node $N_{32}$.

Figure 12:
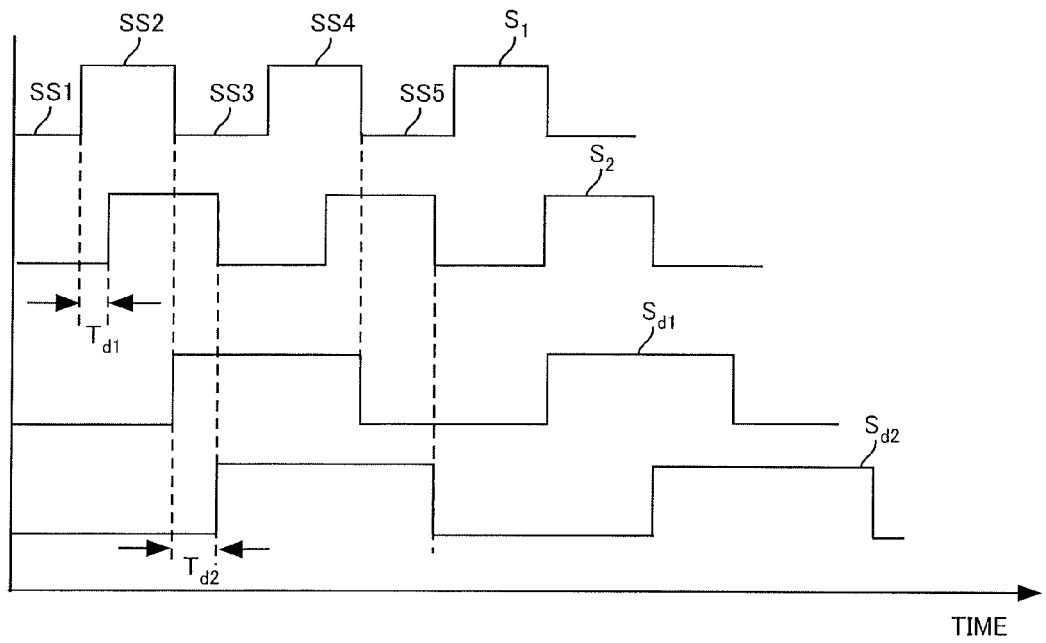
FIG. 12 is a timing chart of input and output signals to/from the frequency divider shown in FIG. 11.

FIG. 12 is a timing chart of input and output signals to/from the frequency divider 211 shown in FIG. 11.

Referring to FIG. 12, oscillation signals $S_1$ and $S_2$ are input signals to the frequency divider 211 and oscillation signals $S_{d1}$ and $S_{d2}$ are output signals from the frequency divider 211. The oscillation signals $S_1$, $S_2$, $S_{d1}$, and $S_{d2}$ are periodic signals having predetermined cycles.

Assume that the oscillation signal $S_1$ is input to the frequency divider 211. When the frequency divider 211 is reset, the reset signal Fre_RST is of "1" and the inverted signal Fre_RSTQ is of "0", so that the potential of the node $N_{32}$ is of the potential V0 of the ground node GND and the potential of the node $N_{34}$ is of the potential Vdd of the power supply node VDD.

As a result, the P-type MOS transistor 2117 and the other P-type MOS transistor (the right P-type MOS transistor in FIG. 11) of the transfer gate 2111 are turned on, and the N-type MOS transistors 2112 and 2118 are turned off. Then, the potential of the node $N_{37}$ is of the potential Vdd of the power supply node VDD, one P-type MOS transistor of the transfer gate 2115 (the left P-type MOS transistor in FIG. 11) is turned off and the N-type MOS transistor 2114 is turned on.

The potential of the node $N_{33}$ is raised to the potential Vdd of the power supply node VDD by current from the power supply node VDD passed through the transfer gate 2111. One P-type MOS transistor of the transfer gate 2116 (the left P-type MOS transistor in FIG. 11) and the P-type MOS transistor 2122 are turned off and the N-type MOS transistor 2126 is turned on.

Furthermore, the other P-type MOS transistor of the transfer gate 2116 (the right P-type MOS transistor in FIG. 11) and the P-type MOS transistor 2123 are turned off and the N-type MOS transistors 2120 and 2124 are turned on. Then, the potential of the node $N_{38}$ is of the potential V0 of the ground node GND, the P-type MOS transistor 2121 is turned on, and one N-type MOS transistor of the transfer gate 2125 (the left N-type MOS transistor in FIG. 11) is turned off.

In this state, when a component SS1 of "0" of the oscillation signal $S_1$ is input to the input terminal In, the N-type MOS transistor 2113 and the other N-type MOS transistor of the transfer gate 2125 (the right N-type MOS transistor in FIG. 11) are turned off, and the other P-type MOS transistor of the transfer gate 2115 (the right P-type MOS transistor in FIG. 11) is turned on.

As a result, the N-type MOS transistor 2112 is turned off and the transfer gates 2115 and 2125 are closed, so that the potential of the node $N_{32}$ is kept at the potential V0 of the ground node GND and the frequency divider 211 outputs the oscillation signal $S_{d1}$ of "0" from the output terminal Out.

Thereafter, when a component SS2 of "1" of the oscillation signal $S_1$ is input to the input terminal In, the N-type MOS transistor 2113 and the other N-type MOS transistor of the transfer gate 2125 (the right N-type MOS transistor in FIG. 11) are turned on, and the other P-type MOS transistor of the transfer gate 2115 (the right P-type MOS transistor in FIG. 11) is turned off.

As a result, the potential of the node $N_{34}$ changes to the potential V0 of the ground node GND from the potential Vdd of the power supply node VDD, the N-type MOS transistor 2120 is turned off, and the other P-type MOS transistor of the transfer gate 2116 (the right P-type MOS transistor in FIG. 11) is turned on. The potential of the node $N_{38}$ changes to the potential Vdd of the power supply node VDD, the P-type MOS transistor 2121 is turned off, and one N-type MOS transistor of the transfer gate 2125 (the left N-type MOS transistor in FIG. 11) is turned on.

In this way, current is not passed from any of the three power supply nodes VDD to the node $N_{32}$, so that the potential of the node $N_{32}$ is kept at the potential V0 of the ground node GND, and the frequency divider 211 outputs the oscillation signal $S_{d1}$ of "0" from the output terminal Out.

Furthermore, thereafter, when a component SS3 consisting of "0" of the oscillation signal $S_1$ is input to the input terminal In, the N-type MOS transistor 2113 and the other N-type MOS transistor of the transfer gate 2125 (the right N-type MOS transistor in FIG. 11) are turned off, and one P-type MOS transistor of the transfer gate 2111 (the left P-type MOS transistor in FIG. 11) and the other P-type MOS transistor of the transfer gate 2115 (the right N-type MOS transistor in FIG. 11) are turned on.

As a result, current is passed from the power supply node VDD through the transfer gates 2115 and 2116 to the node $N_{32}$ and the potential of the node $N_{32}$ attains the potential vdd of the power supply node VDD. The P-type MOS transistor 2117 is turned off and the N-type MOS transistor 2118 is turned on, and the potential of the node $N_{37}$ reaches the potential V0 of the ground node GND, so that one P-type MOS transistor of the transfer gate 2115 (the left P-type MOS transistor in FIG. 11) is turned on, and the N-type MOS transistor 2114 is turned off. The other P-type MOS transistor of the transfer gate 2111 (the right P-type MOS transistor in FIG. 11) is turned off and the N-type MOS transistor 2112 is turned on.

Therefore, the frequency divider 211 outputs an oscillation signal $S_{d1}$ of "1" from the output terminal Out.

Then, when a component SS4 of "1" of the oscillation signal $S_1$ is input to the input terminal In, one P-type MOS transistor of the transfer gate 2111 (the left P-type MOS transistor in FIG. 11) is turned off, and the N-type MOS transistor 2113 is turned on. As a result, the transfer gate 2111 is closed, and the N-type MOS transistors 2112 and 2113 are turned on, so that the potential of the node $N_{33}$ reaches the potential V0 of the ground node GND.

Then, the P-type MOS transistor 2122 is turned on and the N-type MOS transistor 2126 is turned off. The other N-type MOS transistor of the transfer gate 2125 (the right N-type MOS transistor in FIG. 11) is turned on in response to the component SS4 consisting of "1". Current is passed from the power supply node VDD to the node $N_{34}$ through the P-type MOS transistor 2122, so that the potential of the node $N_{34}$ reaches the potential Vdd of the power supply node VDD, the other P-type MOS transistor of the transfer gate 2116 (the right P-type MOS transistor in FIG. 11) is turned off, and the N-type MOS transistor 2120 is turned off.

Therefore, current is passed to the node $N_{32}$ through the P-type MOS transistor 2122, the transfer gate 2125 and the N-type MOS transistor 2120 from the power supply node VDD, and the potential of the node $N_{32}$ attains the potential Vdd of the power supply node VDD. The frequency divider 211 outputs the oscillation signal $S_{d1}$ of "1" from the output terminal Out.

Thereafter, when a component SS5 of "0" of the oscillation signal $S_1$ is input to the input terminal In, one P-type MOS transistor of the transfer gate 2111 (the left P-type MOS transistor in FIG. 11) is turned on, and the N-type MOS transistor 2113 is turned off. As a result, the potential of the node $N_{33}$ reaches the potential Vdd of the power supply node VDD, the P-type MOS transistor 2122 is turned off and the N-type MOS transistor 2126 is turned on. In response to the potential of the node $N_{33}$ (potential Vdd), one P-type MOS transistor of the transfer gate 2116 (the left P-type MOS transistor in FIG. 11) is turned off and the transfer gate 2116 is closed. Furthermore, in response to the component SS5 consisting of "0", the other N-type MOS transistor of the transfer gate 2125 (the right N-type MOS transistor in FIG. 11) is turned off, and the transfer gate 2125 is closed.

As a result, current is passed to the ground node GND from the node $N_{32}$ through the N-type MOS transistors 2120 and 2126, so that the potential of the node $N_{32}$ reaches the potential V0 of the ground node GND. Therefore, the frequency divider 211 outputs the oscillation signal $S_{d1}$ of "0" from the output terminal Out.

Thereafter, the frequency divider 211 repeats the above-described operation and outputs the oscillation signal $S_{d1}$ from the output terminal Out.

The frequency divider 211 outputs an oscillation signal $S_{d2}$ in the same manner from the output terminal Out when an oscillation signal $S_2$ is input to the input terminal In.

The oscillation signal $S_{d1}$ has a phase delayed from the oscillation signal $S_1$ and has a cycle twice as large as the cycle of the oscillation signal $S_1$. The oscillation signal $S_{d2}$ has a phase delayed from the oscillation signal $S_2$ and has a cycle twice as large as the cycle of the oscillation signal $S_2$.

If the phase difference between the oscillation signals $S_1$ and $S_2$ is $T_{d1}$ and the phase difference between the oscillation signals $S_{d1}$ and $S_{d2}$ is $T_{d2}$, the phase difference $T_{d2}$ is greater than the phase difference $T_{d1}$. As a result, the oscillation signal $S_{d1}$ can be detected correctly as compared to the case without the frequency divider 211.

The area occupied by the frequency divider 211 that includes 21 transistors can be small.

Note that the frequency dividers 212 to 21R shown in FIG. 10 each have the same configuration as that of the frequency divider 211 shown in FIG. 11.

Figure 13:
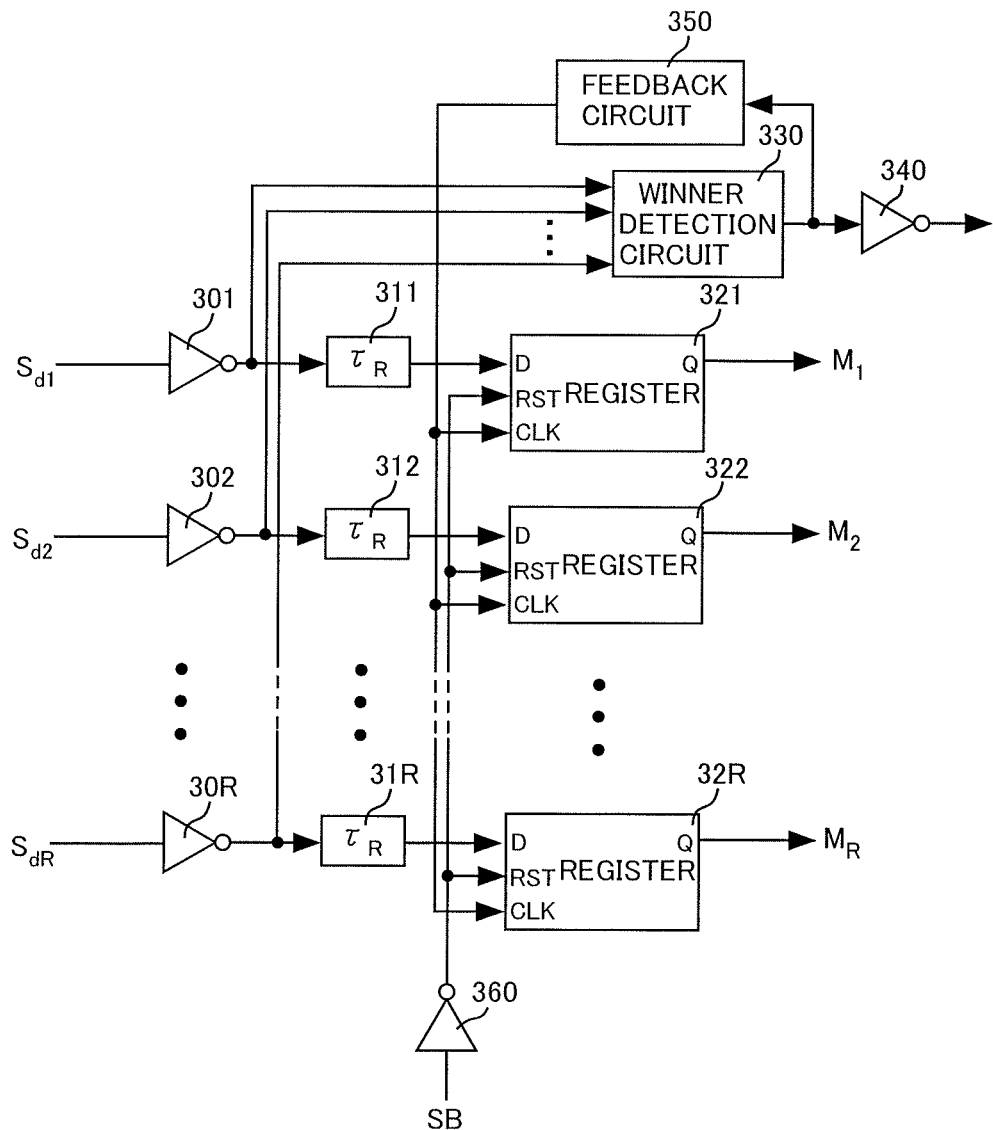
FIG. 13 is a diagram of the time domain WTA circuit shown in FIG. 1.

FIG. 13 is a diagram of the time domain WTA circuit 30 shown in FIG. 1. Referring to FIG. 13, the time domain WTA circuit 30 includes inverters 301 to 30R, 340, and 360, delay circuits 311 to 31R, registers 321 to 32R, a Winner detection circuit 330, and a feedback circuit 350.

The inverters 301 to 30R are provided corresponding to the frequency dividers 211 to 21R in the frequency divider circuit 20, and receive the oscillation signals $S_{d1}$ to $S_{dR}$, respectively. The inverters 301 to 30R invert the oscillation signals $S_{d1}$ to $S_{dR}$, respectively, output the inverted signals $/S_{d1}$ to $/S_{dR}$ to the delay circuits 311 to 31R, respectively and also to the Winner detection circuit 330.

The delay circuits 311 to 31R each include an even number of inverters connected in series. The delay circuits 311 to 31R receive the inverted signals $/S_{d1}$ to $/S_{dR}$, respectively, delay the received inverted signals $/S_{d1}$ to $/S_{dR}$ by $\tau_R$ and output the delayed inverted signals $/S_{d1}$ to $/S_{dR}$ to the data terminals D of the registers 321 to 32R, respectively.

The registers 321 to 32R each receive the inverted signal /SB (=1) of a search start signal SB (=0) from an inverter 360 at their reset terminals RST and a search end signal SE from the feedback circuit 350 at their clock terminals CLK.

The registers 321 to 32R are reset upon receiving the inverted signal /SB at the reset terminals RST. The registers 321 to 32R receive the inverted signals $/S_{d1}$ to $/S_{dR}$, respectively at their data terminals D. Furthermore, the registers 321 to 32R output the inverted signals $/S_{d1}$ to $/S_{dR}$, respectively received at the data terminals D when the search end signal SE is not received at the clock terminals CLK and latch (hold) the inverted signals $/S_{d1}$ to $/S_{dR}$, received at the data terminals D when the search end signal SE is received at the clock terminals CLK.

The Winner detection circuit 330 receives the inverted signals $/S_{d1}$ to $/S_{dR}$ from the inverters 301 to 30R, respectively and detects the earliest changing inverted signal (one of the inverted signals $/S_{d1}$ to $/S_{dR}$) among the received inverted signals $/S_{d1}$ to $/S_{dR}$.

Upon detecting the earliest changing inverted signal (one of the inverted signals $/S_{d1}$ to $/S_{dR}$), the Winner detection circuit 330 produces a search end signal SE and outputs the produced search end signal SE to the inverter 340 and the feedback circuit 350.

The inverter 340 inverts the search end signal SE received from the Winner detection circuit 330 to output an inverted signal /SE.

The feedback circuit 350 receives the search end signal SE from the Winner detection circuit 330 and outputs the received search end signal SE to R registers 321 and 32R simultaneously.

The inverter 360 receives the search start signal SB from the outside and inverts the received search start signal SB to output an inverted signal /SB to the registers 321 to 32R.

Figure 14:
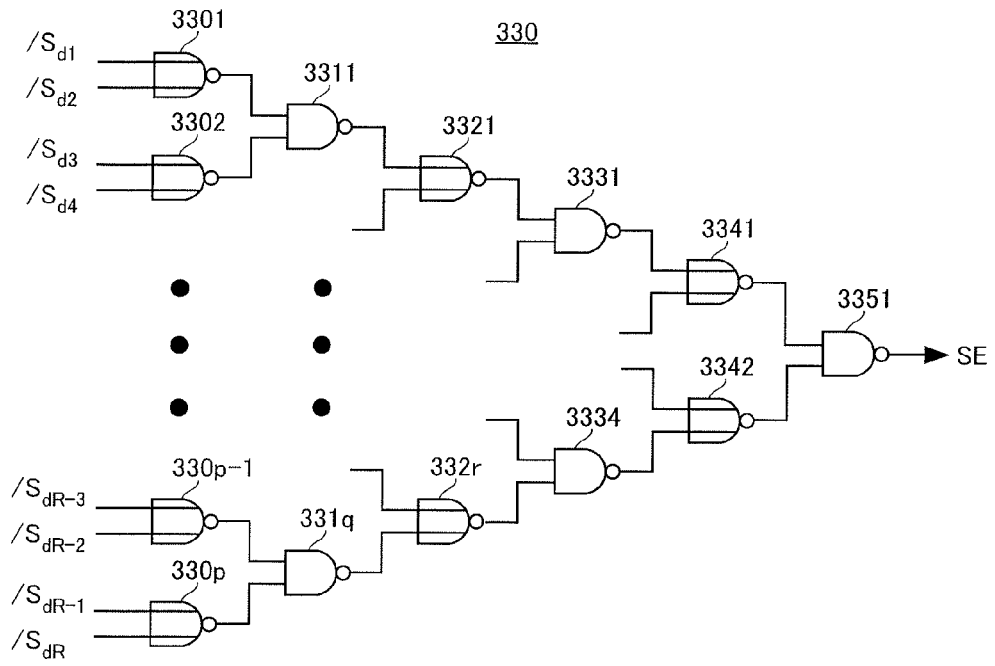
FIG. 14 is a circuit diagram of the Winner detection circuit shown in FIG. 13.

FIG. 14 is a circuit diagram of the Winner detection circuit 330 shown in FIG. 13. Referring to FIG. 14, the Winner detection circuit 330 includes NOR circuits 3301 to 330p, 3321 to 332r, 3341, and 3342, and NAND circuits 3311 to 331q, 3331 to 3334, and 3351.

Here, p is an integer that satisfies p=R/2, q is an integer that satisfies q=p/2, and r is an integer that satisfies r=q/2.

The NOR circuit 3301 receives the inverted signals $/S_{d1}$ and $/S_{d2}$, obtains the logical sum of the received inverted signals $/S_{d1}$ and $/S_{d2}$, and inverts the operated logical sum for output to the NAND circuit 3311.

The NOR circuit 3302 receives the inverted signals $/S_{d3}$ and $/S_{d4}$, obtains the logical sum of the received inverted signals $/S_{d3}$ and $/S_{d4}$, and inverts the operated logical sum for output to the NAND circuit 3311.

Thereafter, in the same manner, a NOR circuit 330p-1 receives inverted signals $/S_{dR-3}$ and $/S_{dR-2}$, obtains the logical sum of the received inverted signals $/S_{dR-3}$ and $/S_{dR-2}$ and inverts the operated logical sum for output to the NAND circuit 331q. The NOR circuit 330p receives the inverted signals $/S_{dR-1}$ and $/S_{dR}$, obtains the logical sum of the received inverted signals $/S_{dR-1}$ and $/S_{dR}$ and inverts the operated logical sum for output to the NAND circuit 331q.

The NAND circuit 3311 obtains the logical product of the output signal of the NOR circuit 3301 and the output signal of the NOR circuit 3302 and inverts the operated logical product for output to the NOR circuit 3321. Thereafter, in the same manner, the NAND circuit 33q obtains the logical product of the output signal of the NOR circuit 330p-1 and the output signal of the NOR circuit 330p, inverts the operated logical product for output to the NOR circuit 332r.

The NOR circuit 3321 obtains the logical sum of the output signal of the NAND circuit 3311 and the output signal of a NAND circuit 3312 (not shown) and inverts the operated logical sum for output to the NAND circuit 3331. Thereafter, in the same manner, the NOR circuit 332r obtains the logical sum of the output signal of a NAND circuit 331q-1 (not shown) and the output signal of the NAND circuit 331q and inverts the operated logical sum for output to the NAND circuit 3334.

The NAND circuit 3331 obtains the logical product of the output signals of the NOR circuit 3321 and a NOR circuit 3322 (not shown) and inverts the operated logical product for output to the NOR circuit 3341. Thereafter, in the same manner, the NAND circuit 3334 obtains the logical product of the output signals of a NOR circuit 332r-1 (not shown) and the NOR circuit 332r and inverts the operated logical product for output to the NOR circuit 3342.

The NOR circuit 3341 obtains the logical sum of the output signals of the NAND circuit 3331 and a NAND circuit 3332 (not shown) and inverts the operated logical sum for output to the NAND circuit 3351. The NOR circuit 3342 obtains the logical sum of the output signals of a NAND circuit 3333 (not shown) and the NAND circuit 3334 and inverts the operated logical sum for output to the NAND circuit 3351.

The NAND circuit 3351 obtains the logical product of the output signals of the NOR circuit 3341 and the NOR circuit 3342, inverts the operated logical product to produce a search end signal SE. The NAND circuit 3351 outputs the search end signal SE to the inverter 340 and the feedback circuit 350.

When the inverted signal $/S_{d1}$ is an inverted signal in the Winner row and the inverted signals $/S_{d2}$ to $/S_{dR}$ are inverted signals in the Loser rows, the NOR circuit 3301 outputs "0" and the NOR circuits 3302 to 330p output "1".

Then, the NAND circuit 3311 outputs "1" and the NAND circuits 3312 to 331q output "0". Then, the NOR circuit 3321 outputs "0" and the NOR circuits 3322 to 332r output "1". Subsequently, the NAND circuit 3331 outputs "1" and the NAND circuits 3332 to 3334 output "0". The NOR circuit 3341 outputs "0" and the NOR circuit 3342 outputs "1". Then, the NAND circuit 3351 outputs the search end signal SE of "1".

The Winner detection circuit 330 similarly produces a search end signal SE for output if any of the inverted signals /$S_{d2}$ to /$S_{dR}$ is an inverted signal in the Winner row.

The Winner detection circuit 330 has two input gates connected in a tournament manner. As a result, if any of the rows becomes the Winner row, the number of NOR circuits and the NAND circuits passed by the inverted signal in the Winner row after the inverted signal is input to the Winner detection circuit 330 until the search end signal SE is output is equal.

Therefore, delay time for the search end signal SE after the inverted signal of the Winner row is input to the Winner detection circuit 330 until the search end signal SE is output can be set constant for any row being the Winner row.

Figure 15:
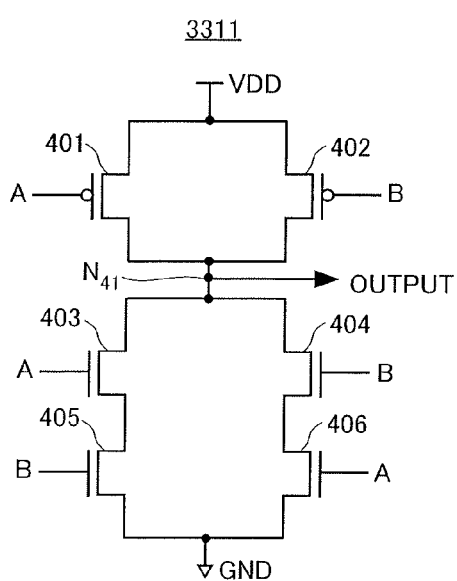
FIG. 15 is a circuit diagram of the NAND circuit shown in FIG. 14.

FIG. 15 is a circuit diagram of the NAND circuit 3311 shown in FIG. 14. Referring to FIG. 15, the NAND circuit 3311 includes P-type MOS transistors 401 and 402 and N-type MOS transistors 403 to 406.

The P-type MOS transistors 401 and 402 are connected in parallel between the power supply node VDD and a node $N_{41}$.

The N-type MOS transistors 403 and 405 are connected in series between the node $N_{41}$ and the ground node GND. The N-type MOS transistors 404 and 406 are connected in series between the node $N_{41}$ and the ground node GND. The N-type MOS transistors 403 and 405 connected in series are connected in parallel to the N-type MOS transistors 404 and 406 that are connected in series between the node $N_{41}$ and the ground node GND.

In the NAND circuit 3311, the P-type MOS transistor 401 and the N-type MOS transistors 403 and 406 receive an input A at their gate terminals and the P-type MOS transistor 402 and the N-type MOS transistors 404 and 405 receive an input B at their gate terminals.

In this way, the NAND circuit 3311 has a bilateral symmetrical arrangement of the P-type MOS transistors and the N-type MOS transistors whose output capacitances are constant.

Note that the NAND circuits 3312 to 331q, 3331 to 3334, and 3351 shown in FIG. 14 each have the same configuration as that of the NAND circuit 3311 shown in FIG. 15.

Figure 16:
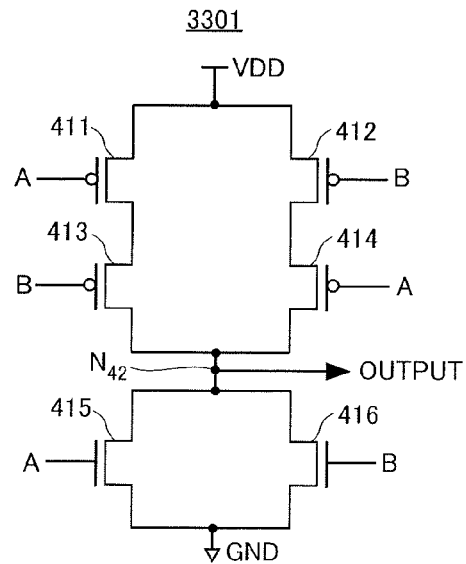
FIG. 16 is a circuit diagram of the NOR circuit shown in FIG. 14.

FIG. 16 is a circuit diagram of the NOR circuit 3301 shown in FIG. 14. Referring to FIG. 16, the NOR circuit 3301 includes P-type MOS transistors 411 to 414 and N-type MOS transistors 415 and 416.

The P-type MOS transistors 411 and 413 are connected in series between the power supply node VDD and the node $N_{42}$. The P-type MOS transistors 412 and 414 are connected in series between the power supply node VDD and the node $N_{42}$. Between the power supply node VDD and the node $N_{42}$, the P-type MOS transistors 411 and 413 connected in series are connected in parallel to the P-type MOS transistors 412 and 414 that are connected in series.

The N-type MOS transistors 415 and 416 are connected in parallel between the node $N_{42}$ and the ground node GND.

In the NOR circuit 3301, the P-type MOS transistors 411 and 414 and the N-type MOS transistor 415 receive the input A at their gate terminals, and the P-type MOS transistors 412 and 413 and the N-type MOS transistor 416 receive the input B at their gate terminals.

In this way, the NOR circuit 3301 has a bilateral symmetrical arrangement of the P-type MOS transistors and the N-type MOS transistors whose output capacitances are constant.

Note that the NOR circuits 3302 to 330p, 3321 to 332r, 3341, and 3342 each have the same configuration as that of the NOR circuit 3301 shown in FIG. 16.

As described above, the NOR circuits 3301 to 330p, 3321 to 332r, 3341, and 3342 and the NAND circuits 3311 to 331q, 3331 to 3334, and 3351 have a bilateral symmetrical arrangement of the P-type MOS transistors and the N-type MOS transistors. As a result, delay time in the NOR circuits 3301 to 330p, 3321 to 332r, 3341, and 3342 is equal among them and delay time in the NAND circuits 3311 to 331q, 3331 to 3334, and 3351 is equal among them.

Therefore, for any of the rows that become the Winner row, delay time after the inverted signal of the Winner row is input to the Winner detection circuit 330 until the search end signal SE is output and can be constant.

Figure 17:
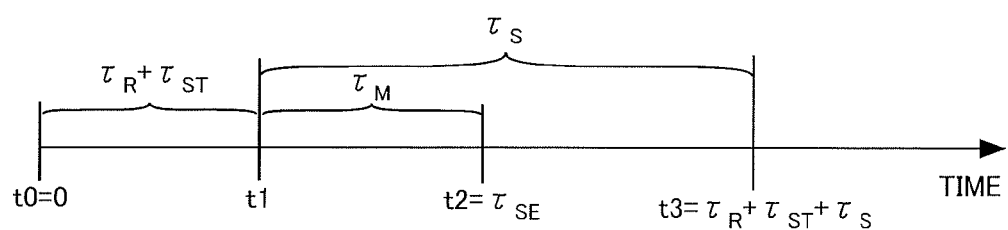
FIG. 17 is a timing chart in the time domain WTA circuit shown in FIG. 13.

FIG. 17 is a timing chart in the time domain WTA circuit 30 shown in FIG. 13.

Time after a signal in the Winner row changes until data is input to a register (one of the registers 321 to 32R) is $\tau_R$, time after detection of change in the signal in the Winner row until all the registers 321 to 32R are latched is $\tau_{SE}$, set up time for the registers 321 to 32R is $\tau_{ST}$, margin time used to cancel variation is $\tau_M$, and time difference for distance 1 is $\tau_S$.

Referring to FIG. 17, a signal in the Winner row changes in timing t0 (time 0). Then, in timing t1, the signal in the Winner row is input to a register (one of the registers 321 to 32R).

Then, the registers 321 to 32R in all the rows are latched in timing t2. In timing t3, a signal in the closest Loser row to the Winner row is input to a register (one of the registers 321 to 32R).

The time $\tau_{SE}$ from timing t0 to timing t2 equals $\tau_R+\tau_{ST}+\tau_M$, and therefore $\tau_R$ can be expressed as $\tau_R=\tau_{SE}-\tau_{ST}-\tau_M$.

The margin time $\tau_M$ is determined by adjusting $\tau_R$ so that the signal in the Winner row and the signal in the closest Loser row to the Winner row can be distinguished from each other if the time $\tau_{SE}$ after change in the signal in the Winner row is detected until all the registers 321 to 32R are latched varies.

Referring back to FIG. 13, if the oscillation signal $S_{d1}$ is an oscillation signal in the Winner row, the Winner detection circuit 330 detects change in the inverted signal /$S_{d1}$ earliest among the inverted signals /$S_{d1}$ to /$S_{dR}$ and produces a search end signal SE.

The delay circuit 311 delays the inverted signal /$S_{d1}$ by $\tau_R$ for output to the register 321 and the register 321 receives the inverted signal /$S_{d1}$ at the data terminal D.

Then, the feedback circuit 350 outputs a search end signal SE to the registers 321 to 32R at a time, and the registers 321 to 32R latch data in response to the search end single SE. At the time, only the register 321 receives the inverted signal, and the register 321 outputs a signal $M_1$ of "1" and the registers 322 to 32R output signals $M_2$ to $M_R$ of "0", respectively.

Figure 18:
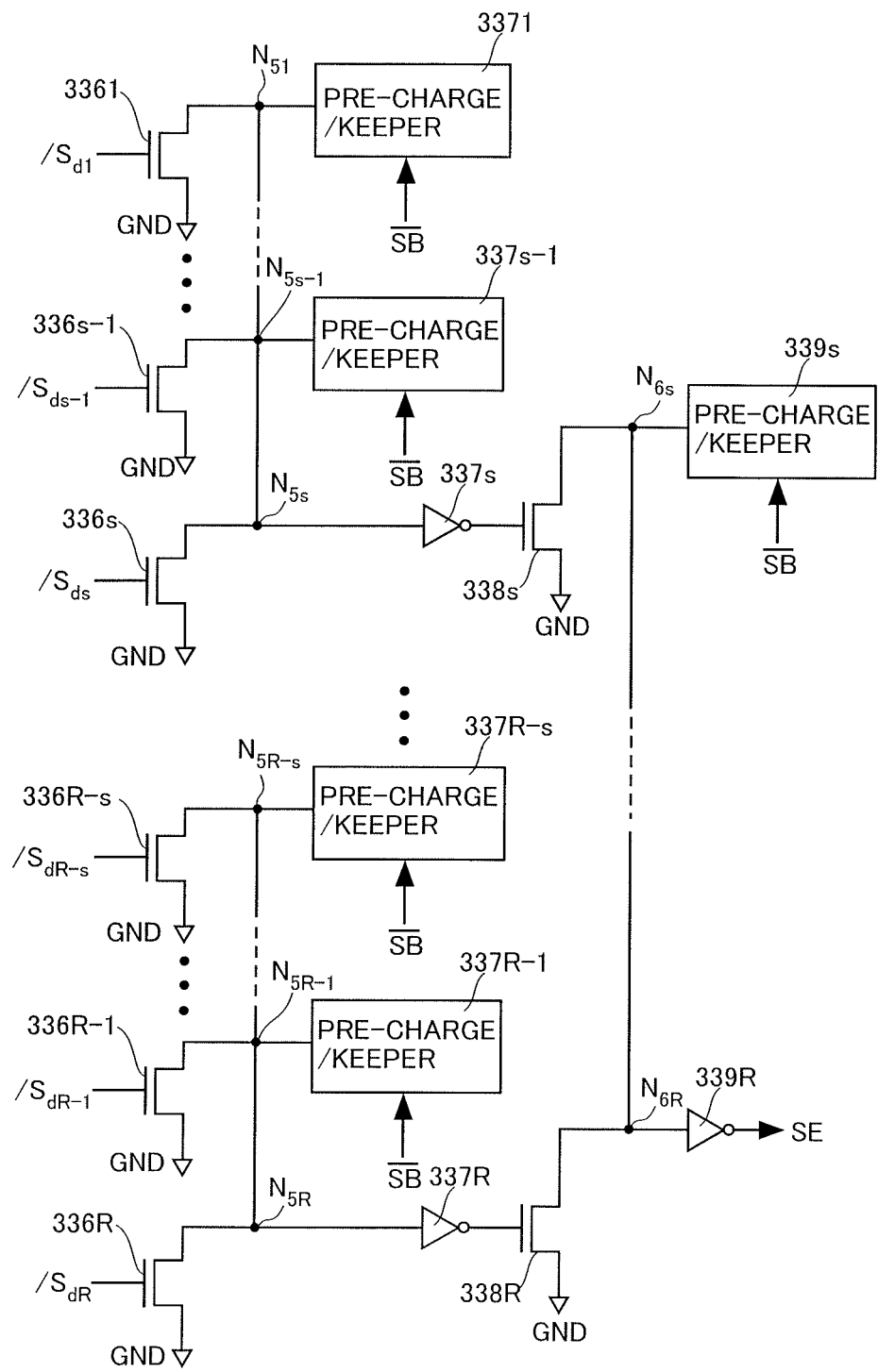
FIG. 18 is another circuit diagram of the Winner detection circuit.

FIG. 18 is another circuit diagram of the Winner detection circuit 330. According to an embodiment of the present invention, the time domain WTA circuit 30 may include the Winner detection circuit 330A shown in FIG. 18.

Referring to FIG. 18, the Winner detection circuit 330A includes N-type MOS transistors 3361 to 336R, pre-charge/keepers 3371 to 337s−1, . . . , 337R−s to 337R−1, and 339s, and inverters 337s, 337R, 338s, 338R, and 339R.

The N-type MOS transistors 3361 to 336s (s: an integer not less than 2) are connected between the ground node GND and nodes $N_{51}$ to $N_{5s}$, respectively.

The N-type MOS transistors 336R−s to 336R are connected between the ground node GND and nodes $N_{5R-s}$ to $N_{5R}$, respectively.

The N-type MOS transistors 3361 to 336R receive the inverted signals /$S_{d1}$ to /$S_{dR}$, respectively at their gate terminals.

The pre-charge/keepers 3371 to 337s−1 are connected to the source terminals of the N-type MOS transistors 3361 to 336s, respectively. The precharge/keepers 337R−s to 337R−1 are connected to the source terminals of the N-type MOS transistors 336R−s to 336R−1, respectively.

The inverter 337s has its input terminal connected to the source terminal of the N-type MOS transistor 336s and its output terminal connected to the gate terminal of the N-type MOS transistor 338s.

The inverters 337R has its input terminal connected to the source terminal of the N-type MOS transistor 336R and its output terminal connected to the gate terminal of the N-type MOS transistor 338R.

S nodes $N_{51}$ to $N_{5s}$ are connected to one another and s nodes $N_{5R-s}$ to $N_{5R}$ are connected to one another.

The N-type MOS transistors 338s, . . . , and 338R are connected between the ground node GND and nodes $N_{6s}$, . . . , $N_{6R}$, respectively.

The pre-charge/keeper 339s is connected to the source terminal of the N-type MOS transistor 338s.

The inverter 339R is provided corresponding only to the inverted signal /$S_{dR}$ and its input terminal is connected to the source terminal of the N-type MOS transistor 338R.

Nodes $N_{6s}$, . . . , and $N_{6R}$ are provided for every s of the inverted signals /$S_{d1}$ to /$S_{dR}$ and connected to one another. The pre-charge/keeper 339s are provided for every s of the inverted signals of /$S_{d1}$ to /$S_{dR-1}$.

The pre-charge/keepers 3371 to 337s–1 pre-charge the node $N_{51}$ to $N_{5s}$ to the potential of the power supply node VDD and keep the pre-charged potential.

The pre-charge/keepers 337R–s to 337R precharge the nodes $N_{5R-s}$ to $N_{5R}$ to the potential of the power supply node VDD and keep the pre-charged potential.

The pre-charge/keeper 339s, . . . pre-charge the nodes $N_{6s}$, . . . , $N_{6R}$ to the potential of the power supply node VDD and keep the pre-charged potential.

Figure 19:
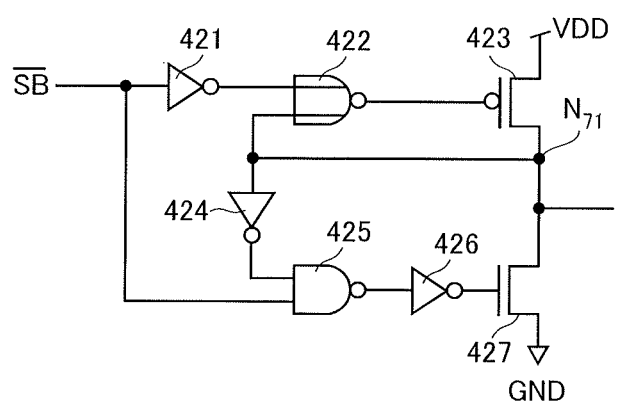
FIG. 19 is a circuit diagram of the pre-charge/keeper.

FIG. 19 is a circuit diagram of the pre-charge/keeper 3371. Referring to FIG. 19, the pre-charge/keeper 3371 includes inverters 421, 424, and 426, a NOR circuit 422, a P-type MOS transistor 423, a NAND circuit 425, and an N-type MOS transistor 427.

The P-type MOS transistor 423 and the N-type MOS transistor 427 are connected in series between the power supply node VDD and the ground node GND. The P-type MOS transistor 423 has its gate terminal connected to the output terminal of the NOR circuit 422. The N-type MOS transistor 427 has its gate terminal connected to the output terminal of the inverter 426.

The NOR circuit 422 is connected between the output terminal of the inverter 421 and the gate terminal of the P-type MOS transistor 423. The inverter 424 is connected between the input terminal of the NOR circuit 422 and a node N71 and the input terminal of the NAND circuit 425.

The NAND circuit 425 is connected between the input terminal of the inverter 421 and the output terminal of the inverter 424 and the input terminal of the inverter 426. The inverter 426 is connected between the output terminal of the NAND circuit 425 and the gate terminal of the N-type MOS transistor 427.

The inverter 421 receives the inverted signal /SB of a search start signal SB from a control circuit (not shown) for the associative memory 100 and inverts the received inverted signal /SB for output to the NOR circuit 422.

The NOR circuit 422 obtains the logical sum of the output signal of the inverter 421 and an input signal to the inverter 424 (a signal of the potential of the node $N_{71}$) and inverts the operated logical sum for output to the gate terminal of the P-type MOS transistor 423.

The inverter 424 inverts a signal of the potential of the node $N_{71}$ for output to the NAND circuit 425.

The NAND circuit 425 obtains the logical product of the inverted signal /SB and the output signal of the inverter 424 and inverts the operated logical product for output to the inverter 426. The inverter 426 inverts the output signal of the NAND circuit 425 for output to the gate terminal of the N-type MOS transistor 427.

The operation of the pre-charge/keeper 3371 will be described. Before a Winner detection circuit 330A starts operating, the inverter 421 receives an inverted signal /SB of "0" and inverts the received inverted signal /SB into a signal of "1" for output to the NOR circuit 422.

The NOR circuit 422 inverts the signal of "1" into a signal of "0" for output to the gate terminal of the P-type MOS transistor 423 regardless of the potential of the node $N_{71}$.

On the other hand, the NAND circuit 425 receives the inverted signal /SB of "0" and inverts the inverted signal /SB of "0" into a signal of "1" for output to the inverter 426 regardless of the output signal of the inverter 424. The inverter 426 inverts the signal of "1" for output to the gate terminal of the N-type MOS transistor 427.

In this way, the P-type MOS transistor 423 turns on in response to the signal of "0" received at the gate terminal and the N-type MOS transistor 427 turns off in response to the signal of "0" received at the gate terminal. As a result, current is passed to the node $N_{71}$ from the power supply node VDD through the P-type MOS transistor 423 and the node $N_{71}$ is pre-charged to the potential of the power supply node VDD.

Then, the inverter 421 receives the inverted signal /SB of "1", inverts the received inverted signal /SB into a signal of "0" for output to the NOR circuit 422. The NOR circuit 422 receives the signal of "0" from the inverter 421, the signal of "1" (=the potential of node $N_{71}$ that is equal to the potential of the power supply node VDD) from the node $N_{71}$, obtains the logical sum of the signal of "0" and the signal of "1" and inverts the operated logical sum for output to the gate terminal of the P-type MOS transistor 423.

On the other hand, the NAND circuit 425 receives the inverted signal /SB of "1" and the signal of "0", obtains the logical product of the inverted signal /SB of "1" and the signal of "0", and inverts the operated logical product into a signal of "1" for output to the inverter 426.

The inverter 426 inverts the signal of "1" into a signal of "0" for output the gate terminal of the N-type MOS transistor 427.

In this way, the P-type MOS transistor 423 turns on in response to the signal of "0" received at the gate terminal and the N-type MOS transistor 427 turns off in response to the signal of "0" received at the gate terminal.

As a result, the potential of the node $N_{71}$ is kept at the potential of the power supply node VDD.

Note that the pre-charge/keepers 3372 to 337s–1, . . . , 337R–s to 337R–1, and 339s each have the same configuration as that of the pre-charge/keeper 3371 shown in FIG. 19.

Referring back to FIG. 18, the operation of the Winner detection circuit 330A will be described by describing the case where an inverted signal in the Winner row is the inverted signal /$S_{d1}$ as an example.

Before the inverted signals /$S_{d1}$ to /$S_{dR}$ are input to the Winner detection circuit 330A, the nodes $N_{51}$ to $N_{5s}$, . . . , and $N_{5R-s\ to\ N5R}$, and $N_{6s}$ to $N_{6R}$ of the Winner detection circuit 330A are pre-charged to the potential of the power supply node VDD by the pre-charge/keepers 3371 to 337s–1, . . . , 337R–s to 337R–1, and 339s.

When the inverted signal /$S_{d1}$ is input to the Winner detection circuit 330A earliest and the inverted signal /$S_{d1}$ changes from "0" to "1", the N-type MOS transistor 3361 turns on and the potentials of the nodes $N_{51}$ to $N_{5s}$ are lowered to the potential of the ground node GND.

As a result, the inverter 337s inverts a signal of "0" (the signal at the potential of the ground node GND) for output to the gate terminal of the N-type MOS transistor 338s and the N-type MOS transistor 338s turns on in response to the signal of "1" received at the gate terminal.

The potentials of the nodes $N_{6s}$ to $N_{6R}$ are lowered to the potential of the ground node GND, the inverter 339R inverts a signal of "0" (the signal at the potential of the ground node GND) and outputs the inverted signal of "1" as a search end signal SE.

When any of the inverted signals $/S_{d2}$ to $/S_{dR}$ other than the inverted signal $/S_{d1}$ is the inverted signal in the Winner row, the Winner detection circuit 330A detects change in the inverted signal in the Winner row earliest in the same manner and produces a search end signal SE.

Figure 20:
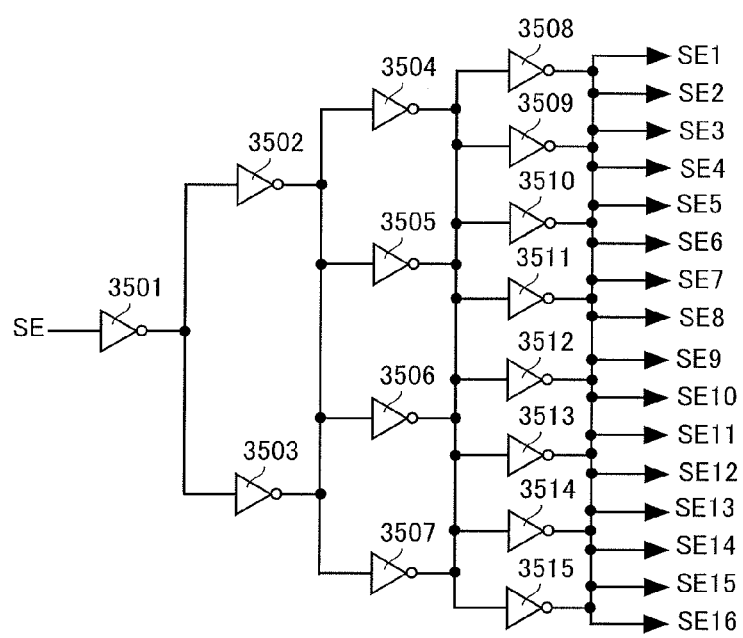
FIG. 20 is a circuit diagram of the feedback circuit shown in FIG. 13.

FIG. 20 is a circuit diagram of the feedback circuit 350 shown in FIG. 13. Note that the feedback circuit 350 shown in FIG. 20 is a feedback circuit when there are 16 rows.

Referring to FIG. 20, the feedback circuit 350 includes inverters 3501 to 3515.

The outputs of the inverters 3502 and 3503 are connected by one wiring, the outputs of the inverters 3504 to 3507 are connected by one wiring, and the outputs of the inverters 3508 to 3515 are connected by one wiring.

The inverter 3501 receives the search end signal SE from the Winner detection circuit 330, inverts the received search end signal SE into an inverted signal /SE and outputs the signal to the inverters 3502 and 3503 at a time.

The inverters 3502 and 3503 inverts the inverted signal /SE into the search end signal SE and outputs the signal to the inverters 3504 to 3507 at a time. The inverters 3504 to 3507 invert the search end signal SE into an inverted signal /SE and outputs the signal to the inverters 3508 to 3515 at a time. The inverters 3508 to 3515 invert the inverted signal /SE and outputs search end signals SE1 to SE16 (=SE) at a time.

In this way, the search end signals SE can be output in the same timing by connecting the outputs of the inverters in all the stages by one wiring.

The operation of the associative memory 100 shown in FIG. 1 will be described when the bit number of search data and reference data is 8, and each of the N bit stages 41 to 4k shown in FIG. 2 is a 4-bit stage.

Figure 21:
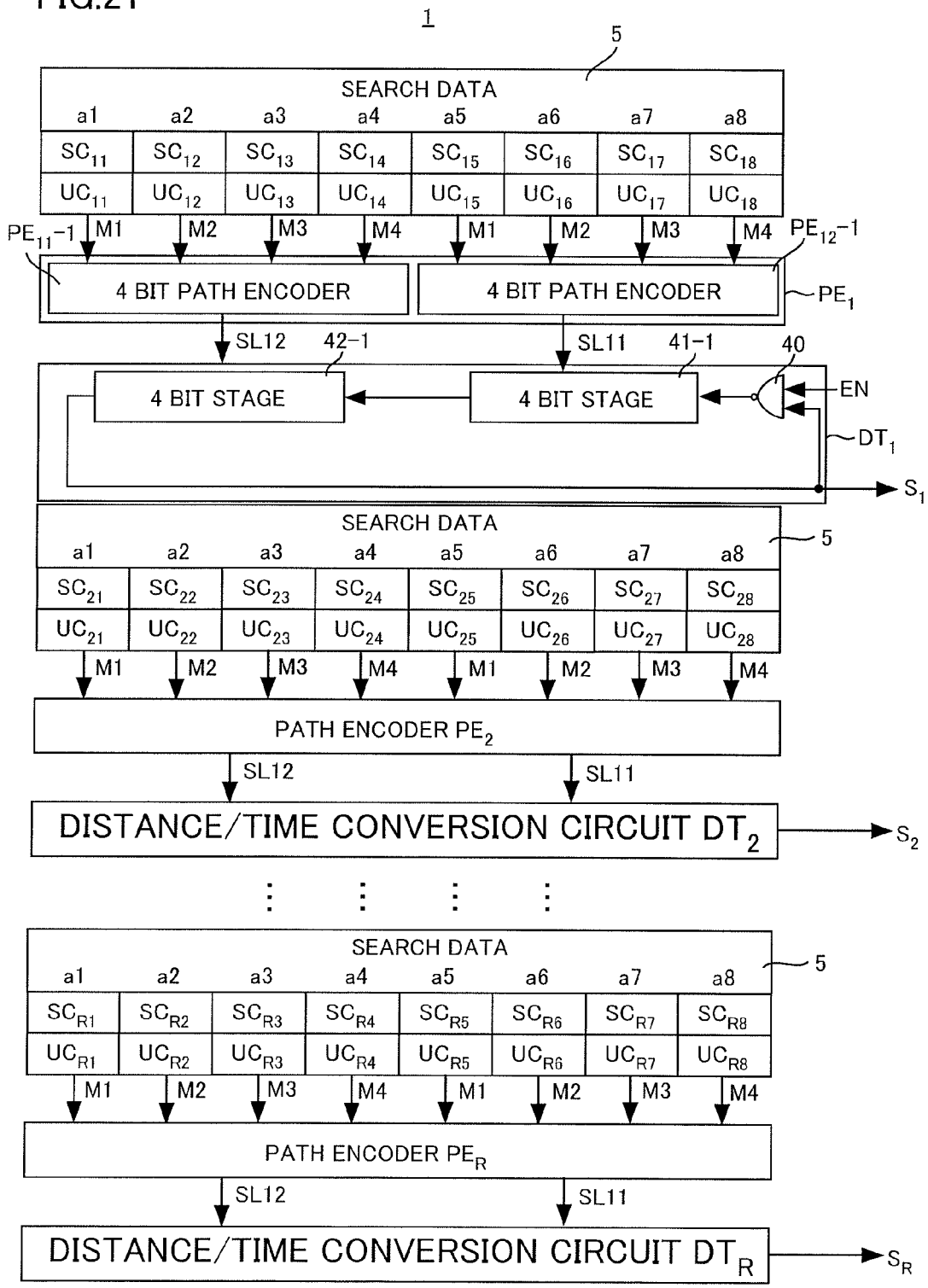
FIG. 21 is a view of a specific example of the memory portion shown in FIG. 1.

FIG. 21 is a view of a specific example of the memory portion 1 shown in FIG. 1. Referring to FIG. 21, the memory portion 1 includes reference data storage cell circuits $SC_{11}$ to $SC_{18}$, $SC_{21}$ to $SC_{28}$, ..., and $SC_{R1}$ to $SC_{R8}$, unit comparator circuits $UC_{11}$ to $UC_{18}$, $UC_{21}$ to $UC_{28}$, ..., and $UC_{R1}$ to $UC_{R8}$, path encoders $PE_1$ to $PE_R$, and distance/time conversion circuits $DT_1$ to $DT_R$.

The search data storage circuit 5 then stores 8-bit search data a1 to a8.

The path encoders $PE_1$ to $PE_R$ each include 4-bit path encoders $PE_{11}$-1 and path encoder $PE_{12}$-1 and the distance/time conversion circuits $DT_1$ to $DT_R$ each include a NAND circuit 40 and 4-bit stages 41-1 and 42-1.

The reference data storage cell circuits $SC_{11}$ to $SC_{18}$ each store 1 bit of the 8-bit reference data 1. The reference data storage cell circuits $SC_{21}$ to $SC_{28}$ each store 1-bit of the 8-bit reference data 2. Thereafter, in the same manner, the reference data storage cell circuits $SC_{R1}$ to $SC_{R8}$ each store 1 bit of 8 bit reference data R.

The unit comparator circuit $UC_{11}$ compares 1-bit a1 of search data to the 1-bit stored in the reference data storage cell circuit $SC_{11}$. The unit comparator circuit $UC_{11}$ outputs a distance signal M1 of "0" to the 4-bit path encoder $PE_{11}$-1 if they match and a distance signal M1 of "1" to the 4-bit path encoder $PE_{11}$-1 if they do not match.

The unit comparator circuits $UC_{12}$ to $UC_{11}$ compare 1 bit data a2, a3, and a4 of search data to 1 bit data stored in the reference storage circuits $SC_{12}$ to $SC_{14}$ and output distance signals M2 to M4 to the 4-bit path encoder $PE_{11}$-1.

The unit comparator circuits $C_{15}$ to $UC_{18}$ compare 1 bit data a5, a6, a7, and a8 of the search data to 1 bit data stored in the reference storage circuits $SC_{15}$ to $SC_{18}$, respectively and output distance signals M1 to M4 to the path encoder $PE_{12}$-1.

The unit comparator circuits $UC_{21}$ to $UC_{28}$, ..., and $UC_{R1}$ to $UC_{R8}$ output distance signals M1 to M4, and M1 to M4 to path encoders $PE_2$ to $PE_R$ similarly to the unit comparator circuits $UC_{11}$ to $UC_{18}$.

The 4-bit path encoder $PE_{12}$-1 produces a selection signal SL11 based on the 4-bit distance signals M1 to M4 and outputs the produced selection signal SL11 to the 4 bit stage 41-1. The 4-bit path encoder $PE_{11}$-1 produces a selection signal SL12 based on the 4-bit distance signals M1 to M4 and outputs the produced selection signal SL12 to the 4-bit stage 41-2.

The path encoders $PE_2$ to $PE_R$ produce selection signals SL1 and SL12 based on 8 bit distance signals M1 to M4 and M1 to M4 and output the produced selection signals SL11 and SL12 to distance/time conversion circuit $DT_2$ to $DT_R$, respectively.

In the distance/time conversion circuit $DT_1$, the NAND circuit 40 obtains the logical product of an enable signal EN and the output signal of the 4-bit stage 42-1 and inverts the operated logical product for output to the 4-bit stage 41-1.

The 4-bit stage 41-1 delays the signal received from the NAND circuit 40 by a delay path selected based on the selection signal SL11 and outputs the delayed signal to the 4-bit stage 42-1.

The 4-bit stage 42-1 delays the signal received from the 4-bit stage 41-1 by a delay path selected based on the selection signal SL12 and outputs the delayed signal (=the oscillation signal $S_1$) to the NAND circuit 40 and the frequency divider circuit 20.

Figure 22:
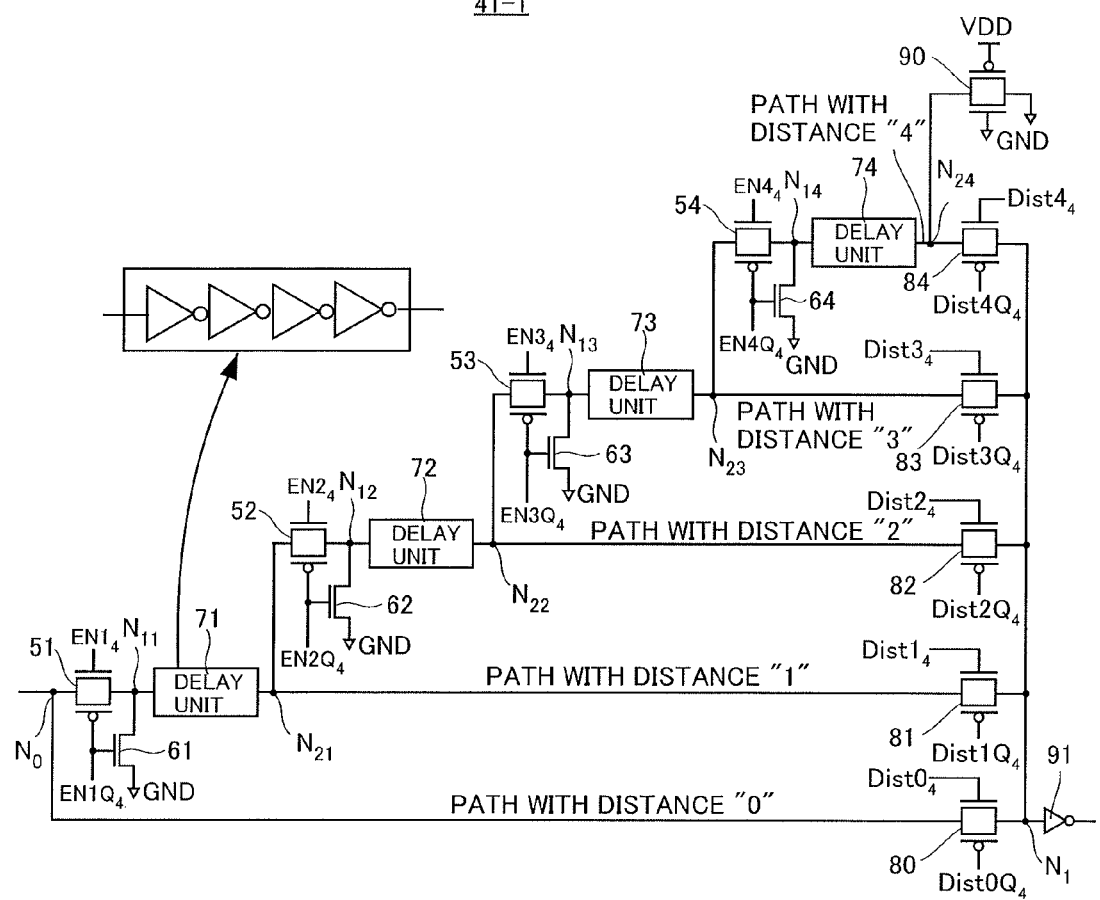
FIG. 22 is a circuit diagram of the configuration of the 4-bit stage shown in FIG. 21.

FIG. 22 is a circuit diagram of the configuration of the 4-bit stage 41-1 shown in FIG. 21. Referring to FIG. 22, the 4-bit stage 41-1 corresponds to the case when N=4 in the N-bit stage 41 shown in FIG. 3.

The delay units 71 to 74 each include an even number of inverters, four inverters for example, connected in series.

Note that the 4-bit stage 42-1 has the same configuration as that of the 4-bit stage 41-1 shown in FIG. 22.

Figure 23:
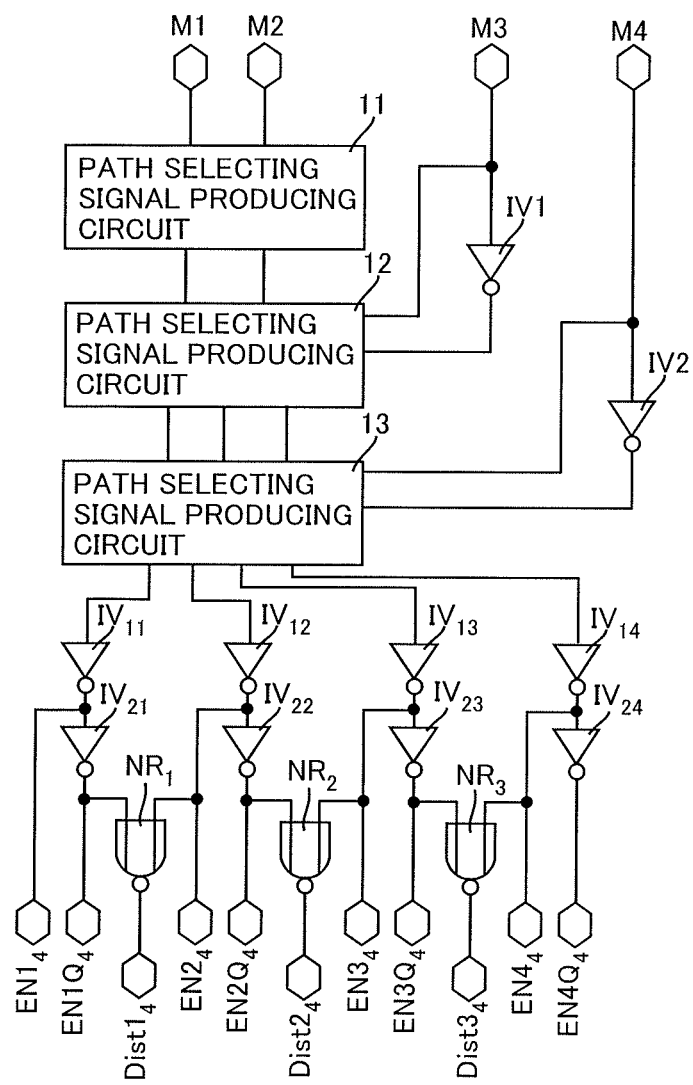
FIG. 23 is a diagram of the configuration of the 4-bit path encoder shown in FIG. 21.

FIG. 23 is a diagram of the configuration of the 4-bit path encoder $PE_{11}$-1 shown in FIG. 21. Referring to FIG. 23, the 4-bit path encoder $PE_{11}$-1 corresponds to the case where N=4 in the path encoder $PE_{11}$ shown in FIG. 5.

The path selection signal producing circuits 11 and 12 are as shown in FIGS. 6 and 7, respectively.

Figure 24:
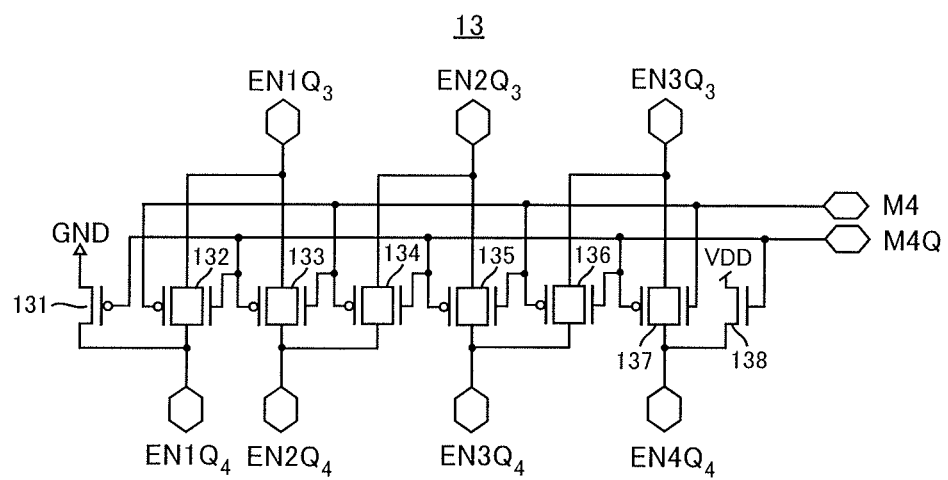
FIG. 24 is a circuit diagram of the path selection signal producing circuit shown in FIG. 23.

FIG. 24 is a circuit diagram of the path selection signal producing circuit 12 shown in FIG. 23. Referring to FIG. 24, the path selection signal producing circuit 13 corresponds to the case where N=4 in the path selection signal producing circuit 1N-1 in FIG. 8.

The path selection signal producing circuit 13 outputs signals $EN1Q_4=EN1Q_3$, $EN2Q_4=EN2Q_3$, $EN3Q_4=EN3Q_3$, and $EN4Q_{4=1}$ when the distance signal M4 is "0" and outputs signals $EN1Q_4=0$, $EN2Q_4=EN1Q_3$, $EN3Q_4=EN2Q_3$, and $EN4Q_4=EN3Q_3$ when the distance signal M4 is "1".

Referring back to FIG. 23, the inverters $IV_{11}$ to $IV_{14}$ and $IV_{21}$ to $IV_{24}$ and the NOR circuits $NR_1$ to $NR_3$ produce signals $EN1Q_4$ to $EN4Q_4$, $EN1_4$ to $EN4_4$, and $Dist1_4$ to $Dist3_4$ based on the signals $EN1Q_4$ to $EN4Q_4$ output from the path selection signal producing circuit 13.

Note that FIG. 23 does not show the signals $Dist0_4$ and $Dist4_4$, but the signal $Dist0_4$ equals the inverted signal $EN1Q_4$ of the signal $EN1_4$. This is because the transfer gate 51 must be closed when a signal is passed through a delay path including the node $N_0$, the transfer gate 80, and the inverter 91 in this order.

The signal $Dist4_4$ equals the signal EN4. This is because both the transfer gates 54 and 84 must be opened when a signal is passed through the delay unit 74.

Possible values for the signals $EN1Q_4$ to $EN4Q_4$, $EN1_4$ to $EN4_4$, and $Dist0_4$ to $Dist4_4$ when the distance signals M1 to M4 are each "0" or "1" are given in Table 3.

TABLE 3

| M1 | M2 | $EN1Q_2$ | $EN2Q_2$ | M3 | $EN1Q_3$ | $EN2Q_3$ | $EN3Q_3$ | M4 | $EN1Q_4$ | $EN2Q_4$ | $EN3Q_4$ | $EN4Q_4$ | $Dist0_4$ | $EN1_4$ | $EN1Q_4$ | $Dist1_4$ | $EN2_4$ |
|---|---|---|---|---|---|---|---|---|---|---|---|---|---|---|---|---|---|
| 0 | 0 | 1 | 1 | 0 | 1 | 1 | 1 | 0 | 1 | 1 | 1 | 1 | 1 | 0 | 1 | 0 | 0 |
|   |   |   |   |   |   |   |   | 1 | 0 | 1 | 1 | 1 | 0 | 1 | 0 | 1 | 0 |
|   |   |   |   | 1 | 0 | 1 | 1 | 0 | 0 | 1 | 1 | 1 | 0 | 1 | 0 | 1 | 0 |
|   |   |   |   |   |   |   |   | 1 | 0 | 0 | 1 | 1 | 0 | 1 | 0 | 0 | 1 |
| 0 | 1 | 0 | 1 | 0 | 0 | 1 | 1 | 0 | 0 | 1 | 1 | 1 | 0 | 1 | 0 | 1 | 0 |
|   |   |   |   |   |   |   |   | 1 | 0 | 0 | 1 | 1 | 0 | 1 | 0 | 0 | 1 |
|   |   |   |   | 1 | 0 | 0 | 1 | 0 | 0 | 0 | 1 | 1 | 0 | 1 | 0 | 0 | 1 |
|   |   |   |   |   |   |   |   | 1 | 0 | 0 | 0 | 1 | 0 | 1 | 0 | 0 | 1 |
| 1 | 0 | 0 | 1 | 0 | 0 | 1 | 1 | 0 | 0 | 1 | 1 | 1 | 0 | 1 | 0 | 1 | 0 |
|   |   |   |   |   |   |   |   | 1 | 0 | 0 | 1 | 1 | 0 | 1 | 0 | 0 | 1 |
|   |   |   |   | 1 | 0 | 0 | 1 | 0 | 0 | 0 | 1 | 1 | 0 | 1 | 0 | 0 | 1 |
|   |   |   |   |   |   |   |   | 1 | 0 | 0 | 0 | 1 | 0 | 1 | 0 | 0 | 1 |
| 1 | 1 | 0 | 0 | 0 | 0 | 0 | 1 | 0 | 0 | 0 | 1 | 1 | 0 | 1 | 0 | 0 | 1 |
|   |   |   |   |   |   |   |   | 1 | 0 | 0 | 0 | 1 | 0 | 1 | 0 | 0 | 1 |
|   |   |   |   | 1 | 0 | 0 | 0 | 0 | 0 | 0 | 0 | 1 | 0 | 1 | 0 | 0 | 1 |
|   |   |   |   |   |   |   |   | 1 | 0 | 0 | 0 | 0 | 0 | 1 | 0 | 0 | 1 |

| M1 | M2 | $EN1Q_2$ | $EN2Q_2$ | M3 | $EN1Q_3$ | $EN2Q_3$ | $EN3Q_3$ | M4 | $EN2Q_4$ | $Dist2_4$ | $EN3_4$ | $EN3Q_4$ | $Dist3_4$ | $EN4_4$ | $EN4Q_4$ | $Dist4_4$ | Path |
|---|---|---|---|---|---|---|---|---|---|---|---|---|---|---|---|---|---|
| 0 | 0 | 1 | 1 | 0 | 1 | 1 | 1 | 0 | 1 | 0 | 0 | 1 | 0 | 0 | 1 | 0 | distance 0 |
|   |   |   |   |   |   |   |   | 1 | 1 | 0 | 0 | 1 | 0 | 0 | 1 | 0 | distance 1 |
|   |   |   |   | 1 | 0 | 1 | 1 | 0 | 1 | 0 | 0 | 1 | 0 | 0 | 1 | 0 | distance 1 |
|   |   |   |   |   |   |   |   | 1 | 0 | 1 | 0 | 1 | 0 | 0 | 1 | 0 | distance 2 |
| 0 | 1 | 0 | 1 | 0 | 0 | 1 | 1 | 0 | 1 | 0 | 0 | 1 | 0 | 0 | 1 | 0 | distance 1 |
|   |   |   |   |   |   |   |   | 1 | 0 | 1 | 0 | 1 | 0 | 0 | 1 | 0 | distance 2 |
|   |   |   |   | 1 | 0 | 0 | 1 | 0 | 0 | 1 | 0 | 1 | 0 | 0 | 1 | 0 | distance 2 |
|   |   |   |   |   |   |   |   | 1 | 0 | 0 | 1 | 0 | 1 | 0 | 1 | 0 | distance 3 |
| 1 | 0 | 0 | 1 | 0 | 0 | 1 | 1 | 0 | 1 | 0 | 0 | 1 | 0 | 0 | 1 | 0 | distance 1 |
|   |   |   |   |   |   |   |   | 1 | 0 | 1 | 0 | 1 | 0 | 0 | 1 | 0 | distance 2 |
|   |   |   |   | 1 | 0 | 0 | 1 | 0 | 0 | 1 | 0 | 1 | 0 | 0 | 1 | 0 | distance 2 |
|   |   |   |   |   |   |   |   | 1 | 0 | 0 | 1 | 0 | 1 | 0 | 1 | 0 | distance 3 |
| 1 | 1 | 0 | 0 | 0 | 0 | 0 | 1 | 0 | 0 | 1 | 0 | 1 | 0 | 0 | 1 | 0 | distance 2 |
|   |   |   |   |   |   |   |   | 1 | 0 | 0 | 1 | 0 | 1 | 0 | 1 | 0 | distance 3 |
|   |   |   |   | 1 | 0 | 0 | 0 | 0 | 0 | 0 | 1 | 0 | 1 | 0 | 1 | 0 | distance 3 |
|   |   |   |   |   |   |   |   | 1 | 0 | 0 | 0 | 1 | 0 | 1 | 0 | 1 | distance 4 |

$Dist0_4$ = Inverse of $EN1_4$,
$Dist4_4$ = $EN4_4$

If M1=M2=M3=M4=0 or if the 4 bits of search data match the 4 bits of reference data, $Dist0_4$="1", $EN1_4$="0", $EN1Q_4$="1", $Dist1_4$="0", $EN2_4$="0", $EN2Q_4$="1", $Dist2_4$="0", $EN3_4$="0", $EN3Q_4$="1", $Dist3_4$="0", $EN4_4$="0", $EN4Q_4$="1", and $Dist4_4$="0".

As a result, the transfer gate 80 is opened and the transfer gates 51 to 54 and 81 to 84 are closed. A signal is passed through a delay path including the node $N_0$, the transfer gate 80, and the inverter 91 in this order. More specifically, the signal passes through a path with distance 0.

In this case, the N-type MOS transistors 61 to 64 are turned on in response to the signal $EN1Q_4=EN2Q_4=EN3Q_4=EN4Q_4$="1", so that the potentials of the nodes $N_{11}$ to $N_{14}$ are at the potential of the ground node GND. As a result, the delay units 71 to 74 do not operate. Therefore, the power consumption can be reduced.

If M1="0", M2="0", M3="0", and M4="1" or 1 bit of the 4 bits of the search data and one bit of the 4 bits of reference data do not match, $Dist0_4$="0", $EN1_4$="1", $EN1Q_4$="0", $Dist1_4$="1", $EN2_4$="0", $EN2Q_4$="1", $Dist2_4$="0", $EN3_4$="0", $EN3Q_4$="1", $Dist3_4$="0", $EN4_4$="0", $EN4Q_4$="1", and $Dist4_4$="0".

As a result, the transfer gates 51 and 81 are opened, and the transfer gates 52 to 54, 80, and 82 to 84 are closed. Then, the signal is passed through a delay path including the node $N_0$, the transfer gate 51, the delay unit 71, a transfer gate 81, and the inverter 91 in this order. More specifically, the signal is passed through a path with distance 1.

In this case, the N-type MOS transistors 62 to 64 are turned on in response to the signal $EN2Q_4=EN3Q_4=EN4Q_4$="1", and therefore the potentials of the nodes $N_{12}$ to $N_{14}$ are at the potential of the ground node GND. As a result, the delay units 72 to 74 do not operate. Therefore, the power consumption can be reduced.

Furthermore, if M1="0", M2="0", M3="1", and M4="1", or if 2 bits of the 4 bits of the search data and 2 bits of the 4 bits of the reference data do not match, $Dist0_4$="0", $EN1_4$="1", $EN1Q_4$="0", $Dist1_4$="0", $EN2_4$="1", $EN2Q_4$="0", $Dist2_4$="1", $EN3_4$="0", $EN3Q_4$="1", $Dist3_4$="0", $EN4_4$="0", $EN4Q_4$="1", and $Dist4_4$="0".

As a result, the transfer gates 51, 52, and 82 are opened, and the transfer gates 53, 54, 80, 81, 83, and 84 are closed. Then, a signal is passed through a delay path including the node $N_0$, the transfer gate 51, the delay unit 71, the transfer gate 52, the delay unit 72, the transfer gate 82, and the inverter 91 in this order. More specifically, the signal is passed through a path with distance 2.

In this case, the N-type MOS transistors 63 and 64 are turned on in response to the signal $EN3Q_4=EN4Q_4$="1" and therefore the potentials of the nodes $N_{13}$ and $N_{14}$ are at the potential of the ground node GND. As a result, the delay units 73 and 74 do not operate. Therefore, the power consumption can be reduced.

Furthermore, if M1="0", M2="1", M3="1", and M4="1", or if 3 bits of the 4 bits of the search data and 3 bits of the 4 bits of the reference data do not match, $Dist0_4$="0", $EN1_4$="1", $EN1Q_4$="0", $Dist1_4$="0", $EN2_4$="1", $EN2Q_4$="0", $Dist2_4$="0", $EN3_4$="1", $EN3Q_4$="0", $Dist3_4$="1", $EN4_4$="0", $EN4Q_4$="1", and $Dist4_4$="0".

As a result, the transfer gates 51 to 53 and 83 are opened and the transfer gates 54, 80 to 82, and 84 are closed. A signal is passed through a delay path including the node $N_0$, the transfer gate 51, the delay unit 71, the transfer gate 52, the delay unit 72, the transfer gate 53, the delay unit 73, the transfer gate 83, and the inverter 91 in this order. More specifically, the signal is passed through a path with distance 3.

In this case, the N-type MOS transistor 64 is turned on in response to $EN4Q_4$="1", so that the potential of the node $N_{14}$ is at the potential of the ground node GND. As a result, the delay unit 74 does not operate. Therefore, the power consumption can be reduced.

Furthermore, if M1="1", M2="1", M3="1", and M4="1", or if the 4 bits of the search data and the 4 bits of the reference data do not match, $Dist0_4$="0", $EN1_4$="1", $EN1Q_4$="0", $Dist1_4$="0", $EN2_4$="1", $EN2Q_4$="0", $Dist2_4$="0", $EN3_4$="1", $EN3Q_4$="0", $Dist3_4$="0", $EN4_4$="1", $EN4Q_4$="0", and $Dist4_4$="1".

As a result, the transfer gates 51 to 54 and 84 are opened, and the transfer gates 80 to 83 are closed. A signal is passed through a delay path including the node $N_0$, the transfer gate 51, the delay unit 71, the transfer gate 52, the delay unit 72, the transfer gate 53, the delay unit 73, the transfer gate 54, the delay unit 74, the transfer gate 84, and the inverter 91 in this order. More specifically, the signal passes through a path with distance 4.

If the distance signals M1 to M4 have a bit pattern other than the above, a signal passes through one of the paths with distance 0, distance 1, distance 2, distance 3, and distance 4 depending on whether it is four bit match, one bit mismatch, two bit mismatch, three bit mismatch or four bit mismatch as described above.

Note that the 4-bit stage 42-1 shown in FIG. 21 has the same configuration as that of the 4-bit stage 41-1 shown in FIG. 22.

The 4-bit path encoder $PE_{12}$-1 has the same configuration as that of the path encoder $PE_{11}$-1 shown in FIGS. 23 and 24.

Referring back to FIG. 21, if a distance signal M1M2M3M4 output from the unit comparator circuits $UC_{11}$ to $UC_{14}$ is "0000", a distance signal M1M2M3M4 output from the $UC_{15}$ to $UC_{18}$ are "0000", and a distance signals M1M2M3M4 output from the unit comparator circuits $UC_{21}$ to $UC_{24}$, $UC_{25}$ to $UC_{28}$, ..., and $UC_{R1}$ to $UC_{R4}$, ..., and $UC_{R5}$ to $UC_{R8}$ are other than "0000", a signal passes through the path with distance 0 in the 4-bit stage 41-1 and the 4-bit stage 42-1 in the distance/time conversion circuit $DT_1$ and the signal passes through a path other than the path with distance 0 in the 4-bit stage 41-1 and the 4-bit stage 42-1 in the distance/time conversion circuit $DT_2$ to $DT_R$.

As a result, an oscillation signal $S_1$ has the highest frequency and is output earliest from the distance/time conversion circuit $DT_1$ to the frequency divider circuit 20, and oscillation signals $S_2$ to $S_R$ have lower frequencies as the number of mismatched bits between search data and reference data increases and are output to the frequency divider circuit 20 from the distance/time conversion circuits $DT_2$ to $DT_R$ more delayed as the number of mismatched bits between search data and reference data increases.

In the frequency divider circuit 20, frequency dividers 211 to 21R frequency-divides the oscillation signals $S_1$ to $S_R$, respectively, and output the frequency-divided oscillation signals $S_{d1}$ to $S_{dR}$ to the time domain WTA circuit 30.

The time domain WTA circuit 30 receives the oscillation signals $S_{d1}$ to $S_{dR}$ from the frequency divider circuit 20. In the time domain WTA circuit 30, the inverter 301 receives the oscillation signal $S_{d1}$ earliest and inverts the received oscillation signal $S_{d1}$ for output to a delay circuit 311 and the Winner detection circuit 330, then, the inverters 302 to 30R invert the oscillation signals $S_{d2}$ to $S_{dR}$ in the order in which the signals are received for output to delay circuits 312 to 31R and the Winner detection circuit 330.

The delay circuit 311 receives the inverted signal $/S_{d1}$ of the oscillation signal $S_{d1}$ earliest and delays the received inverted signal $/S_{d1}$ by $\tau_R$ for output to a register 321. Then, the delay circuits 312 to 31R delay inverted signals $/S_{d2}$ to $/S_{dR}$ by $\tau_R$ for output to registers 322 to 32R in the order in which the inverted signals $/S_{d1}$ to $/S_{dR}$ are received.

On the other hand, the Winner detection circuit 330 detects change in the oscillation signal $S_{d1}$ earliest and produces a search end signal SE. The feedback circuit 350 produces R search end signals SE based on the search end signal SE received from the Winner detection circuit 330 and outputs the produced R search end signals SE to the registers 321 to 32R at a time.

Then, the register 321 receives the inverted signal $/S_{d1}$ from the delay circuit 311, outputs the inverted signal $/S_{d1}$ and then receives the search end signal SE from the feedback circuit 350, and the registers 322 to 32R receive the search end signal SE from the feedback circuit 350 before receiving the inverted signals $/S_{d2}$ to $/S_{dR}$ from the delay circuits 312 to 31R. As a result, the registers 321 to 32R output match signals $M_1$(=1), $M_2$(=0)=$M_3$(=0)=, ..., =$M_R$(=0), respectively.

In this way, reference data 1 (reference data stored in reference data storage cell circuits $SC_{11}$ to $SC_{18}$) that matches the search data is searched for.

As described above, in the associative memory 100, the difference in distance that represents the degree of how much search data matches reference data is converted into time difference and reference data that matches the search data is searched for.

The time difference can be set infinitely and therefore the Winner row and a Loser row can be distinguished correctly even if the transistors that form the associative memory 100 have varying characteristics. Therefore, search errors using the associative memory 100 can be reduced.

Figure 25:
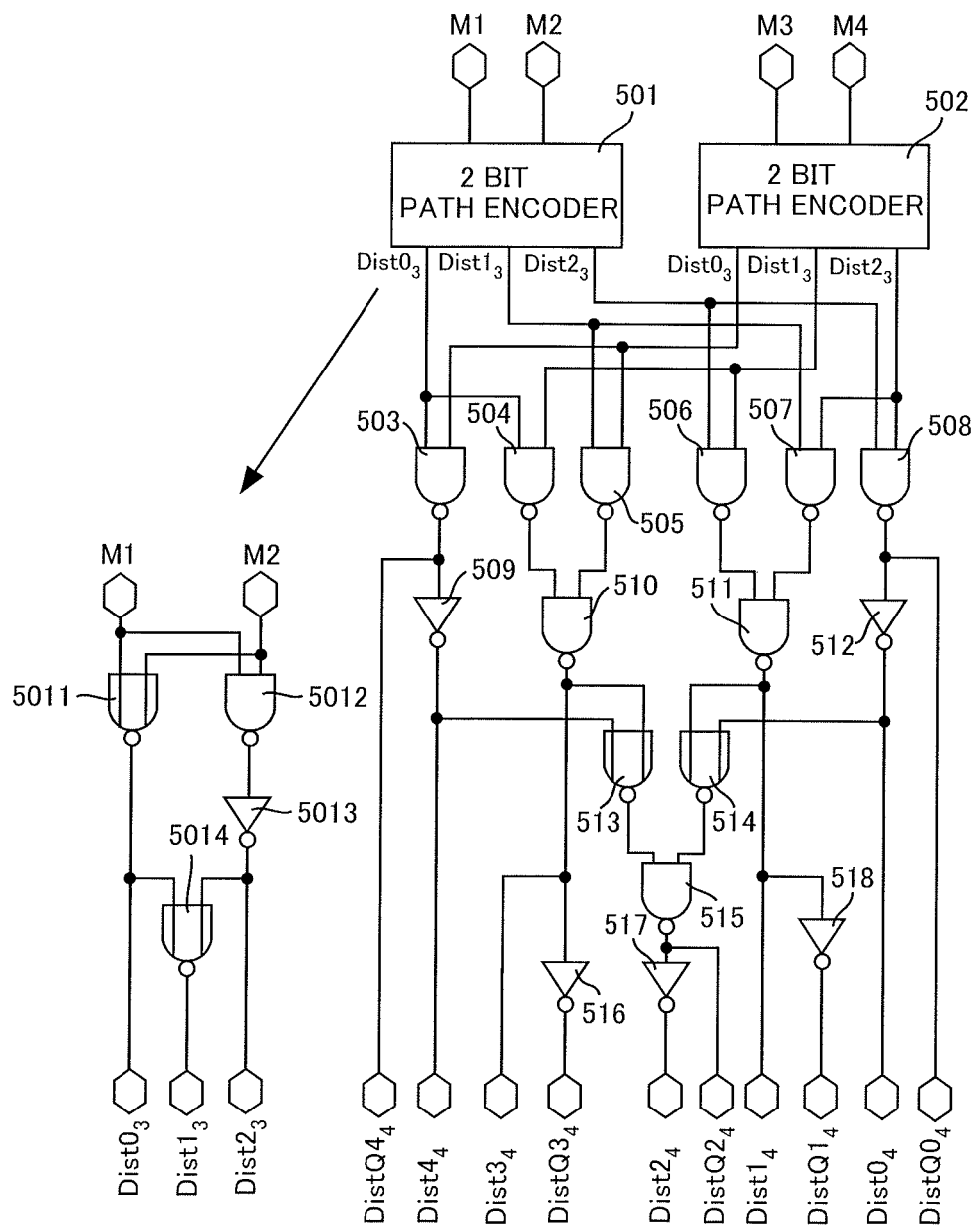
FIG. 25 is a circuit diagram of a conventional path encoder.

FIG. 25 is a circuit diagram of a conventional path encoder. Referring to FIG. 25, the conventional path encoder 500 includes 2-bit path encoders 501 and 502, NAND circuits 503 to 508, 510, 511, and 515, inverters 509, 512, 516 to 518, and NOR circuits 513 and 514. Note that the path encoder 500 is a 4 bit path encoder.

The 2-bit path encoder 501 produces signals $Dist0_3$ to $Dist2_3$ based on the distance signals M1 and M2. The 2-bit path encoder 502 produces the signals $Dist0_3$ to $Dist2_3$ based on the distance signals M3 and M4.

The NAND circuit 503 operates the logical product of the signal $Dist0_3$ output from the 2-bit path encoder 501 and the signal $Dist0_3$ output from the 2-bit path encoder 502, inverts the operated logical product, and outputs the inverted signal as $DistQ4_4$ and outputs the inverted signal to the inverter 509.

The NAND circuit 504 operates the logical product of the signal $Dist0_3$ output from the 2-bit path encoder 501 and the signal $Dist1_3$ output from the 2-bit path encoder 502 and inverts the operated logical product for output to the NAND circuit 510.

The NAND circuit 505 operates the logical product of the signal Dist1$_3$ output from the 2-bit path encoder 501 and the signal Dist0$_3$ output from the 2-bit path encoder 502 and inverts the operated logical product for output to the NAND circuit 510.

The NAND circuit 506 operates the logical product of the signal Dist2$_3$ output from the 2-bit path encoder 501 and the signal Dist1$_3$ output from the 2-bit path encoder 502 and inverts the operated logical product for output to the NAND circuit 511.

The NAND circuit 507 operates the logical product of the signal Dist1$_3$ output from the 2-bit path encoder 501 and the signal Dist2$_3$ output from the 2-bit path encoder 502 and inverts the operated logical product for output to the NAND circuit 511.

The NAND circuit 508 operates the logical product of the signal Dist2$_3$ output from the 2-bit path encoder 501 and the signal Dist2$_3$ output from the 2-bit path encoder 502, inverts the operated logical product and outputs the inverted signal as the signal Dist0$_4$ and outputs the inverted signal to the inverter 512.

The inverter 509 inverts the output signal of the NAND circuit 503 and outputs the inverted signal as a signal Dist4$_4$ and outputs the inverted signal to the NOR circuit 513.

The NAND circuit 510 operates the logical product of the output signal of the NAND circuit 504 and the output signal of the NAND circuit 505, inverts the operated logical product, and outputs the inverted signal as the signal Dist3$_4$ and outputs the inverted signal to the NOR circuit 513 and the inverter 516.

The NAND circuit 511 operates the logical product of the output signal of the NAND circuit 506 and the output signal of the NAND circuit 507, inverts the operated logical product, and outputs the inverted signal as the signal Dist1$_4$ and outputs the inverted signal to the NOR circuit 511 and the inverter 518.

The inverter 512 inverts the output signal of the NAND circuit 508 and outputs the inverted signal as the signal Dist0$_4$ and outputs the inverted signal to the NOR circuit 514.

The NOR circuit 513 operates the logical sum of the output signal of the inverter 509 and the output signal of the NAND circuit 510 and inverts the operated logical sum for output to the NAND circuit 515.

The NOR circuit 514 operates the logical sum of the output signal of the NAND circuit 511 and the output signal of the inverter 512 and inverts the operated logical sum for output to the NAND circuit 515.

The NAND circuit 515 operates the logical product of the output signal of the NOR circuit 513 and the output signal of the NOR circuit 514, inverts the operated logical product, and outputs the inverted signal as the signal DistQ2$_4$ and outputs the inverted signal to the inverter 517.

The inverter 516 inverts the output signal of the NAND circuit 510 and outputs the inverted signal as the signal DistQ3$_4$.

The inverter 517 inverts the output signal of the NAND circuit 515 and outputs the inverted signal as the signal Dist2$_4$.

The inverter 518 inverts the output signal of the NAND circuit 511 and outputs the inverted signal as the signal DistQ1$_4$.

The 2-bit path encoder 501 and 502 each include NOR circuits 5011 and 5014, a NAND circuit 5012, and an inverter 5013.

The NOR circuit 5011 operates the logical sum of distance signals M1 and M2, inverts the operated logical sum and outputs the inverted signal as the signal Dist0$_3$ and outputs the inverted signal to the NOR circuit 5014.

The NAND circuit 5012 operates the logical product of distance signals M1 and M2, and inverts the operated logical product for output to the inverter 5013.

The inverter 5013 inverts the output signal of the NAND circuit 5012 and outputs the inverted signal as the signal Dist2$_3$ and outputs the inverted signal to the NOR circuit 5014.

The NOR circuit 5014 operates the logical sum of the output signal of the NOR circuit 5011 and the output signal of the inverter 5013, inverts the operated logical sum and outputs the inverted signal as the signal Dist1$_3$.

Table 4 includes possible values for the signals Dist0$_4$ to Dist4$_4$ and DistQ0$_4$ to DistQ4$_4$ generated by the path encoder 500 when each of the distance signals M1 to M4 is either "0" or "1".

TABLE 4

| M1 | M2 | Dist0$_2$ | Dist1$_2$ | Dist2$_2$ | M3 | M4 | Dist0$_2$ | Dist1$_2$ | Dist2$_2$ | Dist0$_4$ | DistQ0$_4$ | Dist1$_4$ | DistQ1$_4$ | Dist2$_4$ |
|---|---|---|---|---|---|---|---|---|---|---|---|---|---|---|
| 0 | 0 | 1 | 0 | 0 | 0 | 0 | 1 | 0 | 0 | 1 | 0 | 0 | 1 | 0 |
|   |   |   |   |   | 0 | 1 | 0 | 1 | 0 | 0 | 1 | 1 | 0 | 0 |
|   |   |   |   |   | 1 | 0 | 0 | 1 | 0 | 0 | 1 | 1 | 0 | 0 |
|   |   |   |   |   | 1 | 1 | 0 | 0 | 1 | 0 | 1 | 0 | 1 | 1 |
| 0 | 1 | 0 | 1 | 0 | 0 | 0 | 1 | 0 | 0 | 0 | 1 | 1 | 0 | 0 |
|   |   |   |   |   | 0 | 1 | 0 | 1 | 0 | 0 | 1 | 0 | 1 | 1 |
|   |   |   |   |   | 1 | 0 | 0 | 1 | 0 | 0 | 1 | 0 | 1 | 1 |
|   |   |   |   |   | 1 | 1 | 0 | 0 | 1 | 0 | 1 | 0 | 1 | 0 |
| 1 | 0 | 0 | 1 | 0 | 0 | 0 | 1 | 0 | 0 | 0 | 1 | 1 | 0 | 0 |
|   |   |   |   |   | 0 | 1 | 0 | 1 | 0 | 0 | 1 | 0 | 1 | 1 |
|   |   |   |   |   | 1 | 0 | 0 | 1 | 0 | 0 | 1 | 0 | 1 | 1 |
|   |   |   |   |   | 1 | 1 | 0 | 0 | 1 | 0 | 1 | 0 | 1 | 0 |
| 1 | 1 | 0 | 0 | 1 | 0 | 0 | 1 | 0 | 0 | 0 | 1 | 0 | 1 | 1 |
|   |   |   |   |   | 0 | 1 | 0 | 1 | 0 | 0 | 1 | 0 | 1 | 0 |
|   |   |   |   |   | 1 | 0 | 0 | 1 | 0 | 0 | 1 | 0 | 1 | 0 |
|   |   |   |   |   | 1 | 1 | 0 | 0 | 1 | 0 | 1 | 0 | 1 | 0 |

| M1 | M2 | Dist0$_2$ | Dist1$_2$ | Dist2$_2$ | M3 | M4 | DistQ2$_4$ | Dist3$_4$ | DistQ3$_4$ | Dist4$_4$ | DistQ4$_4$ | Path |
|---|---|---|---|---|---|---|---|---|---|---|---|---|
| 0 | 0 | 1 | 0 | 0 | 0 | 0 | 1 | 0 | 1 | 0 | 1 | distance 0 |
|   |   |   |   |   | 0 | 1 | 1 | 0 | 1 | 0 | 1 | distance 1 |
|   |   |   |   |   | 1 | 0 | 1 | 0 | 1 | 0 | 1 | distance 1 |
|   |   |   |   |   | 1 | 1 | 0 | 0 | 1 | 0 | 1 | distance 2 |

TABLE 4-continued

| | | | | | | | | | | | | |
|---|---|---|---|---|---|---|---|---|---|---|---|---|
| 0 | 1 | 0 | 1 | 0 | 0 | 0 | 1 | 0 | 1 | 0 | 1 | distance 1 |
|   |   |   |   |   | 0 | 1 | 0 | 0 | 1 | 0 | 1 | distance 2 |
|   |   |   |   |   | 1 | 0 | 0 | 0 | 1 | 0 | 1 | distance 2 |
|   |   |   |   |   | 1 | 1 | 1 | 1 | 0 | 0 | 1 | distance 3 |
| 1 | 0 | 0 | 1 | 0 | 0 | 0 | 1 | 0 | 1 | 0 | 1 | distance 1 |
|   |   |   |   |   | 0 | 1 | 0 | 0 | 1 | 0 | 1 | distance 2 |
|   |   |   |   |   | 1 | 0 | 0 | 0 | 1 | 0 | 1 | distance 2 |
|   |   |   |   |   | 1 | 1 | 1 | 1 | 0 | 0 | 1 | distance 3 |
| 1 | 1 | 0 | 0 | 1 | 0 | 0 | 0 | 0 | 1 | 0 | 1 | distance 2 |
|   |   |   |   |   | 0 | 1 | 1 | 1 | 0 | 0 | 1 | distance 3 |
|   |   |   |   |   | 1 | 0 | 1 | 1 | 0 | 0 | 1 | distance 3 |
|   |   |   |   |   | 1 | 1 | 1 | 0 | 1 | 1 | 0 | distance 4 |

As can be seen from Table 4, the path encoder 500 produces signals $Dist0_4$ to $Dist4_4$ and $DistQ0_4$ to $DistQ4_4$ so that one of the paths with distance 0, distance 1, distance 2, distance 3, and distance 4 is selected depending on the bit values for the distance signals M1 to M4.

Note that the path encoder 500 produces the signals $Dist0_4$ to $Dist4_4$, and $DistQ0_4$ to $DistQ4_4$ to be output to a four bit stage produced by removing the transfer gates 51 to 54 and the N-type MOS transistors 61 to 64 from the 4-bit stage 41-1 shown in FIG. 22.

Therefore, if any of the paths with distance 0, distance 1, distance 2, distance 3, and distance 4 is selected based on the signals $Dist0_4$ to $Dist4_4$, and $DistQ0_4$ to $DistQ4_4$, all the delay units 71 to 74 are constantly in operation, so that the power consumption is significant.

In comparison, in the 4-bit stage 41-1, a delay unit (at least one of the delay units 71 to 74) that is not selected stops operating as described above, and therefore the power consumption can be reduced.

The path encoder 500 is formed by 98 transistors, while the 4-bit path encoders $PE_{11}$-1 and $PE_{12}$-1 are each formed by 70 transistors.

Therefore, the area occupied by the 4-bit path encoders $PE_{11}$-1 and $PE_{12}$-1 can be reduced.

Figure 26:
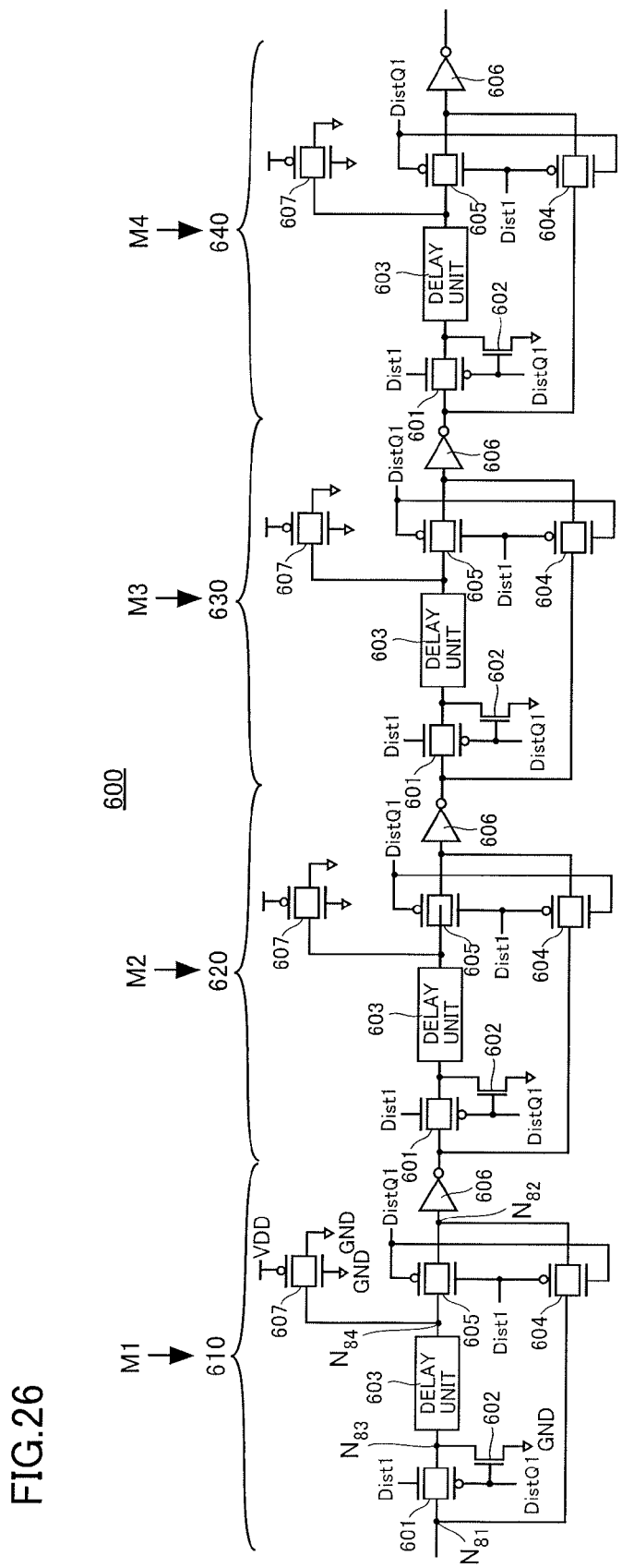
FIG. 26 is a circuit diagram of a conventional 4-bit stage.

FIG. 26 is a circuit diagram of a conventional 4-bit stage. Referring to FIG. 26, the conventional 4-bit stage 600 includes 1-bit stages 610, 620, 630, and 640.

The 1-bit stages 610, 620, 630, and 640 are connected in series. The 1-bit stages 610, 620, 630, and 640 each include transfer gates 601, 604, 605, and 607, an N-type MOS transistor 602, a delay unit 603, and an inverter 606.

The transfer gates 601, 604, 605, and 607 each include an N-type MOS transistor and a P-type MOS transistor connected in parallel.

The transfer gates 601, the delay unit 603, and the transfer gate 605 are connected in series between nodes $N_{81}$ and $N_{82}$. The delay unit 603 includes an even number of inverters connected in series, for example four inverters connected in series.

The N-type MOS transistor 602 is connected between the node $N_{83}$ and the ground node GND. The transfer gate 604 is connected between the nodes $N_{81}$ and $N_{82}$. The inverter 606 has its input terminal connected to the node $N_{82}$.

The transfer gate 607 is connected between a node $N_{84}$ and the ground node GND. The P-type MOS transistor of the transfer gate 607 has its gate terminal connected to the power supply node VDD and the N-type MOS transistor of the transfer gate 607 has its gate terminal connected to the ground node GND. Therefore, the transfer gate 607 is always closed.

The 1-bit stages 610, 620, 630, and 640 delay signals by delay paths determined based on the bit values for the distance signals M1 to M4. The 1-bit stage 610 delays a signal by a delay path including the node $N_{81}$, the transfer gate 604, and the inverter 606 in this order when the distance signal M1 is "0". The 1-bit stage 610 delays a signal by a delay path including the node N81, the transfer gate 601, the delay unit 603, the transfer gate 605, and the inverter 606 in this order when the distance signal M1 is "1".

The 1-bit stages 620, 630, and 640 delay signals in the same manner as the 1-bit stage 610 based on the bit values for the distance signals M2 to M4, respectively.

Figure 27:
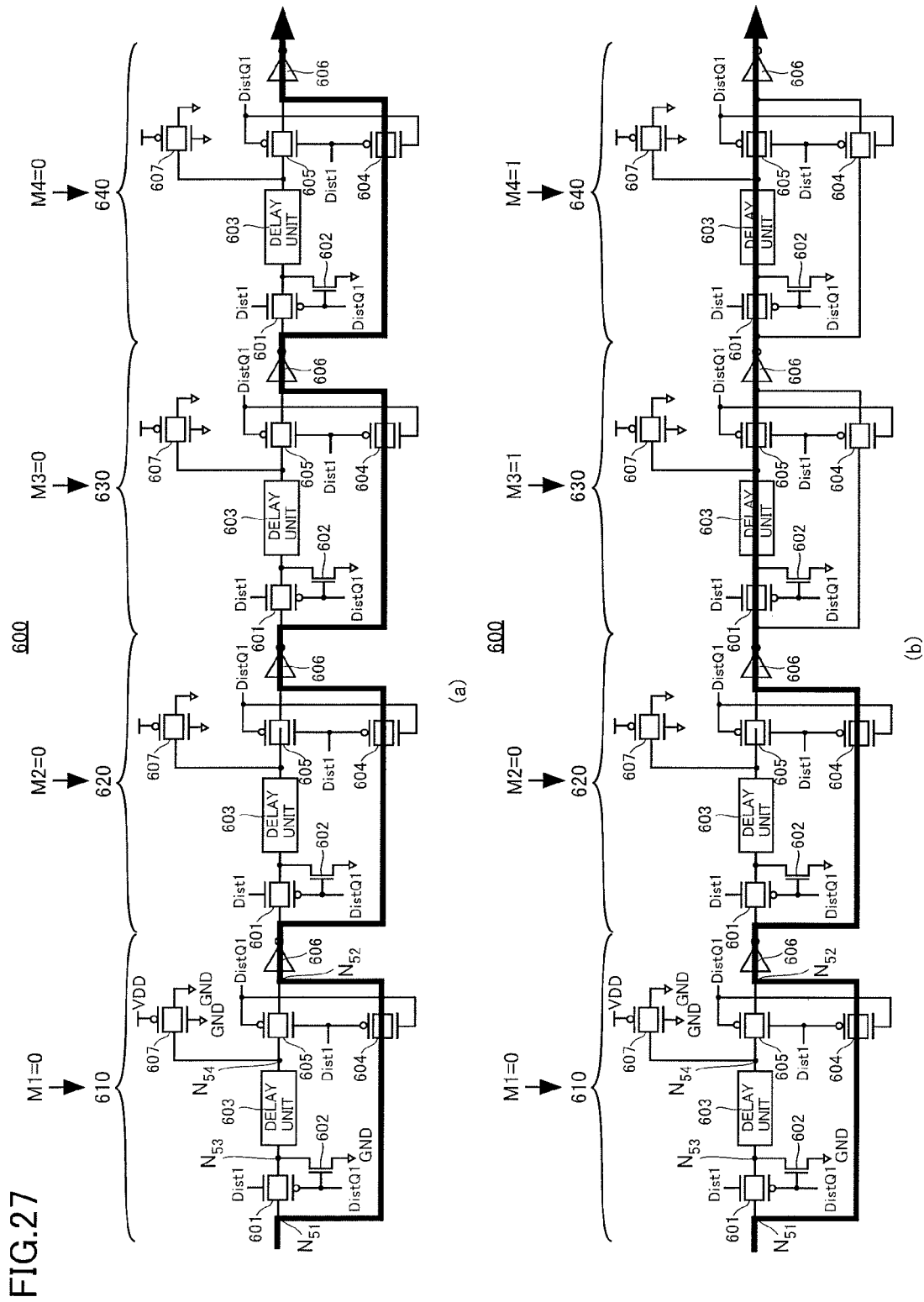
FIG. 27 is a diagram for illustrating the operation of the 4-bit stage shown in FIG. 26.

FIG. 27 is a diagram for illustrating the operation of the 4-bit stage 600 shown in FIG. 26. Referring to FIG. 27, when M1=M2=M3=M4="0", the 1-bit stages 610, 620, 630, and 640 each delay a signal by a delay path including the node $N_{81}$, the transfer gate 604, and the inverter 606 in this order.

As a result, the signal passes through the transfer gate 604 and the inverter 606 four times each, and therefore, the signal passes eight gates in total (see FIG. 27(a)).

On the other hand, the 4-bit stage 41-1 delays a signal by a delay path including a node $N_0$, a transfer gate 80, and an inverter 91 in this order when M1=M2=M3=M4="0".

As a result, the signal passes through the transfer gate 80 and the inverter 91 only once, and therefore, the signal passes two gates in total (see FIG. 22).

Therefore, using the 4-bit stage 41-1, the number of gates passed by a signal can be reduced to one fourth.

When M1=M2="0" and M3=M4="1", the 1-bit stages 610 and 620 each delay a signal by a delay path including the node $N_{81}$, the transfer gate 604, and the inverter 606 in this order, and the 1-bit stages 630 and 640 each delay a signal by a delay path including the node $N_{81}$, the transfer gate 601, the delay unit 603, the transfer gate 605, and the inverter 606 in this order.

As a result, the signal passes the transfer gate 604 and the inverter 606 twice each and the transfer gate 601, the delay unit 603, the transfer gate 605 and the inverter 606 twice each, and therefore, the signal passes 18 gates in total when the delay unit 603 includes four inverters connected in series (see FIG. 27(b)).

On the other hand, when M1=M2="0" and M3=M4="1", the 4-bit stage 41-1 delays a signal by a delay path including the node $N_0$, the transfer gate 51, the delay unit 71, the transfer gate 52, the delay unit 72, the transfer gate 82, and the inverter 91 in this order.

As a result, the signal passes only once through the transfer gate 51, the delay unit 71, the transfer gate 52, the delay unit 72, the transfer gate 82 and the inverter 91, and therefore, the signal passes through 12 gates in total when the delay units 71 and 72 each include four inverters connected in series (see FIG. 22).

Therefore, using the 4-bit stage 41-1, the number of gates passed by the signal can be reduced to two thirds.

By similar calculation, when one of the distance signals M1 to M4 is "1", a signal passes through 13 gates in the 4-bit stage 600 and 7 gates in the 4 bit stage 41-1.

When three of the distance signals M1 to M4 is "1", a signal passes through 23 gates in the 4-bit stage 600 and 17 gates in the 4-bit stage 41–1.

Furthermore, when all of the distance signals M1 to M4 are "1", a signal passes through 28 gates in the 4-bit stage 600 and 20 gates in the 4-bit stage 41–1.

Therefore, whichever bit pattern the 4-bit distance signal M1M2M3M4 has, the number of gates passed by a signal is smaller in the 4-bit stage 41–1 than in the 4-bit stage 600.

Since delay is generated as a signal passes through a transfer gate and an inverter, the time required for a signal to pass the distance/time conversion circuits $DT_1$ to $DT_R$ can be reduced by reducing the number of gates passed by the signal, and the search speed can be increased in the associative memory 100.

The increase in the search speed is also achieved when the N-bit stage 41 is used (see FIG. 3).

In this way, according to an embodiment of the present invention, the search speed can be improved by employing the N-bit stage 41 (see FIG. 3) including a stepwise arrangement of N delay units 71 to 7N and the path encoder $PE_{11}$ (see FIG. 5) that produces a selection signal used to select each delay path in the N bit stage 41 in response to the bit patterns of the distance signal M1 to MN.

In the above description, W=8 and N=4, and in this case, k=W/N=8/4=2 as described above.

On the other hand, when W is not divisible by N, for example when W=9 and N=4, k=W/N=9/4=2+1=3. As a result, the number of N-bit stages 41 to 4k is three in each of the distance/time conversion circuits $DT_1$ to $DT_R$, and the number of path encoders $PE_{11}$ to $PE_{1k}$ in each of the path encoders $PE_1$ to $PE_R$ is also three. The third path encoder $PE_{13}$ would otherwise receive only a 1-bit distance signal as an input but the path encoder $PE_{13}$ can produce a selection signal SL13 by expressing the 1-bit distance signal in a 4-bit form as M1M2M3M4, so that an N bit stage 43 can delay a signal using a delay path selected based on the selection signal SL13.

Therefore, k is an integer that satisfies k=W/N or k=(W/N)+1 as described above.

When the bit number of search data and reference data is other than 8 and each of the N-bit stages 41 to 4k shown in FIG. 2 is other than a 4-bit stage, the associative memory 100 shown in FIG. 1 searches for reference data that matches the search data by the above-described operation.

The distance/time conversion circuits $DT_1$ to $DT_R$ each include k N-bit stages 41 to 4k connected in a ring shape, and the k N-bit stages 41 to 4k each include a delay circuit that inverts an input signal by an odd number of times for output. As a result, the distance/time conversion circuits $DT_1$ to $DT_R$ each include an oscillation circuit that outputs an oscillation signal. Therefore, the distance/time conversion circuits $DT_1$ to $DT_R$ are provided corresponding to R distance signals and form "R conversion circuits" each including an oscillation circuit having k delay circuits connected in a ring shape.

The path encoders $PE_1$ to $PE_R$ each include k path encoders $PE_{11}$ to $PE_{1k}$ and produce k selection signals SL11 to SL1k used to select k delay paths in the k N-bit stages 41 to 4k based on a W-bit distance signal, and output the produced k selection signal SL11 to SL1k to the k N-bit stages 41 to 41k, respectively. Therefore, the path encoders $PE_1$ to $PE_R$ are provided corresponding to R distance signals and R distance/time conversion circuits $DT_1$ to $DT_R$ and form "R selection circuits" each including k path encoders $PE_{11}$ to $PE_{1k}$. The path encoders $PE_1$ to $PE_R$ each produce, based on the W-bit distance signal, k selection signals SL11 to SL1k used to select one delay path from N+1 delay paths in each of the k N-bit stages 41 to 4k so that delay time in the k delay circuits in the k N-bit stages 41 to 4k is shorter as the distance represented by the W-bit distance signal is smaller, and delay time in the k delay circuits in the k N-bit stages 41 to 4k is longer as the distance represented by the W-bit distance stage is larger. The path encoders output the produced k selection signals SL11 to SL1k to a corresponding distance/time conversion circuit (one of the distance/time conversion circuits $DT_1$ to $DT_R$).

Furthermore, the k path encoders $PE_{11}$ to $PE_{1k}$ select delay paths in the k N-bit stages 41 to 4k based on the selection signals SL11 to SL1k, respectively and therefore form "k path selection circuits."

Furthermore, the k N-bit stages 41 to 4k delay a signal using delay circuits selected by the selection signals SL11 to SL1k, respectively and therefore form "k delay circuits."

The associative memory 100 according to the first embodiment may be removed of the frequency divider circuit 20. This is because the time domain WTA circuit 30 can detect the Winner row based on the oscillation signals $S_1$ to $S_R$ without the frequency divider circuit 20.

Second Embodiment

Figure 28:
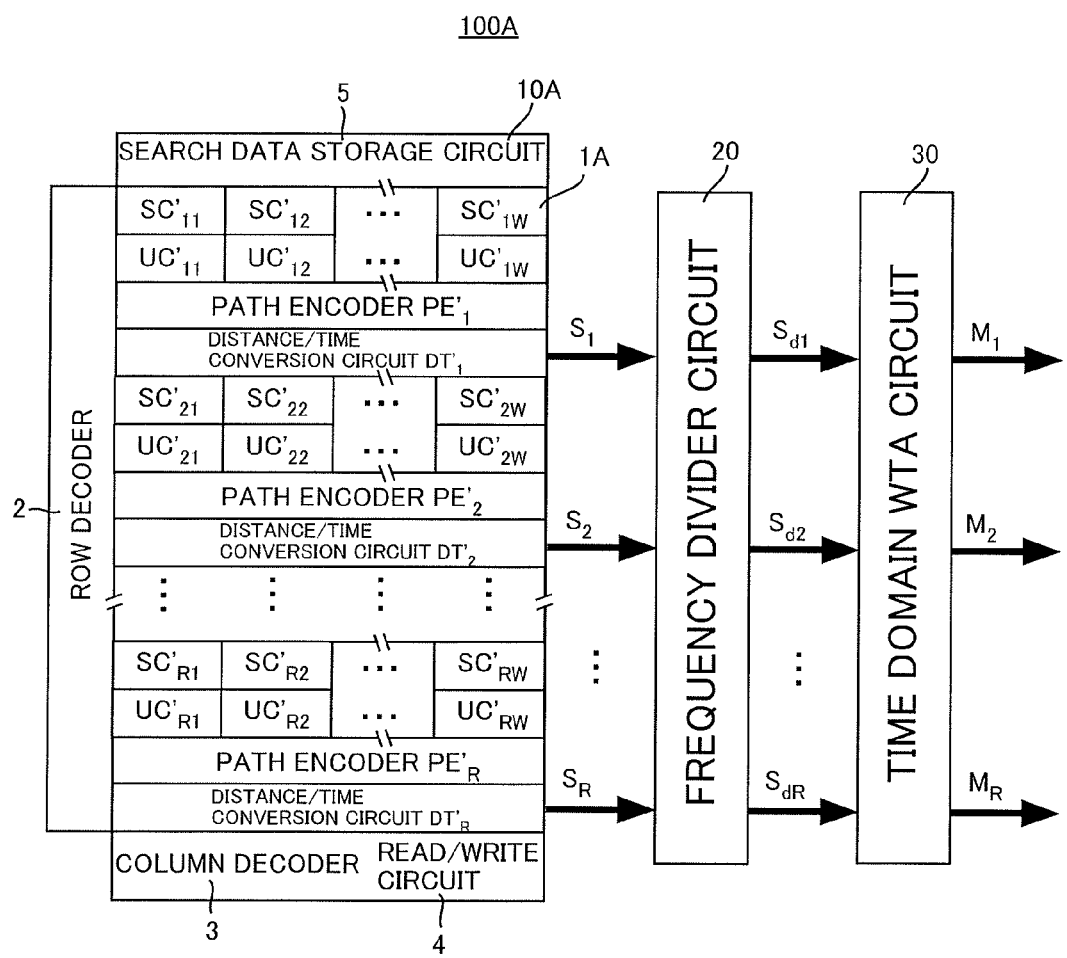
FIG. 28 is a schematic block diagram of an associative memory according to a second embodiment of the invention.

FIG. 28 is a schematic block diagram of an associative memory according to a second embodiment of the invention. Referring to FIG. 28, the associative memory 100A according to the second embodiment includes a memory array unit 10A instead of the memory array unit 10 in the associative memory 100 shown in FIG. 1 and the other parts are the same as those of the associative memory 100.

The memory array unit 10A includes a memory portion 1A instead of the memory portion 1 in the memory array unit 10 shown in FIG. 1 and the other part is the same as that of the memory array unit 10.

The memory portion 1A includes reference data storage cell circuits $SC'_{11}$ to $SC'_{1W}$, $SC'_{21}$ to $SC'_{2W}$, ..., and $SC'_{R1}$ to $SC'_{RW}$, unit comparator (UC) circuits $UC'_{11}$ to $UC'_{1W}$, $UC'_{21}$ to $UC'_{2W}$, ..., and $UC'_{R1}$ to $UC'_{RW}$, path encoders $PE'_1$ to $PE'_R$, and distance/time conversion circuits $DT'_1$ to $DT'_R$.

The unit comparator circuits $UC'_{11}$ to $UC'_{1W}$ are provided corresponding to the reference data storage cell circuits $SC'_{11}$ to $SC'_{1W}$, respectively. The unit comparator circuits $UC'_{21}$ to $UC'_{2W}$ are provided corresponding to the reference data storage cell circuits $SC'_{21}$ to $SC'_{2W}$, respectively. Thereafter, in the same manner, the unit comparator circuits $UC'_{R1}$ to $UC'_{RW}$ are provided corresponding to the reference data storage cell circuits $SC'_{R1}$ to $SC'_{RW}$, respectively.

The path encoder $PE'_1$ is provided corresponding to the reference data storage cell circuits $SC'_{11}$ to $SC'_{RW}$ and the unit comparator circuits $UC'_{11}$ to $UC'_{1W}$. The path encoder $PE'_2$ is provided corresponding to the reference data storage cell circuits $SC'_{21}$ to $SC'_{2W}$ and the unit comparator circuits $UC'_{21}$ to $UC'_{2W}$. Thereafter, in the same manner, the path encoder $PE'_R$ is provided corresponding to the reference data storage cell circuits $SC'_{R1}$ to $SC'_{RW}$ and the unit comparator circuits $UC'_{R1}$ to $UC'_{RW}$.

The distance/time conversion circuit $DT'_1$ is provided corresponding to the path encoder $PE'_1$ and the distance/time conversion circuit $DT'_2$ is provided corresponding to the path encoder $PE'_2$. Thereafter, in the same manner, the distance/time conversion circuit $DT'_R$ is provided corresponding to the path encoder $PE'_R$.

The reference data storage cell circuits $SC'_{11}$ to $SC'_{1W}$, $SC'_{21}$ to $SC'_{2W}$, ..., and $SC'_{R1}$ to $SC'_{RW}$ store reference data written by the row decoder 2, the column decoder 3 and the read/write circuit 4. In this way, the reference data storage cell circuits $SC'_{11}$ to $SC'_{1W}$ each store one reference data piece and the reference data storage cell circuits $SC'_{21}$ to $SC'_{2W}$ each store one reference data piece, and thereafter in the same manner, the reference data storage cell circuit $SC'_{R1}$ to $SC'_{RW}$ each store one reference data piece. Reference data stored by each of the reference data storage cell circuits $SC'_{11}$ to $SC'_{1W}$, $SC'_{21}$ to $SC'_{2W}$, ..., and $SC'_{R1}$ to $SC'_{RW}$ consists of K (K: an integer not less than 2) bits. Note that according to the second embodiment, the search data storage circuit 5 stores K-bit search data.

The unit comparator circuits $UC'_{11}$, to $UC'_{1W}$ compare the W reference data pieces stored in the reference data storage cell circuits $SC'_{11}$ to $SC'_{1W}$ and search data stored in the search data storage circuit 5. The unit comparator circuits $UC'_{21}$ to $UC'_{2W}$ compare the W reference data pieces stored in the reference data storage cell circuits $SC'_{21}$ to $SC'_{2W}$ and the search data stored in the search data storage circuit 5. Thereafter, in the same manner, the unit comparator circuits $UC'_{R1}$ to $UC'_{RW}$ compare the W reference data pieces stored in the reference data storage cell circuits $SC'_{R1}$ to $SC'_{RW}$ and the search data stored in the search data storage circuit 5. Comparison between the reference data and the search data is carried out in parallel among the unit comparator circuits $UC'_{11}$ to $UC'_{1W}$, the unit comparator circuits $UC'_{21}$ to $UC'_{2W}$, ..., and the unit comparator circuits $UC'_{R1}$ to $UC'_{RW}$.

The unit comparator circuits $UC'_{11}$ to $UC'_{1W}$ output a result of comparison between the W reference data pieces and the search data as W distance signals (each of which consists of K bits) to the path encoder $PE'_1$, the unit comparator circuits $UC'_{21}$ to $UC'_{1W}$ output a result of comparison between the W reference data pieces and the search data as W distance signals (each of which consists of K bits) to the path encoder $PE'_2$, and thereafter, in the same manner, the unit comparator circuits $UC'_{R1}$ to $UC'_{RW}$ output a result of comparison between the W reference data piece and the search data as W distance signals (each of which consists of K bits) to the path encoder $PE'_R$.

Note that comparison between reference data and search data by the unit comparator circuits $UC'_{11}$ to $UC'_{1W}$, $UC'_{21}$ to $UC'_{2W}$, ..., and $UC'_{R1}$ to $UC'_{RW}$ is carried out using Manhattan distance.

More specifically, the unit comparator circuits $UC'_{11}$ to $UC'_{1W}$, $UC'_{21}$ to $UC'_{2W}$, ..., and $UC'_{R1}$ to $UC'_{RW}$ use the following expression to carry out comparison between search data and reference data.

$$D_m = \sum_{j=1}^{W} |A_j - B_j| \quad (2)$$

In Expression (2), $D_m$ represents a Manhattan distance, $A_j$ represents reference data, and $B_j$ represents search data. $A_j$ and $B_j$ each consist of K bits.

The path encoder $PE'_1$ receives a K×W-bit distance signal from the unit comparator circuits $UC'_{11}$ to $UC'_{1W}$, produces a selection signal used to select a delay path in the distance/time conversion circuit $DT'_1$ based on the received K×W-bit distance signal according to a method that will be described and outputs the produced selection signal to the distance/time conversion circuit $DT'_1$. The path encoder $PE'_2$ receives a K×W-bit distance signal from the unit comparator circuits $UC'_{21}$ to $UC'_{2W}$, produces a selection signal used to select a delay path in the distance/time conversion circuit $DT'_2$ based on the received K×W-bit distance signal according to the method that will be described and outputs the produced signal to the distance/time conversion circuit $DT'_2$. Thereafter, in the same manner, the path encoder $PE'_R$ receives a K×W-bit distance signal from the unit comparator circuits $UC'_{R1}$ to $UC'_{RW}$, produces a selection signal used to select a delay path in the distance/time conversion circuit $DT'_R$ based on the received K×W-bit distance signal according to the method that will be described and outputs the produced selection signal to the distance/time conversion circuit $DT'_R$.

The distance/time conversion circuit $DT'_1$ receives the selection signal from the path encoder $PE'_1$, produces an oscillation signal $S_1$ delayed by a delay amount for the delay path selected based on the received selection signal, and outputs the produced oscillation signal $S_1$ to a frequency divider circuit 20. The distance/time conversion circuit $DT'_2$ receives the selection signal from the path encoder $PE'_2$, produces an oscillation signal $S_2$ delayed by a delay amount for the delay path selected based on the received selection signal, and outputs the produced oscillation signal $S_2$ to the frequency divider circuit 20. Thereafter, in the same manner, the distance/time conversion circuit $DT'_R$ receives the selection signal from the path encoder $PE'_R$, produces an oscillation signal $S_R$ delayed by a delay amount for the delay path selected based on the received selection signal, and outputs the produced oscillation signal $S_R$ to the frequency divider circuit 20.

Therefore, the memory portion 1A carries out comparison between each of the plurality of reference data pieces and the search data in parallel, produces the plurality of oscillation signals $S_1$ to $S_R$ representing the results of comparison and outputs the oscillation signals $S_1$ to $S_R$ to the frequency divider circuit 20.

Figure 29:
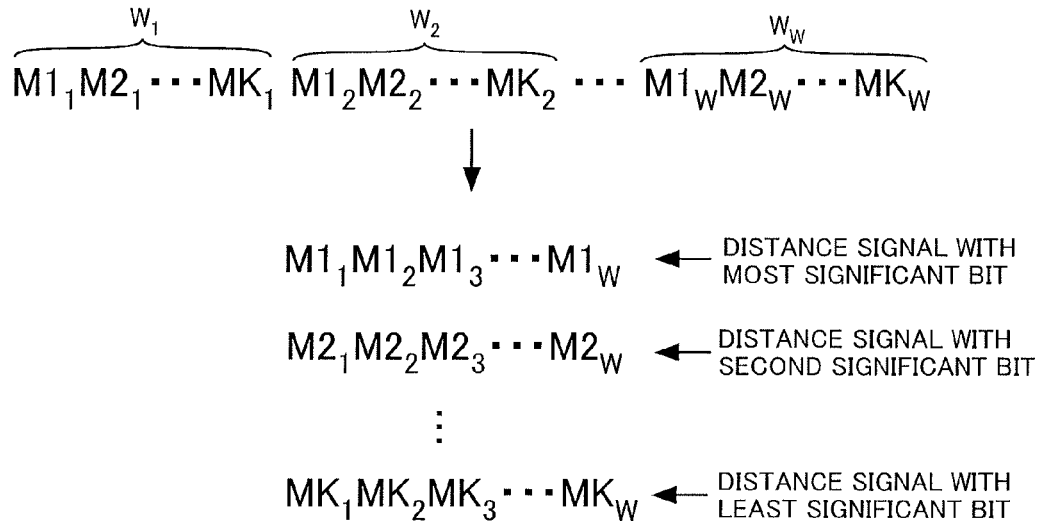
FIG. 29 is a diagram for illustrating the path encoder shown in FIG. 28.

FIG. 29 is a diagram for illustrating the operation in the path encoder $PE'_1$ shown in FIG. 28. Referring to FIG. 29, the path encoder $PE'_1$ receives a distance signal $M1_1 M2_1 \ldots MK_1 M1_2 M2_2 \ldots MK_2 \ldots M1_W M2_W \ldots MK_W$ from the unit comparator circuits $UC'_{11}$ to $UC'_{1W}$. Here, $M1_1 M2_1 \ldots MK_1$ is a distance signal representing the distance between reference data $W_1$ and search data, $M1_2 M2_2 \ldots MK_2$ is a distance signal representing the distance between reference data $W_2$ and the search data, and thereafter, in the same manner, $M1_W M2_W \ldots MK_W$ is a distance signal that represents the distance between reference data $W_w$ and the search data.

The path encoder $PE'_1$ receives a distance signal $M1_1 M2_1 \ldots MK_1 M1_2 M2_2 \ldots MK_2 \ldots M1_W M2_W \ldots MK_W$ and produces distance signals $M1_1 M1_2 \ldots M1_W$, $M2_1 M2_2 \ldots M2_W$, ..., and $MK_1 MK_2 \ldots MK_W$ based on the received distance signal $M1_1 M2_1 \ldots MK_1 M1_2 M2_2 \ldots MK_2 \ldots M1_W M2_W \ldots MK_W$. Here, $M1_1 M1_2 \ldots M1_W$ consists of a W-bit bit value and is a distance signal that expresses the distance between the most significant bits of the W reference data pieces and the search data. $M2_1 M2_2 \ldots M2_W$ consists of a W-bit bit value and is a distance signal that represents the distance between the second significant bits of the W reference data pieces and the search data. Thereafter, in the same manner, $MK_1 MK_2 \ldots MK_W$ consists of a W-bit bit value and is a distance signal that represents the distance between the least significant bits of the W reference data pieces and the search data.

Note that the $PE'_2$ to $PE'_R$ shown in FIG. 28 each produce K W-bit distance signals similarly to the path encoder $PE'_1$.

Figure 30:
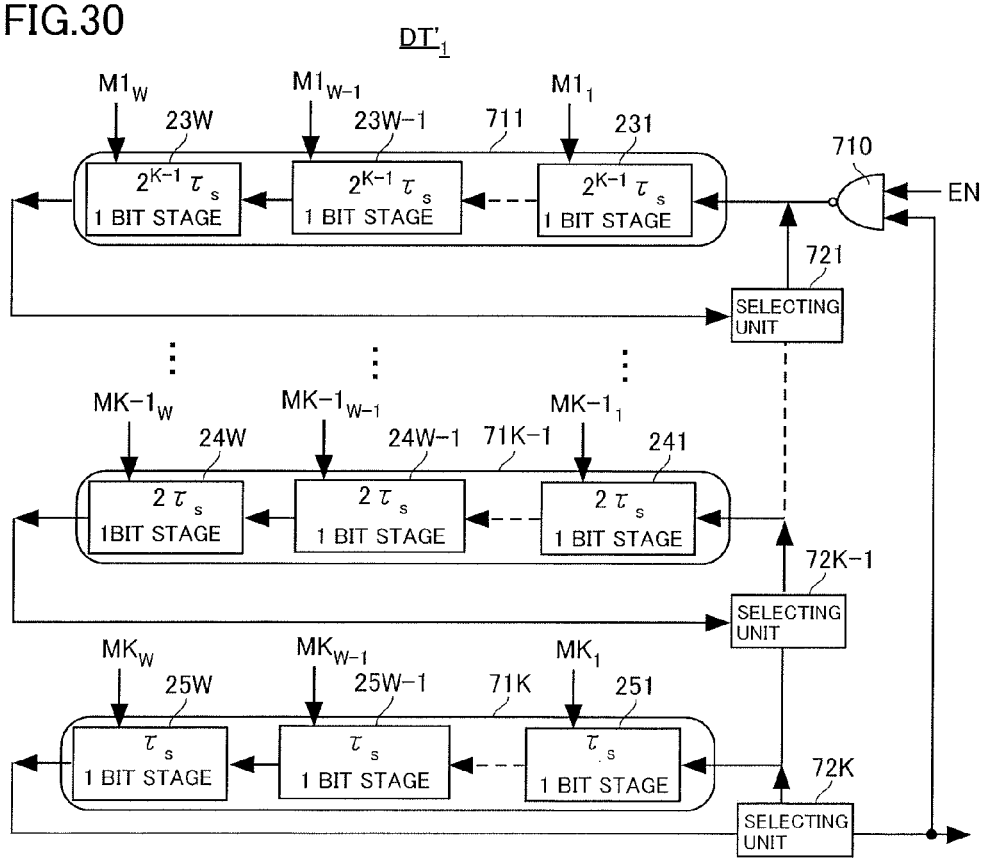
FIG. 30 is a block diagram of the configuration of the distance/time conversion circuit shown in FIG. 28.

FIG. 30 is a block diagram of the configuration of the distance/time conversion circuit $DT'_1$ shown in FIG. 28. Referring to FIG. 30, the distance/time conversion circuit $DT'_1$ includes a NAND circuit 710, oscillation circuits 711 to 71K and selecting units 721 to 72K.

The NAND circuit 710 operates the logical product of an enable signal EN and the output signal of the oscillation circuit 71K and inverts the operated logical product for output to the oscillation circuit 711.

The oscillation circuit 711 is provided corresponding to the most significant bits of the reference data and the search data. The oscillation circuit 711 receives the W-bit distance signal $M1_1 \ldots M1_{W-1}M1_W$ representing the distance between the most significant bits of the reference data and search data from the path encoder $PE'_1$ and produces an oscillation signal delayed by delay time based on a distance expressed by the received W-bit distance signal $M1_1 \ldots M1_{W-1}M1_W$ for output to the selecting unit 721.

Thereafter, in the same manner, the oscillation circuit 71K−1 is provided corresponding to the K−1-th bits of the reference data and the search data. The oscillation circuit 71K−1 receives a W-bit distance signal $MK-1_1 \ldots MK-1_{W-1}MK-1_W$ that expresses the distance between the K−1-th bits of the reference data and search data from the path encoder $PE'_1$ and produces an oscillation signal delayed by delay time based on the distance represented by the received W-bit distance signal $MK-1_1 \ldots MK-1_{W-1}MK-1_W$ for output to the selecting unit 72K−1. The oscillation circuit 71K is provided corresponding to the least significant bits of the reference data and the search data. The oscillation circuit 71K receives a W-bit distance signal $MK_1 \ldots MK_{W-1}MK_W$ that expresses the distance between the least significant bits of the reference data and the search data from the path encoder $PE'_1$ and produces an oscillation signal delayed by delay time based on the distance expressed by the received W-bit distance signal $MK_1 \ldots MK_{W-1}MK_W$. The oscillation circuit 71K outputs the produced oscillation signal to the selecting unit 72K.

The selecting unit 721 outputs the oscillation signal output from the oscillation circuit 711 to the oscillation circuit 711 and to an oscillation circuit 712 (not shown) when the oscillation signal has been output to the oscillation circuit 711 a desired number of times.

Thereafter, in the same manner, the selecting unit 72K−1 outputs an oscillation signal output from the oscillation circuit 71K−1 to the oscillation circuit 71K−1 and to the oscillation circuit 71K when the oscillation signal has been output to the oscillation circuit 71K−1 a desired number of times. The selecting unit 72K outputs an oscillation signal output from the oscillation circuit 71K to the oscillation circuit 71K and to the frequency divider circuit 20 and the NAND circuit 710 as an oscillation signal $S_1$ when the oscillation signal has been output to the oscillation circuit 71K a desired number of times.

The oscillation circuit 711 includes 1-bit stages 231 and 23W. The 1-bit stages 231 to 23W are connected in a ring shape through the selecting unit 721. The 1-bit stages 231 to 23W each have the same configuration as that of the 1-bit stage 610 shown in FIG. 26. In this case, in each of the 1-bit stages 231 to 23W, a delay unit 603 includes an even number of inverters connected in series and delay time by the delay unit 603 is $2^{K-1}\tau_s$.

The 1-bit stages 231 to 23W receive distance signals $M1_1$ to $M1_W$, respectively from the path encoder $PE'_1$ and delay a signal through a delay path (including $N_{S1}$, the transfer gate 604, and the inverter 606 in this order or $N_{S1}$, the transfer gate 601, the delay unit 603, the transfer gate 605, and the inverter 606 in this order) selected based on the received distance signals $M1_1$ to $M1_W$. In this case, the 1-bit stages 231 to 23W each delay a signal through the delay path including $N_{S1}$, the transfer gate 604, and the inverter 606 in this order when the distance signal received from the path encoder $PE'_1$ (any of $M1_1$ to $M1_W$) is "0" and through the delay path including $N_{S1}$, the transfer gate 601, the delay unit 603, the transfer gate 605, and the inverter 606 in this order when the distance signal (any of $M1_1$ to $M1_W$) received from the path encoder $PE'_1$ is "1".

The oscillation circuit 71K−1 includes 1-bit stages 241 to 24W. The 1-bit stages 241 to 24W are connected in a ring shape through the selecting unit 72K−1. The 1-bit stages 241 to 24W each have the same configuration as that of the 1-bit stage 610 shown in FIG. 26. In this case, in each of the 1-bit stages 241 to 24W, the delay unit 603 includes an even number of inverters connected in series and delay time by the delay unit 603 is $2\tau_s$.

The 1-bit stages 241 to 24W receive distance signals $MK-1_1$ to $MK-1_W$ from the path encoder $PE'_1$ and delay a signal through a delay path (including $N_{S1}$, the transfer gate 604, and an inverter 606 in this order or $N_{S1}$, the transfer gate 601, the delay unit 603, the transfer gate 605, and the inverter 606 in this order) selected based on the received distance signals $MK-1_1$ to $MK-1_W$. In this case, the 1-bit stages 241 to 24W each delay a signal through the delay path including $N_{S1}$, the transfer gate 604, and the inverter 606 in this order if the distance signal received from the path encoder $PE'_1$ (any of $MK-1_1$ to $MK-1_W$) is "0" and through a delay path including $N_{S1}$, the transfer gate 601, the delay unit 603, the transfer gate 605, and the inverter 606 in this order when the distance signal received from the path encoder $PE'_1$ (any of $MK-1_1$ to $MK-1_W$) is "1".

The oscillation circuit 71K includes 1-bit stages 251 to 25W. The 1-bit stages 251 to 25W are connected in a ring shape through the selecting unit 72K. The 1-bit stages 251 to 25W each have the same configuration as that of the 1-bit stage 610 shown in FIG. 26. In this case, in each of the 1-bit stages 251 to 25W, the delay unit 603 includes an even number of inverters connected in series and delay time by the delay unit 603 is $\tau_s$.

The 1-bit stages 251 to 25W receive distance signals $MK_1$ to $MK_W$ from the path encoder $PE'_1$ and delay a signal through a delay path (including $N_{S1}$, the transfer gate 604, and the inverter 606 or $N_{S1}$, the transfer gate 601, the delay unit 603, the transfer gate 605, and the inverter 606 in this order) selected based on the received distance signals $MK_1$ to $MK_W$. In this case, the 1-bit stages 251 to 25W each delay a signal through a delay path including $N_{S1}$, the transfer gate 604, and the inverter 606 in this order when the distance signal received from the path encoder $PE'_1$ (any of $MK_1$ to $MK_W$) is "0" and through a delay path including $N_{S1}$, the transfer gate 601, the delay unit 603, the transfer gate 605, and the inverter 606 in this order when the distance signal received from the path encoder $PE'_1$ (any of $MK_1$ to $MK_W$) is "1".

In this way, K oscillation circuits 711 to 71K are connected in series through the selecting units 721 to 72K−1. The oscillation circuits 711 to 71K oscillate oscillation signals delayed by delay time based on distances expressed by distance signals between the most significant bits of reference data and search data, the second significant bits of reference data and search data, . . . , and the least significant bits of reference data and search data.

The oscillation circuit 711 receives the enable signal EN through the NAND circuit 710 and K oscillation circuits 711 to 71K are connected in series through the selecting units 721 to 72K−1, so that in the distance/time conversion circuit $DT'_1$, the distance signal for the most significant bits of reference data and search data is converted into an oscillation signal first, then the distance signal for the second significant bits of the reference data and the search data is converted into an oscillation signal, and finally the distance signal for the least significant bits of the reference data and the search data is converted into an oscillation signal.

More specifically, in each of R rows in the associative memory 100A, it is determined whether each of W reference data pieces matches search data in the order from the most significant bits of the W reference data pieces to the least significant bits.

In this way, in the order from the most significant bits to the least significant bits, each of the W reference data pieces is searched to find if each of them matches the search data because the most significant bits of the reference data and the search data have the greatest significance.

Note that the distance/time conversion circuits $DT'_2$ to $DT'_R$ shown in FIG. 28 each have the same configuration as that of the distance/time conversion circuit $DT'_1$ shown in FIG. 30.

Operation in the associative memory 100A will be described. The unit comparator circuits $UC'_{11}$ to $UC'_{1W}$ output a distance signal $M1_1M2_1 \ldots MK_1M1_2M2_2 \ldots MK_2 \ldots M1_WM2_W \ldots MK_W$ between W reference data pieces and search data to the path encoder $PE'_1$. The unit comparator circuits $UC'_{21}$ to $UC'_{2W}$, $UC'_{R1}$ to $UC'_{RW}$ similarly output a distance signal $M1_1M2_1 \ldots MK_1M1_2M2_2 \ldots MK_2 \ldots M1_WM2_W \ldots MK_W$ to the path encoders $PE'_2$ to $PE'_R$, respectively.

The path encoder $PE'_1$ produces distance signals $M1_1M1_2 \ldots M1_W, M2_1M2_2 \ldots M2_W, \ldots,$ and $MK_1MK_2 \ldots MK_W$ based on the distance signal $M1_1M2_1 \ldots MK_1M1_2M2_2 \ldots MK_2 \ldots M1_WM2_W \ldots MK_W$. The path encoder $PE'_1$ outputs a distance signal $M1_1M1_2 \ldots M1_W$ to the oscillation circuit 711 of the distance/time conversion circuit $DT'_1$, and thereafter in the same manner, the path encoder $PE'_1$ outputs a distance signal $MK-1_1MK-1_2 \ldots MK-1_W$ to the oscillation circuit 71K-1 of the distance/time conversion circuit $DT'_1$ and outputs a distance signal $MK_1MK_2 \ldots MK_W$ to the oscillation circuit 71K of the distance/time conversion circuit $DT'_1$. The path encoders $PE'_2$ to $PE'_R$ operate in the same manner.

In the distance/time conversion circuit $DT'_1$, the oscillation circuit 711 oscillates an oscillation signal using a delay path selected by the distance signal $M1_1M1_2 \ldots M1_W$ first, then oscillates an oscillation signal using a delay path selected by the distance signal $M2_1M2_2 \ldots M2_W$, and thereafter, in the same manner, the oscillation circuit 71K finally oscillates an oscillation signal using a delay path selected by the distance signal $MK_1MK_2 \ldots MK_W$. The distance/time conversion circuit $DT'_1$ outputs an oscillation signal $S_1$ to the frequency conversion circuit 20.

The distance/time conversion circuits $DT'_2$ to $DT'_R$ similarly oscillate oscillation signals $S_2$ to $S_R$, respectively, and output the oscillation signals $S_2$ to $S_R$ to the frequency divider circuit 20.

Then, the frequency divider circuit 20 frequency-divides the oscillation signals $S_1$ to $S_R$ by a desired number by the above-described method and outputs the frequency-divided oscillation signals $S_{d1}$ to $S_{dR}$ to the time domain WTA circuit 30. The time domain WTA circuit 30 detects the earliest changing oscillation signal (one of the oscillation signals $S_{d1}$ to $S_{dR}$) and outputs match signals $M_1$ to $M_R$.

In each of the R rows of the associative memory 100A, when the most significant bits of W reference data pieces and search data do not match, a delay path including $N_{51}$, the transfer gate 601, the delay unit 603, the transfer gate 605, and the inverter 606 in this order is selected in each of the 1-bit stages 231 to 23W in the oscillation circuit 711, so that the oscillation circuit 711 outputs an oscillation signal in the most delayed timing, and when the most significant bits of the W reference data pieces and the search data match, a delay path including $N_{51}$, the transfer gate 604, and the inverter 606 in this order is selected in each of the 1-bit stages 231 to 23W of the oscillation circuit 711, so that the oscillation circuit 711 outputs an oscillation signal in the earliest timing. The oscillation circuits 712 to 71K operate in the same manner.

In each of the R rows, in the order from the most significant bit to the least significant bit of the W reference data pieces, it is determined whether each of the W reference data piece matches the search data, and therefore in a row where the most significant bits of the W reference data pieces and the search data do not match, an oscillation signal (any of the oscillation signals $S_1$ to $S_R$) is output to the frequency divider circuit 20 in the most delayed timing.

As a result, in a row where an oscillation signal (any of the oscillation signals $S_1$ to $S_R$) is output to the frequency divider circuit 20 in delayed timing, conversion of a distance signal into an oscillation signal by a distance/time conversion circuit (any of the distance/time conversion circuits $DT'_1$ to $DT'_R$) might not proceed to the least significant bit even when the time domain WTA circuit 30 detects the Winner row. In such a case, the conversion from a distance signal to an oscillation signal in a row where an oscillation signal (any of the oscillation signals $S_1$ to $S_R$) is output to the frequency divider circuit 20 in delayed timing is interrupted, so that the time required for searching in the associative memory 100A can be reduced.

Figure 31:
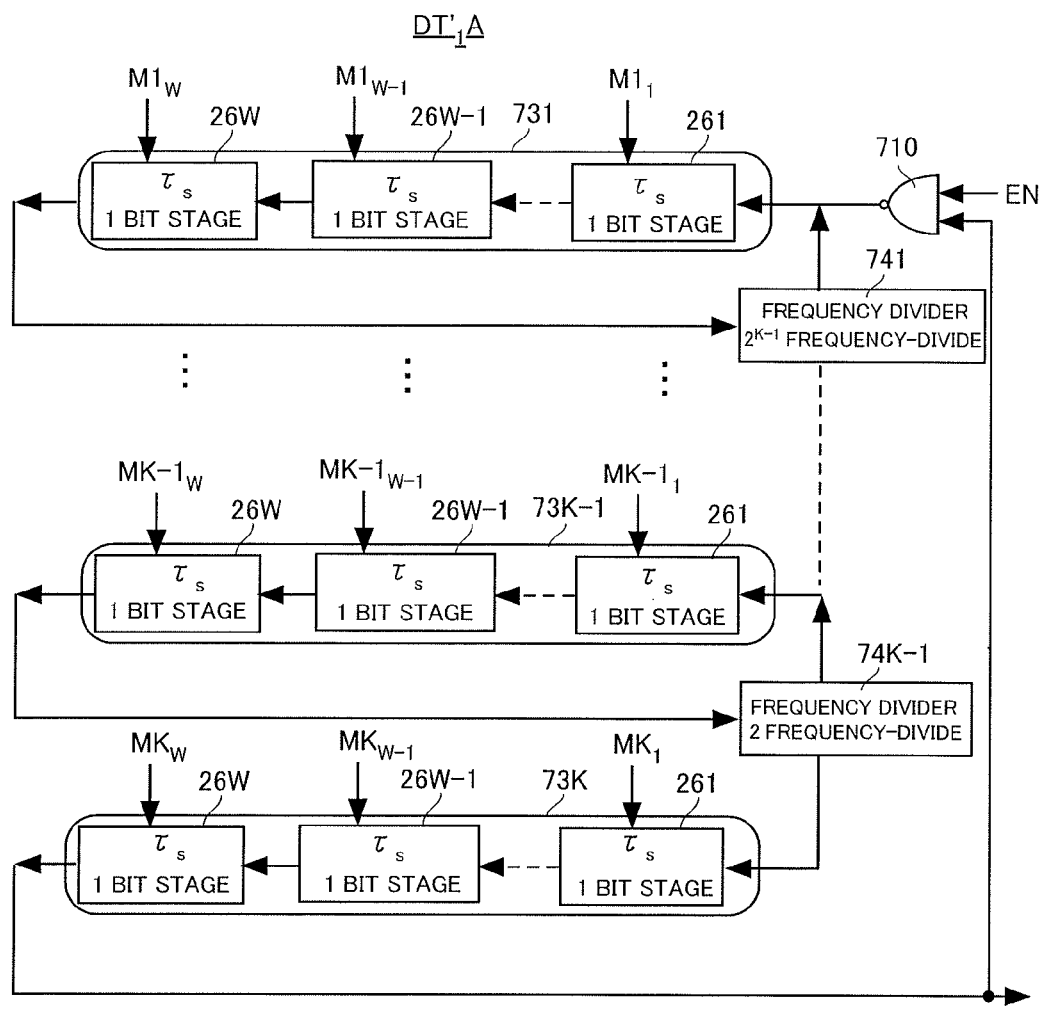
FIG. 31 is a block diagram of another configuration of the distance/time conversion circuit shown in FIG. 28.

FIG. 31 is a block diagram of another configuration of the distance/time conversion circuit $DT'_1$ shown in FIG. 28.

The distance/time conversion circuit $DT'_1$ may be the distance/time conversion circuit $DT'_1A$ shown in FIG. 31. Referring to FIG. 31, the distance/time conversion circuit $DT'_1A$ includes oscillation circuits 731 to 73K instead of the oscillation circuits 711 to 71K of the distance/time conversion circuit $DT'_1$, frequency dividers 741 to 74K-1 instead of the selecting units 721 to 72K, and the other part is the same as that of the distance/time conversion circuit $DT'_1$.

The oscillation circuit 731 is provided corresponding to the most significant bits of reference data and search data. The oscillation circuit 731 receives a W-bit distance signal $M1_1 \ldots M1_{W-1}M1_W$ that represents the distance between the most significant bits of the reference data and the search data from the path encoder $PE'_1$ and produces an oscillation signal delayed by delay time based on the distance represented by the received W-bit distance signal $M1_1 \ldots M1_{W-1}M1_W$ for output to the frequency divider 741.

Thereafter, in the same manner, the oscillation circuit 73K-1 is provided corresponding to the K-1-th bits of the reference data and the search data. The oscillation circuit 73K-1 receives a W-bit distance signal $MK-1_1 \ldots MK-1_{W-1}MK-1_W$ that represents the distance between the K-1-th bits of the reference data and the search data from the path encoder $PE'_1$ and produces an oscillation signal delayed by delay time based on the distance represented by the received W-bit distance signal $MK-1_1 \ldots MK-1_{W-1}MK-1_W$ for output to the frequency divider 74K-1.

The oscillation circuit 73K is provided corresponding to the least significant bits of the reference data and the search data. The oscillation circuit 73K receives a W-bit distance signal $MK_1 \ldots MK_{W-1}MK_W$ that represents the distance between the least significant bits of the reference data and the search data from the path encoder $PE'_1$, produces an oscillation signal delayed by delay time based on the distance represented by the received W-bit distance signal $MK_1 \ldots MK_{W-1}MK_W$ and outputs the produced oscillation signal as an oscillation signal $S_1$ to the frequency divider circuit 20 and the NAND circuit 710.

The frequency divider 741 frequency-divides the oscillation signal from the oscillation circuit 731 and outputs the frequency-divided oscillation signal to the oscillation circuit 731. The frequency divider 741 frequency-divides the oscillation signal from the oscillation circuit 731 by $2^{K-1}$ times and outputs the frequency-divided oscillation signal to the oscillation circuit 732.

Thereafter, in the same manner, the frequency divider 74K−1 frequency-divides an oscillation signal from the oscillation circuit 73K−1 and outputs the frequency-divided oscillation signal to the oscillation circuit 73K−1. The frequency divider 741 frequency-divides the oscillation signal from the oscillation circuit 73K−1 by 2 times and outputs the frequency-divided oscillation signal to the oscillation circuit 73K.

The oscillation circuits 731 to 73K each include 1-bit stages 261 to 26W. The 1-bit stages 261 to 26W are connected in a ring shape through the frequency divider 741. The 1-bit stages 261 to 26W each have the same configuration as that of the 1-bit stage 610 in FIG. 26. In this case, in each of the 1-bit stages 261 to 26W, the delay unit 603 includes an even number of inverters connected in series, and delay time by the delay unit 603 is $\tau_s$.

The 1-bit stages 261 to 26W receive distance signals $M1_1$ to $M1_W$ from the path encoder $PE'_1$ and delay a signal through delay paths selected based on the received distance signals $M1_1$ to $M1_W$ and delay a signal through a delay path (including $N_{51}$, the transfer gate 604, and the inverter 606 in this order or $N_{51}$, the transfer gate 601, the delay unit 603, the transfer gate 605, and the inverter 606 in this order) selected by the received distance signal $M1_1$ to $M1_W$. In this case, the 1-bit stages 261 to 26W each delay a signal through a delay path including $N_{51}$, the transfer gate 604, and the inverter 606 in this order when the distance signal received from the path encoder $PE'_1$ (any of $M1_1$ to $M1_W$) is "0" and through a delay path including $N_{51}$, the transfer gate 601, the delay unit 603, the transfer gate 605, and the inverter 606 in this order when the distance signal received from the path encoder $PE'_1$ (any of $M1_1$ to $M1_W$) is "1".

In this way, the distance/time conversion circuit $DT'_1A$ sequentially reduces the number of frequency dividing in the frequency dividers 741 to 74K−1 in the direction from the frequency divider 741 to the frequency divider 74K, so that delay time for oscillation signals oscillated by the oscillation circuits 731 to 73K is sequentially reduced in the direction from the most significant bits to the least significant bits of the reference data and the search data.

The distance/time conversion circuits $DT'_2$ to $DT'_R$ shown in FIG. 28 each have the same configuration as that of the distance/time conversion circuit $DT'_1A$ shown in FIG. 31.

Operation in the associative memory 100A including the distance/time conversion circuit $DT'_1A$ will be described. The unit comparator circuits $UC'_{11}$ to $UC'_{1W}$, $UC'_{21}$ to $UC'_{2W}$, . . . , and $UC'_{R1}$ to $UC'_{RW}$ output a distance signal $M1_1M2_1 \ldots MK_1M1_2M2_2 \ldots MK_2 \ldots M1_WM2_W \ldots MK_W$ to the path encoders $PE'_1$ to $PE'_R$, respectively, as described above.

The path encoder $PE'_1$ produces distance signals $M1_1M1_2 \ldots M1_W, M2_1M2_2 \ldots M2_W, MK_1MK_2 \ldots MK_W$ based on the distance signal $M1_1M2_1 \ldots MK_1M1_2M2_2 \ldots MK_2 \ldots M1_WM2_W \ldots MK_W$ by the method described above. The path encoder $PE'_1$ then outputs a distance signal $M1_1M1_2 \ldots M1_W$ to the oscillation circuit 731 of the distance/time conversion circuit $DT'_1A$, and thereafter, in the same manner, the path encoder $PE'_1$ outputs the distance signal $MK-1_1MK-1_2 \ldots MK-1_W$ to the oscillation circuit 73K−1 of the distance/time conversion circuit $DT'_1A$, and outputs the distance signal $MK_1MK_2 \ldots MK_W$ to the oscillation circuit 73K of the distance/time conversion circuit $DT'_1A$. The path encoders $PE'_2$ to $PE'_R$ operate in the same manner.

In the distance/time conversion circuit $DT'_1A$, the oscillation circuit 731 and the frequency divider 741 oscillates an oscillation signal using a delay path selected by the distance signal $M1_1M1_2 \ldots M1_W$ first and frequency-divides the oscillation signal by $2^{K-1}$ times, then the oscillation circuit 732 and the frequency divider 742 oscillates an oscillation signal using a delay path selected by the distance signal $M2_1M2_2 \ldots M2_W$ and frequency-divides the oscillation signal by $2^{K-2}$ times and thereafter, in the same manner, the oscillation circuit 73K finally oscillates an oscillation signal using a delay path selected by the distance signal $MK_1MK_2 \ldots MK_W$. The distance/time conversion circuit $DT'_1A$ outputs an oscillation signal $S_1$ to the frequency conversion circuit 20.

The distance/time conversion circuits $DT'_2$ to $DT'_R$ (=distance/time conversion circuit $DT'_1A$) similarly oscillate oscillation signals $S_2$ to $S_R$, respectively, and output the oscillated signals $S_2$ to $S_R$ to the frequency divider circuit 20.

Then, the frequency divider circuit 20 frequency-divides the oscillation signals $S_1$ to $S_R$ by a desired number of times according to the above-described method and outputs the frequency-divided oscillation signals $S_{d1}$ to $S_{dR}$ to the time domain WTA circuit 30. Then, the time domain WTA circuit 30 detects the earliest changing oscillation signal (any of the oscillation signals $S_{d1}$ to $S_{dR}$) among the oscillation signals $S_{d1}$ to $S_{dR}$ and outputs match signals $M_1$ to $M_R$.

As a result, the time required for searching in the associative memory 100A can be reduced for the above-described reason when the distance/time conversion circuits $DT'_1$ to $DT'_R$ are each made of the distance/time conversion circuit $DT'_1A$.

Figure 32:
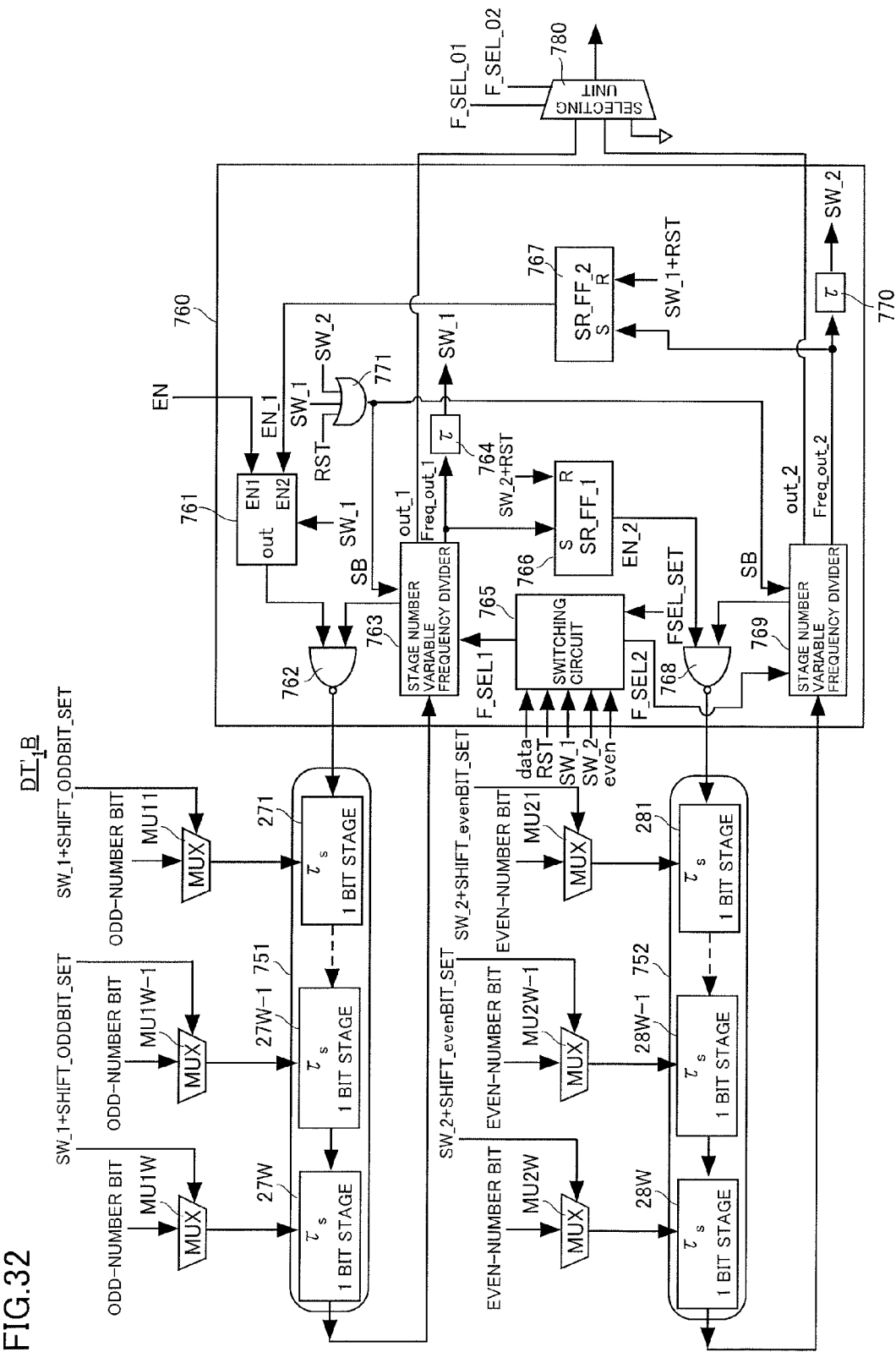
FIG. 32 is a block diagram of another configuration of the distance/time conversion circuit shown in FIG. 28.

FIG. 32 is a block diagram of another configuration of the distance/time conversion circuit $DT'_1$ shown in FIG. 28.

The distance/time conversion circuit $DT'_1$ may be the distance/time conversion circuit $DT'_1B$ shown in FIG. 32. Referring to FIG. 32, the distance/time conversion circuit $DT'_1B$ includes oscillation circuits 751 and 752, multiplexers MU11 to MU1W and MU21 to MU2W, a switching control circuit 760, and a selecting unit 780.

The oscillation circuit 751 includes 1-bit stages 271 to 27W. The oscillation circuit 752 includes 1-bit stages 281 to 28W.

The switching control circuit 760 includes an EN selection circuit 761, NAND circuits 762 and 768, stage number variable frequency dividers 763 and 769, delay circuits 764 and 770, a switching circuit 765, flip-flops 766 and 767, and an OR circuit 771.

The 1-bit stages 271 to 27W are connected in series. The 1-bit stages 281 to 28W are connected in series. The 1-bit stages 271 to 27W and 281 to 28W each include the 1-bit stage 610 shown in FIG. 26. In this case, the delay unit 603 includes an even number of inverters connected in series, and delay time by the delay unit 603 is $\tau_s$ for any of the 1-bit stages 271 to 27W and 281 to 28W.

The multiplexers MU11 to MU1W are provided corresponding to the 1-bit stages 271 to 27W, respectively. The multiplexers MU21 to MU2W are provided corresponding to the 1-bit stages 281 to 28W, respectively.

The multiplexer MU11 receives odd-number bit distance signals $M1_1, M3_1, M5_1, \ldots$ among K-bit distance signals $M1_1, M2_1, \ldots,$ and $MK_1$ from the path encoder $PE'_1$, a signal $SW\_1$ from the delay circuit 764, and a signal SHIFT_ODDBIT_SET from a control circuit (not shown) in the associative memory 100A. The multiplexer MU11 outputs one of the odd-number bit distance signals $M1_1, M3_1, M5_1, \ldots$ sequentially to the 1-bit stage 271 every time after the signal SHIF- T_ODDBIT_SET or SW_1 rises and then falls. Note that the signal SHIFT_ODDBIT_SET consists of a single pulse waveform.

The multiplexer MU12 receives odd-number bit distance signals $M1_2, M3_2, M5_2, \ldots$ among the K-bit distance signals $M1_2, M2_2, \ldots$, and $MK_2$ from the path encoder PE'$_1$, the signal SW_1 from the delay circuit 764, and the signal SHIFT_ODDBIT_SET from the control circuit (not shown) for the associative memory 100A. The multiplexer MU12 outputs one of the odd-number bit distance signals $M1_2$, $M3_2$, $M5_2, \ldots$ sequentially to the 1-bit stage 272 every time the signal SHIFT_ODDBIT_SET or SW_1 rises and then falls.

Thereafter, in the same manner, the multiplexer MU1W−1 receives odd-number bit distance signals $M1_{W-1}$, $M3_{W-1}$, $M5_{W-1}, \ldots$ among K-bit distance signals $M1_{W-1}$, $M2_{W-1}, \ldots$, and $MK_{W-1}$ from the path encoder PE'$_1$, the signal SW_1 from the delay circuit 764, and the signal SHIFT_ODDBIT_SET from the control circuit (not shown) for the associative memory 100A. The multiplexer MU1W−1 outputs one of the odd-number bit distance signals $M1_{W-1}$, $M5_{W-1}, \ldots$ sequentially to the 1-bit stage 27W−1 every time the signal SHIFT_ODDBIT_SET or SW_1 rises and then falls. The multiplexer MU1W receives odd-number bit distance signals $M1_W, M3_W, M5_W, \ldots$ among the K-bit distance signals $M1_W, M2_W, \ldots$, and $MK_W$ from the path encoder PE'$_1$, the signal SW_1 from the delay circuit 764, and the signal SHIFT_ODDBIT_SET from the control circuit (not shown) for the associative memory 100A. The multiplexer MU1W outputs one of the odd-number bit distance signals $M1_W, M3_W, M5_W, \ldots$ sequentially to the 1-bit stage 27W every time the signal SHIFT_ODDBIT_SET or SW_1 rises and then falls.

On the other hand, the multiplexer MU21 receives even-number bit distance signals $M2_1, M4_1, M6_1, \ldots$ among K-bit distance signals $M1_1, M2_1, \ldots$, and $MK_1$ from the path encoder PE'$_1$, a signal SW_2 from a delay circuit 770, and a signal SHIFT_evenBIT_SET from the control circuit (not shown) in the associative memory 100A. The multiplexer MU21 outputs one of the even-number bit distance signals $M2_1, M4_1, M6_1, \ldots$ sequentially to the 1-bit stage 281 every time the signal SHIFT_evenBIT_SET or SW_2 rises and then falls.

The multiplexer MU22 receives even-number bit distance signals $M2_2, M4_2, M6_2, \ldots$ among K-bit distance signals $M1_2, M2_2, \ldots$, and $MK_2$ from the path encoder PE'$_1$, the signal SW_2 from the delay circuit 770, and the signal SHIFT_evenBIT_SET from the control circuit (not shown) in the associative memory 100A. The multiplexer MU22 outputs one of the even-number bit distance signals $M2_2, M4_2, M6_2, \ldots$ sequentially to a 1-bit stage 282 every time the signal SHIFT_evenBIT_SET or SW_2 rises and then falls.

Thereafter, in the same manner, the multiplexer MU2W−1 receives even-number bit distance signals $M2_{W-1}, M4_{W-1}, M6_{W-1}, \ldots$ among K-bit distance signals $M1_{W-1}, M2_{W-1}, \ldots$, and $MK_{W-1}$ from the path encoder PE'$_1$, the signal SW_2 from the delay circuit 770, and the signal SHIFT_evenBIT_SET from the control circuit (not shown) in the associative memory 100A. The multiplexer MU2W−1 outputs one of the even-number bit distance signals $M2_{W-1}$, $M4_{W-1}, M6_{W-1}, \ldots$ sequentially to the 1-bit stage 28W−1 every time after the signal SHIFT_evenBIT_SET or SW_2 rises and then falls. The multiplexer MU2W receives even-number bit distance signals $M2_W, M4_W, M6_W, \ldots$ among K-bit distance signals $M1_W, M2_W, \ldots$, and $MK_W$ from the path encoder PE'$_1$, the signal SW_2 from the delay circuit 770, and the signal SHIFT_evenBIT_SET from the control circuit (not shown) for the associative memory 100A. The multiplexer MU2W outputs one of the even-number bit distance signals $M2_W, M4_W, M6_W, \ldots$ sequentially to the 1-bit stage 28W every time the signal SHIFT_evenBIT_SET or SW_2 rises and then falls.

The 1-bit stages 271 to 27W delay a signal using delay paths selected based on distance signals received from the multiplexers MU11 to MU1W, respectively. The 1-bit stages 271 to 27W−1 then output the delayed signals to the 1-bit stages 272 to 27W, respectively, and the 1-bit stage 27W outputs the delayed signal to a stage number variable frequency divider 763.

The 1-bit stages 281 to 28W delay a signal using delay paths selected based on distance signals received from the multiplexer MU21 to MU2W, respectively. The 1-bit stages 281 to 28W−1 then output the delayed signals to the 1-bit stages 282 to 28W, respectively, and the 1-bit stage 28W outputs the delayed signal to the stage number variable frequency divider 769.

The EN selection circuit 761 receives the enable signal EN from the control circuit for the associative memory 100A at a terminal EN1, a signal EN_1 (oscillation signal) from the flip-flop 767 at a terminal EN_2 and receives the signal SW_1 from the delay unit 764. The EN selection circuit 761 operates, in the initial state, the logical sum of the enable signal EN input to the terminal EN1 and the signal EN_1 (oscillation signal) input to the terminal EN2 and outputs the operated logical sum to the NAND circuit 762. The EN selection circuit 761 outputs the signal EN_1 (oscillation signal) input to the terminal EN2 to the NAND circuit 762 when the signal SW_1 rises and then falls.

The NAND circuit 762 operates the logical product of the output signal of the EN selection circuit 761 and the output signal of the stage number variable frequency divider 763 and inverts the operated logical product for output to the 1-bit stage 271.

The stage number variable frequency divider 763 receives an oscillation signal from the 1-bit stage 27W, a selection signal F_SEL1 from the switching circuit 765, and a search start signal SB from the OR circuit 771. The stage number variable frequency divider 763 outputs the received oscillation signal to the NAND circuit 762. Upon receiving the search start signal SB, the stage number variable frequency divider 763 resets the number of times of frequency dividing before the search start signal SB is received and frequency-divides the oscillation signal by a number selected by the selection signal F_SEL1, and outputs the frequency-divided oscillation signal as a signal Freq_out_1 to the delay circuit 764 and the flip-flop 761. Upon finishing the frequency dividing of the oscillation signal, the stage number variable frequency divider 763 outputs the frequency divided oscillation signal as a signal out_1 to the selecting unit 780.

The delay circuit 764 delays the signal Freq_out_1 by τ and outputs the delayed signal Freq_out_1 as the signal SW_1.

Upon receiving a reset signal RST from the control circuit for the associative memory 100A, the switching circuit 765 is reset. The switching circuit 765 receives a selection signal FSEL_SET and data composed of "1" from the control circuit for the associative memory 100A after being reset. The switching circuit 765 produces selection signals F_SEL0, F_SEL1, and F_SEL2 by a method that will be described. Then, the switching circuit 765 outputs the produced selection signal F_SEL0 to the selecting unit 780, outputs the produced selection signal F_SEL1 to the stage number variable frequency divider 763, and outputs the produced selection signal F_SEL2 to the stage number variable frequency divider 769. Note that the selection signal F_SEL0 consists of selection signals F_SEL01 and F_SEL02, and the selection signal F_SEL01 and F_SEL02 never become "1" at the same time. The selection signal FSEL_SET consists of a single pulse waveform.

The flip-flop 766 receives a signal Freq_out_1 from the stage number variable frequency divider 763 at its terminal S, a signal SW_2 from the delay circuit 770 at its terminal R, and a reset signal RST from the control circuit for the associative memory 100A at the terminal R. The flip-flop 766 is reset in response to the reset signal RST in an early stage. The flip-flop 766 is reset in response to the pulse signal of the signal SW_2, then receives the pulse signal of the signal Freq_out_1 at the terminal S, latches the received pulse signal and outputs the signal as a signal EN_2 to a NAND circuit 768.

The flip-flop 767 receives a signal Freq_out_2 from the stage number variable frequency divider 769 at its terminal S, a signal SW_1 from the delay circuit 764 at its terminal R, and a reset signal RST from the control circuit for the associative memory 100A at the terminal R. The flip-flop 767 is reset in response to the reset signal RST in an early stage. The flip-flop 767 is reset in response to the pulse signal of the signal SW_1, then receives the pulse signal of the signal Freq_out_2 at the terminal S, latches the received pulse signal and outputs the signal as a signal EN_1 to the EN selection circuit 761.

The NAND circuit 768 operates the logical product of a signal EN_2 and an oscillation signal from the stage number variable frequency divider 769 and inverts the operated logical product for output to the 1-bit stage 281.

The stage number variable frequency divider 769 receives an oscillation signal from the 1-bit stage 28W, a selection signal F_SEL2 from the switching circuit 765 and a search start signal SB from the OR circuit 771. Upon receiving the search start signal SB, the stage number variable frequency divider 769 resets the number of times of frequency dividing by the frequency divider, outputs the oscillation signal to the NAND circuit 768, frequency-divides the oscillation signal a number of times selected by the selection signal F_SEL2 and outputs the frequency-divided oscillation signal as a signal Freq_out_2 to the delay circuit 770. The stage number variable frequency divider 769 outputs the frequency-divided oscillation signal as a signal out_2 to the selecting unit 780 after finishing the frequency dividing of the oscillation signal.

The delay circuit 770 receives a signal Freq_out_2 from the stage number variable frequency divider 769, delays the received signal Freq_out_2 by τ, and outputs the delayed signal Freq_out_2 as a signal SW_2.

The selecting unit 780 receives the selection signal F_SEL0 (=F_SEL01, F_SEL02), the signal out_1 from the stage number variable frequency divider 763, and the signal out_2 from the stage number variable frequency divider 769.

The selecting unit 780 outputs the signal out_1 as an oscillation signal $S_1$ to the frequency divider circuit 20 when the selection signal F_SEL01 is "1". The selecting unit 780 outputs the signal out_2 as the oscillation signal $S_1$ to the frequency divider circuit 20 when the selection signal F_SEL02 is "1".

Figure 33:
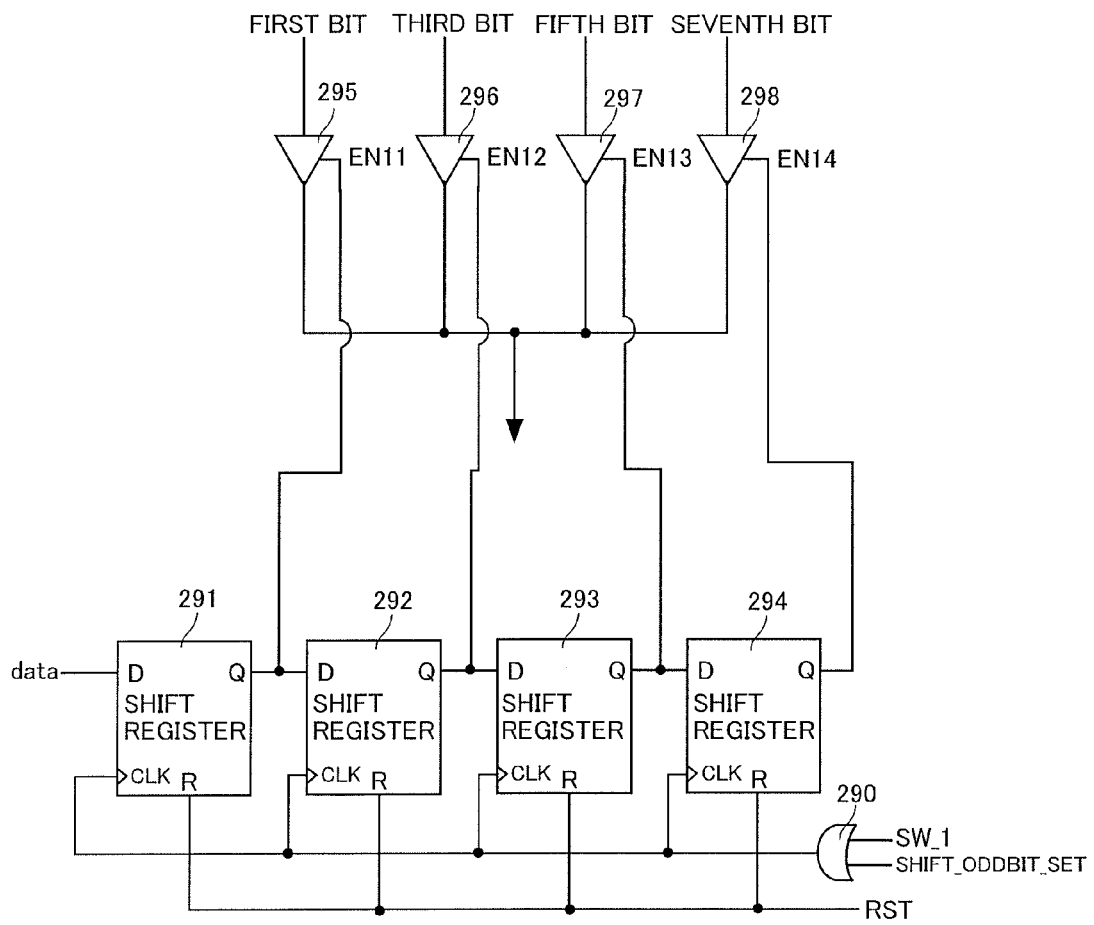
FIG. 33 is a circuit diagram of the multiplexer shown in FIG. 32.

FIG. 33 is a circuit diagram of the multiplexer MU11 shown in FIG. 32. Referring to FIG. 33, the multiplexer MU11 includes an OR circuit 290, shift registers 291 to 294, and gates 295 to 298.

The OR circuit 290 receives the signal SW_1 from the delay circuit 764 and the signal SHIFT_ODDBIT_SET from the control circuit for the associative memory 100A. The OR circuit 290 operates the logical sum of the signal SW_1 and the signal SHIFT_ODDBIT_SET and outputs the operated logical sum to the terminals CLK of the shift registers 291 to 294.

The shift registers 291 to 294 are connected in series. The shift registers 291 to 294 receive the logical sum of the signal SW_1 and the signal SHIFT_ODDBIT_SET at the terminals CLK from the OR circuit 290 and the reset signal RST at the terminals R.

The shift registers 291 to 294 output signals EN11 to EN14 to the gates 295 to 298, respectively.

In an early stage, the signal SW_1 is composed of "0", the signal SHIFT_ODDBIT_SET is composed of a single pulse waveform as described above. The shift register 291 therefore receives data composed of "1" at the terminal D and outputs "1" from the terminal Q to the shift register 292 and the gate 295 when the signal SHIFT_ODDBIT_SET rises and then falls. Then, the shift register 291 outputs "1" from the terminal Q to the shift register 292 and the gate 295 when the signal SW_1 rises and then falls.

In an early stage, the shift register 292 receives data composed of "0" at the terminal D from the shift register 291 and outputs data composed of "0" to the shift register 293 and the gate 296 when the signal SHIFT_ODDBIT_SET rises and then falls. Then, the shift register 292 outputs the data received at the terminal D from the shift register 291 to the shift register 293 and the gate 296 from the terminal Q when the signal SW_1 rises and then falls.

In an early stage, the shift register 293 receives data composed of "0" at the terminal D from the shift register 292 and outputs data composed of "0" to the shift register 294 and the gate 297 when the signal SHIFT_ODDBIT_SET rises and then falls. Then, the shift register 293 outputs the data received at the terminal D from the shift register 292 to the shift register 294 and the gate 297 from the terminal Q when the signal SW_1 rises and then falls.

In an early stage, the shift register 294 receives data composed of "0" at the terminal D from the shift register 293 and outputs data composed of "0" to the gate 298 when the SHIFT_ODDBIT_SET rises and then falls. Then, the shift register 294 outputs the data received at the terminal D from the shift register 293 to the gate 298 from the terminal Q when the signal SW_1 rises and then falls.

The gates 295 to 298 receive bit values for the first bit, the third bit, the fifth bit, and the seventh bit among the K-bit distance signal $M1_1 M2_1 \ldots MK_1$.

Upon receiving signals EN11 to EN14 composed of "1", respectively, the gates 295 to 298 output bit values for the first bit, the third bit, the fifth bit, and the seventh bit to the 1-bit stage 271.

In the multiplexer MUM the signal EN11 attains "1" first and the signals EN12 to EN14 sequentially attains "1" every time the signal SW_1 rises and then falls, so that the gates 295 to 298 sequentially output bit values for the first bit, the third bit, the fifth bit, and the seventh bit to the 1-bit stage 271 every time the signal SW_1 rises and then falls.

Note that multiplexers MU12 to MU1W and MU21 to MU2W shown in FIG. 32 each have the same circuit configuration as that of the multiplexer MU11 shown in FIG. 33. In the multiplexers MU21 to MU2W, the OR circuit 290 operates the logical sum of the signal SW_2 and the signal SHIFT_evenBIT_SET and outputs the operated logical sum to the terminals CLK of the shift registers 291 to 294. In the multiplexers MU21 to MU2W, the gates 295 to 298 receive bit values for the second bit, the fourth bit, the sixth bit, and the eighth bit among the K bit distance signal $M1_1 M2_1 \ldots MK_1$. The gates 295 to 298 of the multiplexers MU21 to MU2W sequentially output one of the bit values for the second bit, the fourth bit, the sixth bit, and the eighth bit to the 1-bit stages 281 to 28W every time the signal SW_2 rises and then falls.

Figure 34:
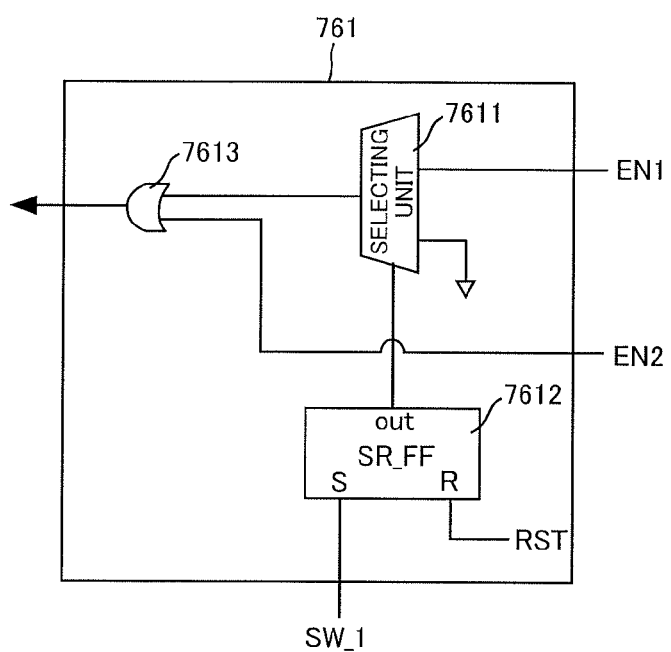
FIG. 34 is a circuit diagram of the EN selection circuit shown in FIG. 32.

FIG. 34 is a circuit diagram of the EN selection circuit 761 shown in FIG. 32. Referring to FIG. 34, the EN selection circuit 761 includes a selecting unit 7611, a flip-flop 7612, and an OR circuit 7613.

The selector 7611 receives an enable signal EN from the terminal EN1 and the signal SW_1 from the flip-flop 7612. After the signal SW_1 rises, the selecting unit 7611 outputs the enable signal EN to the OR circuit 7613 until the signal falls. The selecting unit 7611 outputs a signal composed of "0" to the OR circuit 7613 when the signal SW_1 rises and then falls.

The flip-flop 7612 receives the signal SW_1 at the terminal S and a reset signal RST at the terminal R. The flip-flop 7612 is reset in response to the reset signal RST and then outputs the signal SW_1 to the selecting unit 7611 in response to the signal SW_1 received at the terminal S.

The OR circuit 7613 operates the logical sum of the output signal of the selecting unit 7611 and a signal input from the terminal EN2 and outputs the operated logical sum to the NAND circuit 762.

In the EN selection circuit 761, after the signal SW_1 rises and until it falls, the selecting unit 7611 outputs the enable signal EN to the OR circuit 7613. Therefore, after the signal SW_1 rises, the OR circuit 7613 outputs the enable signal EN or the signal input from the terminal EN2 to the NAND circuit 762 until the signal falls.

The selecting unit 7611 outputs a signal composed of "0" to the OR circuit 7613 when the signal SW_1 rises and then falls, the OR circuit 7613 operates the logical sum of a signal composed of "0" and the signal input from the terminal EN_2, and outputs the signal input from the terminal EN_2 to the NAND circuit 762.

Figure 35:
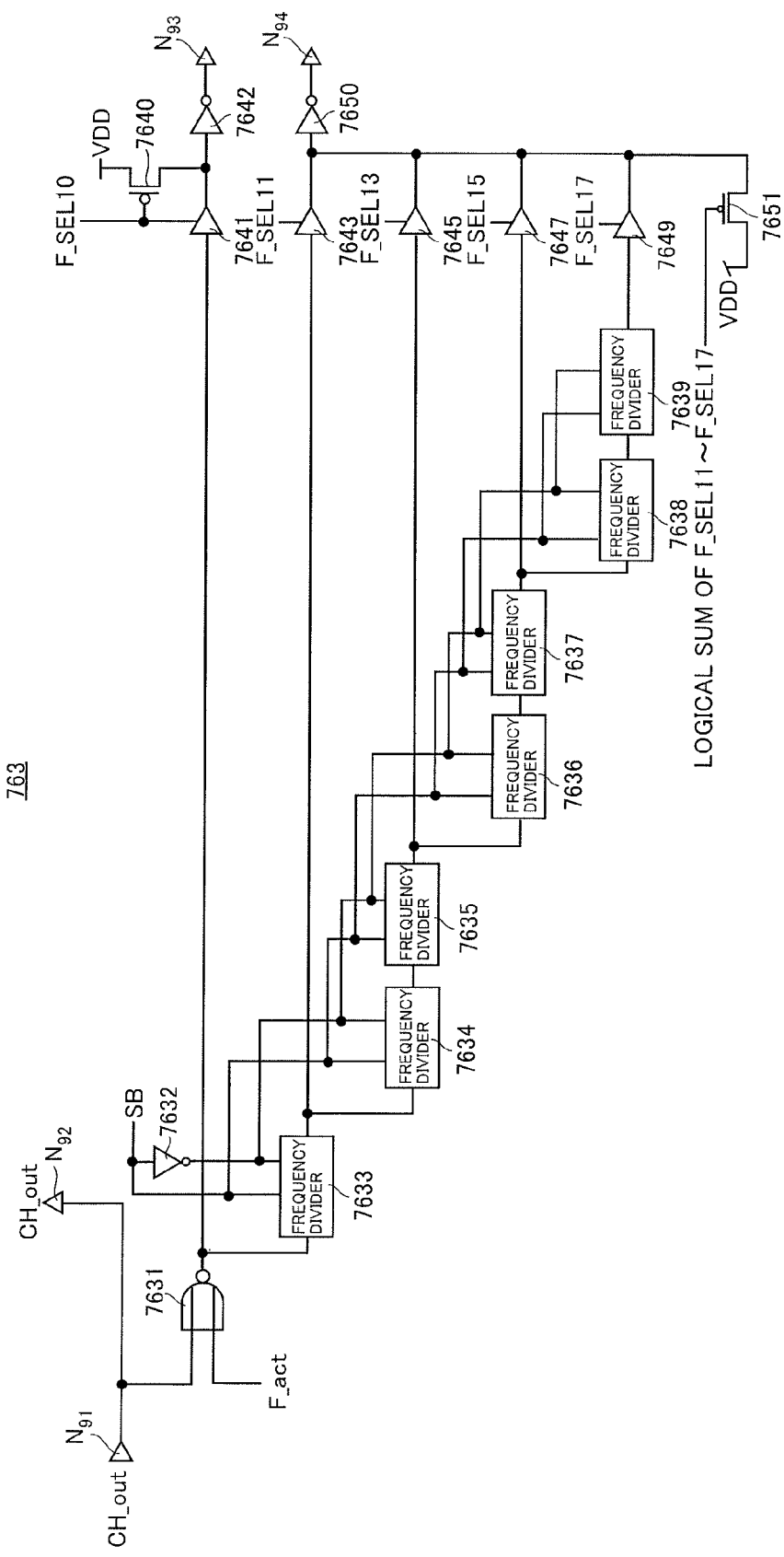
FIG. 35 is a circuit diagram of one stage number variable frequency divider shown in FIG. 32.

FIG. 35 is a circuit diagram of one stage number variable frequency divider 763 shown in FIG. 32. In the circuit diagram of the stage number variable frequency divider 763 shown in FIG. 35, the bit number K of reference data is 8.

Referring to FIG. 35, the stage number variable frequency divider 763 includes a NOR circuit 7631, inverters 7632, 7642, and 7650, frequency dividers 7633 to 7639, P-type MOS transistors 7640 and 7651, and gates 7641, 7643, 7645, 7647, and 7649.

The stage number variable frequency divider 763 receives a signal CH_out (oscillation signal) from a node $N_{91}$ and outputs the received signal CH_out to the NAND circuit 762 from the node $N_{92}$.

The NOR circuit 7631 operates the logical sum of the signal CH_out received from the node $N_{91}$ and a signal F_act and inverts the operated logical sum for output to the frequency divider 7633 and the gate 7641.

The inverter 7632 receives a search start signal SB from the OR circuit 771 and inverts the received search start signal SB for output to the frequency dividers 7633 to 7639.

The frequency dividers 7633 to 7639 are connected in series, receive the search start signal SB from the OR circuit 771, and an inverted signal /SB from the inverter 7632. The frequency divider 7633 is connected between the output terminal of the NOR circuit 7631 and the gate 7643. The frequency dividers 7634 and 7635 are connected in series between the output terminal of the frequency divider 7633 and the gate 7645. The frequency dividers 7636 and 7637 are connected in series between the output terminal of the frequency divider 7635 and the gate 7647. The frequency dividers 7638 and 7639 are connected in series between the output terminal of the frequency divider 7637 and the gate 7649.

The frequency dividers 7633 to 7639 each have the same circuit configuration as that of the frequency divider 211 shown in FIG. 11. In this case, the N-type MOS transistor 2119 shown in FIG. 11 receives the search start signal SB instead of the signal Fre_RST at its gate terminal and the P-type MOS transistor 2127 receives the inverted signal /SB of the search start signal SB instead of signal Fre_RSTQ at its gate terminal.

The P-type MOS transistor 7640 is connected between a power supply node VDD and the input terminal of the inverter 7642. The P-type MOS transistor 7640 receives the selection signal F_SEL10 received from the switching circuit 765 at the gate terminal.

The gate 7641 and the inverter 7642 are connected in series between the output terminal of the NOR circuit 7631 and a node $N_{93}$. The gate 7641 is opened/closed by the selection signal F_SEL10 received from the switching circuit 765. More specifically, the gate 7641 is opened in response to the selection signal F_SEL10 composed of "1" and closed in response to the selection signal F_SEL10 composed of "0". The inverter 7642 inverts the signal received from the gate 7641 for output to the frequency divider 20 from the node $N_{93}$.

The gates 7643 and the inverter 7650 are connected in series between the output terminal of the frequency divider 7633 and a node $N_{94}$. The gate 7643 is opened/closed in response to the selection signal F_SEL11 received from the switching circuit 765. More specifically, the gate 7643 is opened in response to a selection signal F_SEL11 composed of "1" and closed in response to a selection signal F_SEL11 composed of "0". The inverter 7650 inverts the signals received from the gates 7643, 7645, 7647, and 7649 and outputs the inverted signals to a delay circuit 764 and the flip-flop 766 from the node $N_{94}$.

The gates 7645, 7647, and 7649 are connected between the output terminals of the frequency dividers 7635, 7637, and 7639 and the input terminal of the inverter 7650 and are opened/closed in response to selection signals F_SEL13, F_SEL15, and F_SEL17 received from a switching circuit 765. More specifically, the gates 7645, 7647, and 7649 are opened in response to the selection signals F_SEL13, F_SEL15, and F_SEL17 composed of "1", respectively and closed in response to selection signals F_SEL13, F_SEL15, and F_SEL17 composed of "0".

The P-type MOS transistor 7651 is connected between the power supply node VDD and the input terminal of the inverter 7650. The P-type MOS transistor 7651 receives the logical sum of the selection signals F_SEL11 to F_SEL17 at the gate terminal.

When the stage number variable frequency divider 763 is driven, a signal F_act composed of "0" is input to the NOR circuit 7631 and a search start signal SB composed of "0" and the inverted signal /SB composed of "1" are input to the frequency dividers 7633 to 7639.

Upon receiving the selection signal F_SEL11 composed of "1" at the gate 7643, the stage number variable frequency divider 763 frequency-divides the signal CH_out (oscillation signal) received from the NOR circuit 7631 by two times with the frequency divider 7633 for output to the delay circuit 764 and the flip-flop 766 from the node $N_{94}$.

Upon receiving the selection signal F_SEL13 composed of "1" at the gate 7645, the stage number variable frequency divider 763 further frequency-divides an oscillation signal received from the frequency divider 7633 by $2^2$ times with the frequency dividers 7634 and 7635 for output to the delay circuit 764 and the flip-flop 766 from the node $N_{94}$.

Thereafter, in the same manner, upon receiving the selection signals F_SEL15 and F_SEL17 composed of "1" at the gates 7647 and 7649, respectively, the stage number variable frequency divider 763 further frequency-divides oscillation signals received from the frequency dividers 7635 and 7637 by $2^2$ times with the frequency dividers 7636, 7637, 7638, and 7649 for output to the delay circuit 764 and the flip-flop 766 from the node $N_{94}$.

As a result, the stage number variable frequency divider 763 receives the selection signals F_SEL11, F_SEL13, F_SEL15, and F_SEL17 composed of "1" at the gates 7643, 7645, 7647, and 7649, respectively, so that the oscillation signals are frequency-divided by 2, $2^3$, $2^5$, and $2^7$ times, respectively for output to the delay circuit 764 and the flip-flop 766.

Upon receiving the selection signal F_SEL10 composed of "1" at the gate 7641, the stage number variable frequency divider 763 outputs an oscillation signal from the node $N_{93}$ to the frequency divider circuit 20.

In this way, the stage number variable frequency divider 763 frequency-divides an oscillation signal by switching the number of frequency dividing based on the selection signals F_SEL11, F_SEL13, F_SEL15, and F_SEL17.

Figure 36:
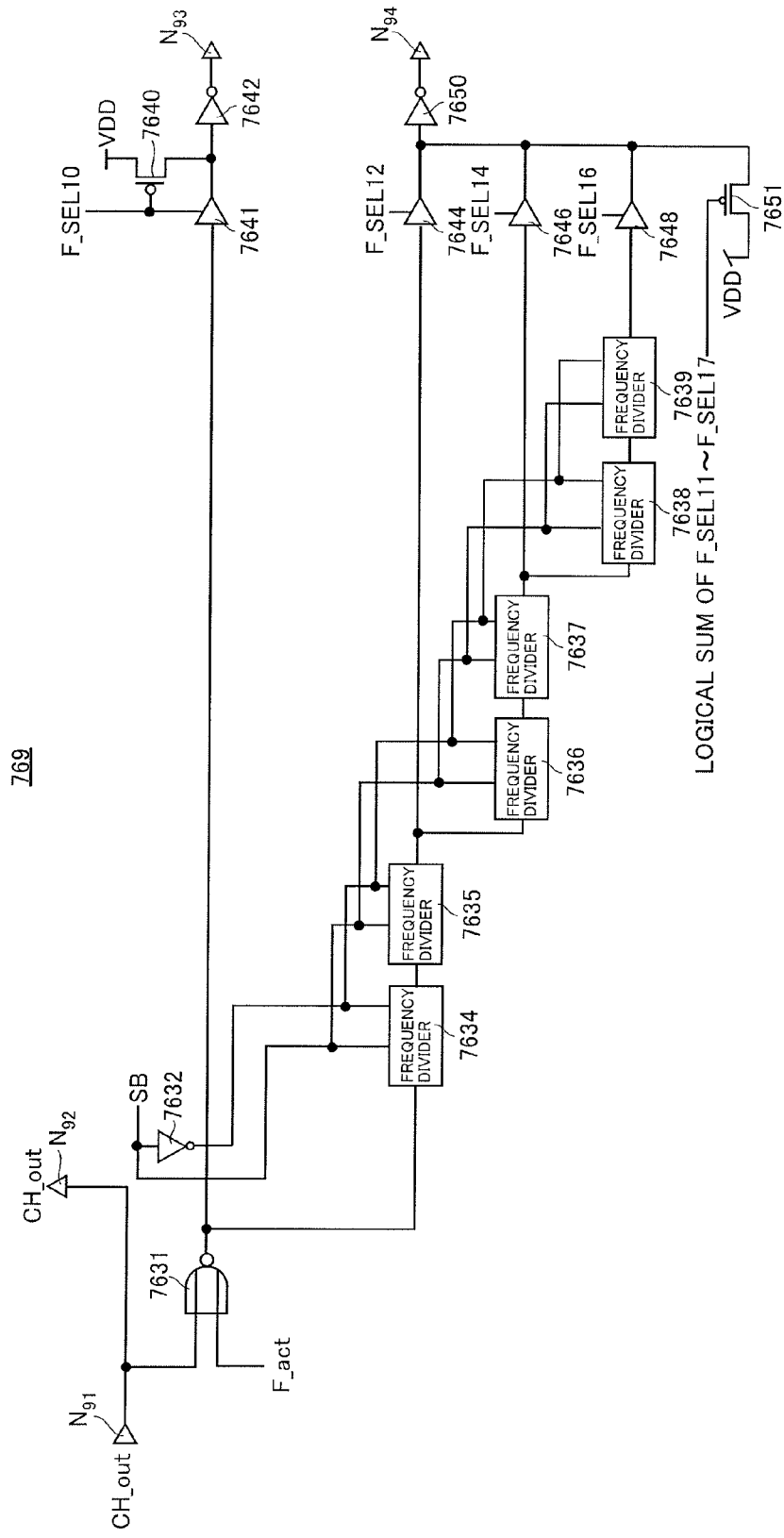
FIG. 36 is a circuit diagram of another stage number variable frequency divider shown in FIG. 32.

FIG. 36 is a circuit diagram of another stage number variable frequency divider 769 shown in FIG. 32. Referring to FIG. 36, the stage number variable frequency divider 769 is produced by removing the frequency divider 7633 and 7643 and replacing the gates 7645, 7647, and 7649 in the stage number variable frequency divider 763 for gates 7644, 7646, and 7648. The other part is the same as that of the stage number variable frequency divider 763. Note that in the stage number variable frequency divider 769, the inverter 7650 is connected to the output terminals of the gates 7644, 7646, and 7648 and the P-type MOS transistor 7651.

The gates 7644, 7646, and 7648 receive selection signals F_SEL12, F_SEL14, and F_SEL16 from the switching circuit 765, respectively and are opened/closed in response to the selection signals F_SEL12, F_SEL14, and F_SEL16. More specifically, the gates 7644, 7646, and 7648 are opened in response to the selection signals F_SEL12, F_SEL14, and F_SEL16 composed of "1" and closed in response to the selection signals F_SEL12, F_SEL14, and F_SEL16 composed of "0".

When the stage number variable frequency divider 769 is driven, the signal F_act composed of "0" is input to the NOR circuit 7631 and the search signal SB composed of "0" and the inverted signal /SB composed of "1" are input to frequency dividers 7634 to 7639.

Upon receiving the selection signal F_SEL12 composed of "1" at the gate 7644, the stage number variable frequency divider 769 frequency-divides the signal CH_out (oscillation signal) received from the NOR 7631 by $2^2$ times with the frequency dividers 7634 and 7635 for output to the delay circuit 770 and the flip-flop 767 from the node $N_{94}$.

Upon receiving a selection signal F_SEL14 composed of "1" at the gate 7646, the stage number variable frequency divider 769 further frequency-divides an oscillation signal received from the frequency divider 7635 by $2^2$ times with the frequency dividers 7636 and 7637 for output to the delay circuit 770 and the flip-flop 767 from the node $N_{94}$.

Upon receiving a selection signal F_SEL16 composed of "1" at the gate 7648, the stage number variable frequency divider 769 further frequency-divides an oscillation signal received from the frequency divider 7637 by $2^2$ times with the frequency dividers 7638 and 7639 for output to the delay circuit 770 and the flip-flop 767 from the node $N_{94}$.

As a result, the stage number variable frequency divider 769 receives the selection signals F_SEL12, and F_SEL14, F_SEL16 composed of "1" at the gates 7644, 7646, and 7648, respectively, so that the oscillation signals are frequency-divided $2^2$, $2^4$, and $2^6$ times respectively for output to the delay circuit 770 and the flip-flop 767.

Upon receiving the selection signals F_SEL10 composed of "1" at the gate 7641, the stage number variable frequency divider 769 outputs an oscillation signal from the node N93 to the frequency divider circuit 20.

In this way, the stage number variable frequency divider 769 frequency-divides an oscillation signal by switching the number of frequency dividing based on the selection signals F_SEL12, F_SEL14, and F_SEL16.

Figure 37:
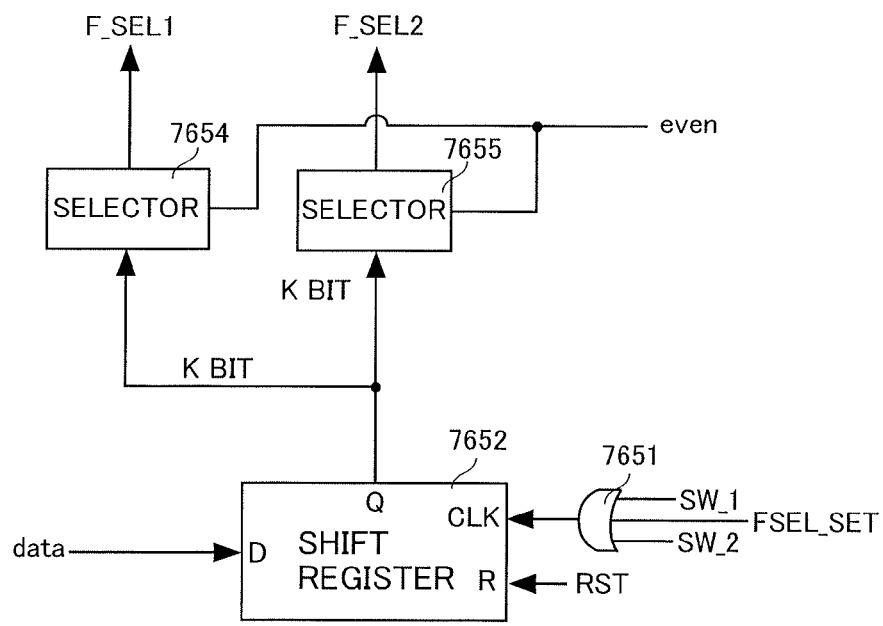
FIG. 37 is a block diagram of the switching circuit shown in FIG. 32.

FIG. 37 is a block diagram of the switching circuit 765 shown in FIG. 32. Referring to FIG. 37, the switching circuit 765 includes an OR circuit. 7651, a shift register 7652, and selectors 7654 and 7655.

The OR circuit 7651 receives signals SW_1 and SW_2 from the delay circuits 764 and 770, respectively and the signal FSEL_SET from the control circuit for the associative memory 100A. The OR circuit 7651 operates the logical sum of the received signals SW_1 and SW_2 and FSEL_SET for output to the terminal CLK of the shift register 7652. Note that FSEL_SET consists of a single pulse waveform.

The shift register 7652 receives data composed of "1" at the terminal D, the output of the OR circuit 7651 at the terminal CLK and a reset signal RST at the terminal R.

Then, upon receiving the reset signal RST at the terminal R, the shift register 7652 is reset. Thereafter, upon receiving data composed of "1" at the terminal D, the shift register 7652 outputs a K bit signal to the selectors 7654 and 7655 by outputting the data received at the terminal D every time a signal received at the terminal CLK rises and then falls.

Note that a signal even composed of "1" indicates that the bit number of reference data is even and a signal even composed of "0" indicates that the bit number of reference data is odd.

The selector 7654 receives the K-bit signal from the shift register 7652 and the signal even from the control circuit for the associative memory 100A. If the signal even is composed of "1", the selector 7654 produces a selection signal F_SEL1 (that consists of selection signals F_SEL10, F_SEL11, F_SEL13, F_SEL15, and F_SEL17) based on the K-bit signal and outputs the produced selection signal F_SEL1 (that consists of selection signals F_SEL10, F_SEL11, F_SEL13, F_SEL15, and F_SEL17) to the stage number variable frequency divider 763.

The selector 7655 receives a K-bit signal from the shift register 7652 and the signal even from the control circuit for the associative memory 100A. If the signal even is composed of "0", the selector 7655 produces a selection signal F_SEL2 (=selection signals F_SEL10, F_SEL12, F_SEL14, and F_SEL16) based on the K-bit signal and outputs the produced selection signal F_SEL2 (that consists of selection signals F_SEL10, F_SEL12, F_SEL14, and F_SEL16) to the stage number variable frequency divider 763.

Figure 38:
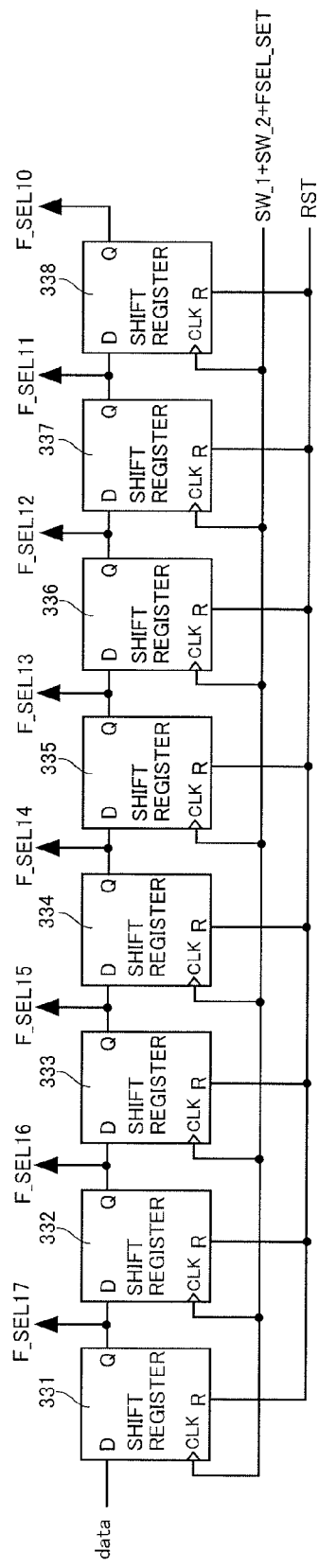
FIG. 38 is a circuit diagram of the shift register shown in FIG. 37.

FIG. 38 is a circuit diagram of the shift register 7652 shown in FIG. 37. Note that FIG. 38 is a circuit diagram of the shift register 7652 when the bit number K of the reference data is 8.

Referring to FIG. 38, the shift register 7652 consists of the shift registers 331 to 338.

The shift registers 331 to 338 are connected in series. The shift registers 331 to 338 each receive a signal SW consisting of the logical sum of signals SW_1, SW_2, and FSEL_SET at the terminal CLK and a reset signal RST at the terminal R.

The shift register 331 receives data composed of "1" at the terminal D from the control circuit for the associative memory 100A. In an early stage, the shift register 331 outputs data composed of "1" as a selection signal F_SEL17 from the terminal Q when the signal FSEL_SET rises and then falls since the signals SW_1 and SW_2 are composed of "0". Then, the shift register 331 outputs data composed of "1" as the selection signal F_SEL17 from the terminal Q when the signal SW (that consists of the logical sum of the signals SW_1, SW_2, and FSEL_SET).

In an early stage, the shift registers 332 to 338 receive data (="0") from the shift registers 331 to 337, respectively and outputs selection signals F_SEL16 to F_SEL10 composed of "0" from the terminal Q when the signal SEL_SET rises and then falls. Then, the shift registers 332 to 338 receive data (="1") from shift registers 331 to 337, respectively at the terminal D and outputs selection signals F_SEL16 to F_SEL10 composed of "1" from the terminals Q when the signal SW rises and then falls.

In this way, the shift register 7652 sequentially outputs the selection signals F_SEL17 to F_SEL10 composed of "1" every time the signal SW rises and then falls.

Figure 39:
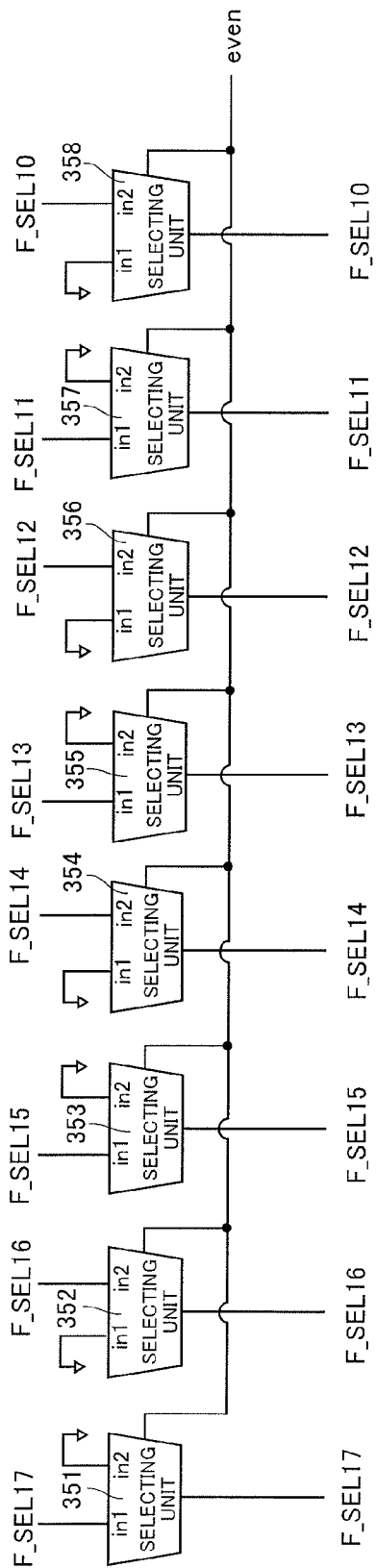
FIG. 39 is a circuit diagram of the selector shown in FIG. 37.

FIG. 39 is a circuit diagram of the selector 7654 shown in FIG. 37. Referring to FIG. 39, the selector 7654 includes selecting units 351 to 358. The selecting units 351, 353, 355, and 357 receive selection signals F_SEL17, F_SEL15, F_SEL13, and F_SEL11, respectively, at their terminals in1 and have their terminals in2 connected to the ground node GND.

The selecting units 352, 354, 356, and 358 have their terminals in1 connected to the ground node GND and receive selection signals F_SEL16, F_SEL14, F_SEL12, and F_SEL10, respectively, at their terminals in2.

The selecting units 351 to 358 receive a signal even from the control circuit for the associative memory 100A. The selecting units 351 to 358 output the signals received at the terminals in1 as F_SEL17 to F_SEL10 when the signal even is "1", and the signals received at the terminals in2 as F_SEL17 to F_SEL10 when the signal even is "0".

When the signal even is "1", the outputs of the selecting units 351, 353, 355, and 357 are of selection signals F_SEL17, F_SEL15, F_SEL13, and F_SEL11, respectively and the outputs of the selecting units 352, 354, 356, and 358 are of "0". The selecting units 351, 353, 355, and 357 output selection signals F_SEL17, F_SEL15, F_SEL13, and F_SEL11 to the stage number variable frequency divider 763 and the selecting unit 358 outputs the selection signal F_SEL10 composed of "0" to the stage number variable frequency divider 763.

On the other hand, the signal even is "0", the outputs of the selecting units 351, 353, 355, and 357 are of "0", the outputs of the selecting units 352, 354, 356, and 358 are of selection signals F_SEL16, F_SEL14, F_SEL12, and F_SEL10. The selecting units 351, 353, 355, and 357 output selection signals F_SEL17, F_SEL15, F_SEL13, and F_SEL11 composed of "0" to the stage number variable frequency divider 763, and the selecting unit 358 outputs the selection signal F_SEL10 to the stage number variable frequency divider 763.

Note that the selector 7655 has the same circuit configuration as that of the selector 7654 but in the selector 7655, the selecting units 351 to 358 carry out operation reversed from that in the selector 7654. More specifically, in the selector 7655, the selecting units 351 to 358 output signals received at the terminals in2 as F_SEL17 to F_SEL10 when the signal even is "1" and signals received at the terminals in1 as F_SEL17 to F_SEL10 when the signal even is "0".

In the selector 7655, when the signal even is "1", the outputs of the selecting units 352, 354, 356, and 358 are of selection signals F_SEL16, F_SEL14, F_SEL12, and F_SEL10, and the outputs of the selecting units 351, 353, 355, and 357 are of "0". The selecting units 352, 354, 356, and 358 output selection signals F_SEL16, F_SEL14, F_SEL12, and F_SEL10 to the stage number variable frequency divider 769.

On the other hand, in the selector 7655, when the signal even is "0", the outputs of the selecting units 352, 354, 356, and 358 are of "0" and the outputs of the selecting units 351, 353, 355, and 357 are of F_SEL17, F_SEL15, F_SEL13, and F_SEL11, respectively. The selecting units 352, 354, 356, and 358 output selection signals F_SEL16, F_SEL14, F_SEL12, and F_SEL10 composed of "0" to the stage number variable frequency divider 769.

Figure 40:
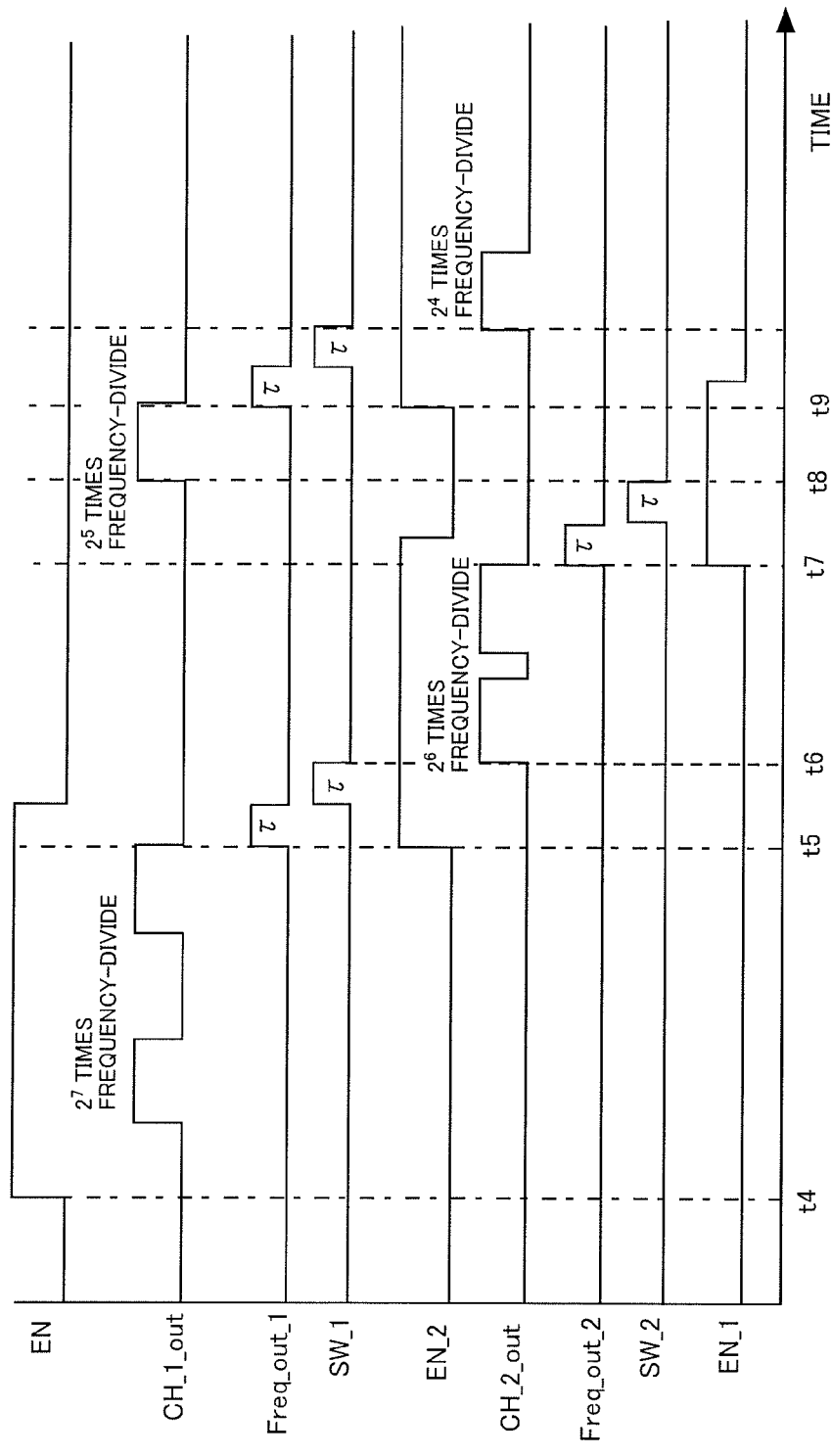
FIG. 40 is a signal timing chart.
Figure 41:
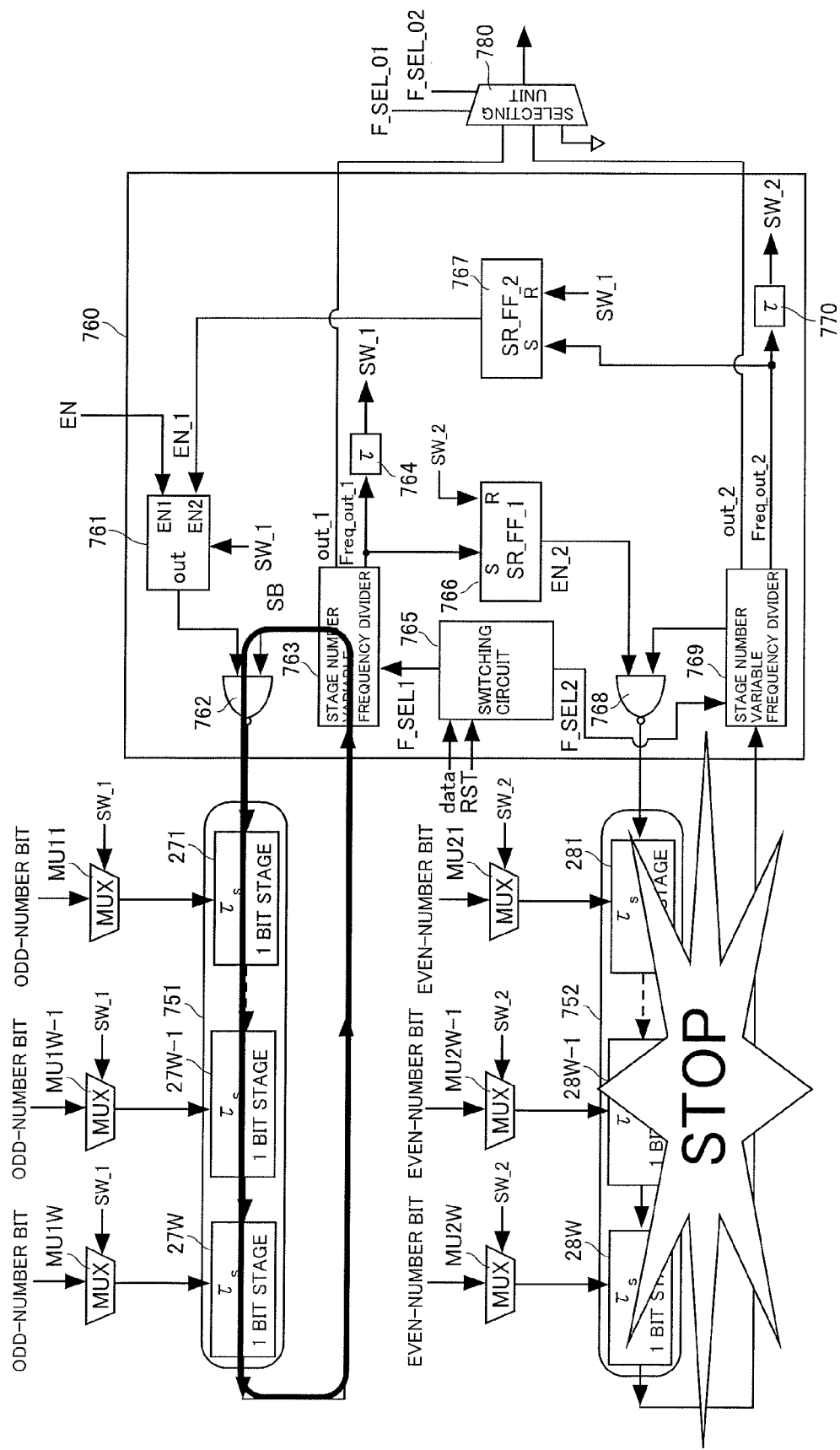
FIG. 41 is first concept view for illustrating the operation of the associative memory including the distance/time conversion circuit shown in FIG. 32.
Figure 42:
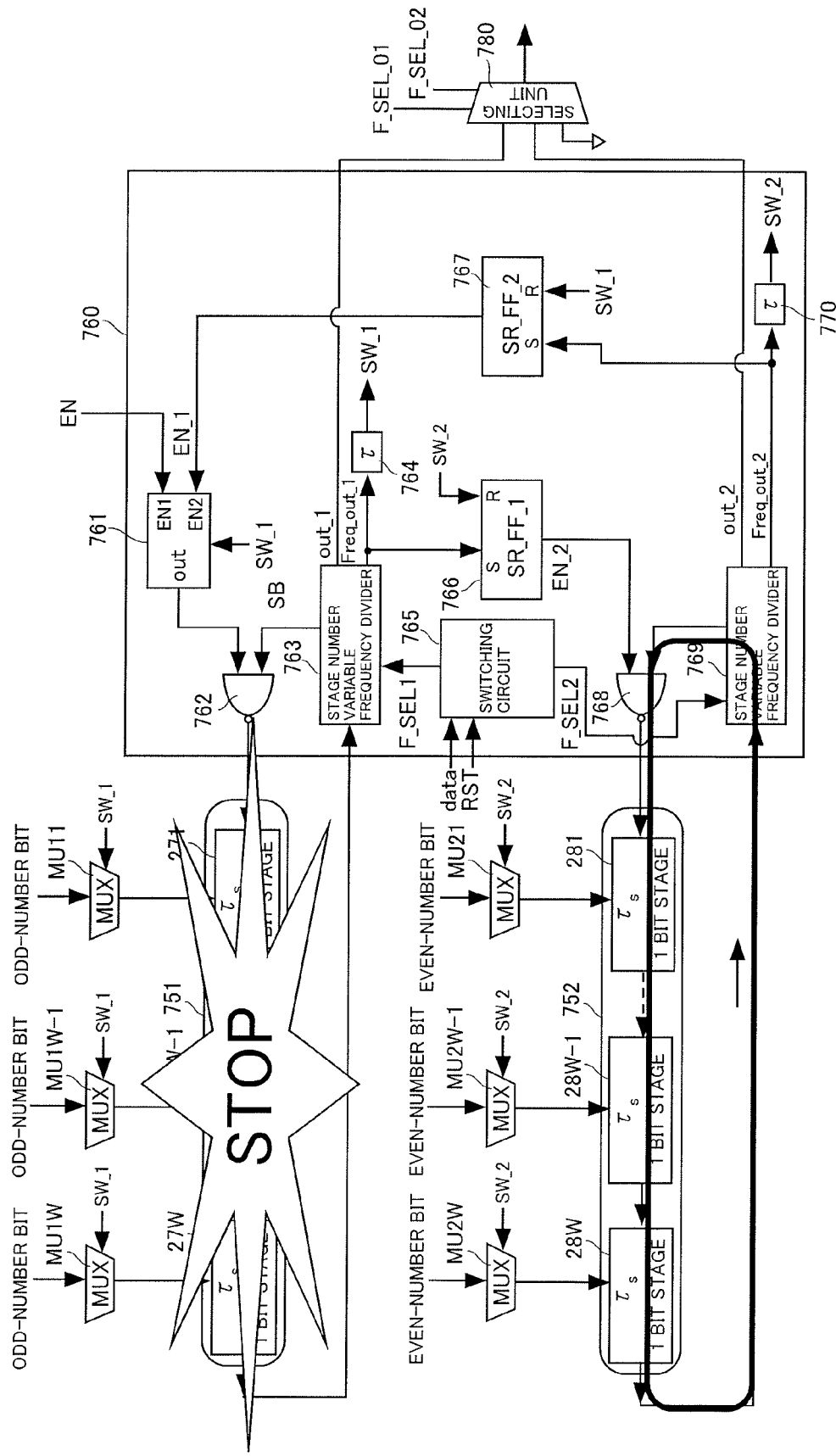
FIG. 42 is second concept view for illustrating the operation of the associative memory including the distance/time conversion circuit shown in FIG. 32.

FIG. 40 is a signal timing chart. FIGS. 41 and 42 are first and second concept views for illustrating the operation of the associative memory 100A including the distance/time conversion circuit $DT'_1B$ shown in FIG. 32.

Once search in the associative memory 100A starts, the unit comparator circuits $UC'_{11}$ to $UC'_{1W}$ output distance signals $M1_1M2_1 \ldots MK_1M1_2M2_2 \ldots MK_2 \ldots M1_WM2_W \ldots MK_W$ between W reference data pieces and search data to the path encoder $PE'_1$. The unit comparator circuits $UC'_{21}$ to $UC'_{2W}$, $UC'_{R1}$ to $UC'_{RW}$ output the distance signal $M1_1M2_1 \ldots MK_1M1_2M2_2 \ldots MK_2 \ldots M1_WM2_W \ldots MK_W$ to the path encoders $PE'_2$ to $PE'_R$, respectively.

The path encoder $PE'_1$ produces distance signals $M1_1M1_2 \ldots M1_W, \ldots M2_1M2_2 \ldots M2_W$, and $MK_1MK_2 \ldots MK_W$ based on the distance signal $M1_1M2_1 \ldots MK_1M1_2M2_2 \ldots MK_2 \ldots M1_WM2_W \ldots MK_W$ in accordance with the method described above. The path encoder $PE'_1$ sequentially outputs the distance signals $M1_1M1_2 \ldots M1_W, \ldots M3_1M3_2 \ldots M3_W, M5_1M5_2 \ldots M5_W, \ldots$ to the multiplexers MU11 to MU1W, and distance signals $M2_1M2_2 \ldots M2_W, M4_1M4_2 \ldots M4_W, M6_1M6_2 \ldots M6_W, \ldots$ to the multiplexers MU21 to MU2W. The path encoders $PE'_2$ to $PE'_R$ operate in the same manner.

In the distance/time conversion circuit $DT'_1$ (=distance/time conversion circuit $DT'_1B$), the multiplexer MU11 sequentially receives odd-number bit distance signals $M1_1$, $M3_1, M5_1, \ldots$, the multiplexer MU12 sequentially receives odd-number bit distance signals $M1_2, M3_2, M5_2, \ldots$, and thereafter, in the same manner, the multiplexer MU1W-1 sequentially receives odd-number bit distance signals $M1_{W-1}, M5_{W-1} \ldots$ and the multiplexer MU1W sequentially receives odd-number bit distance signals $M1_W, M3_W, M5_W \ldots$ The multiplexer MU21 sequentially receives even-number bit distance signals $M2_1, M4_1, M6_1, \ldots$, and the multiplexer MU22 sequentially receives even-number bit distance signals $M2_2, M4_2, M6_2, \ldots$, and thereafter in the same manner, the multiplexer MU2W-1 sequentially receives even-number bit distance signals $M2_{W-1}, M4_{W-1}, M6_{W-1} \ldots$, the multiplexer MU2W sequentially receives even-number bit distance signals $M2_W, M4_W, M6_W \ldots$ In the multiplexer MUM the gate 295 receives a signal $EN_{11}$ composed of "1" from the shift register 291 and the gates 296 to 298 receive signals $EN_{12}$ to EN14 composed of "0" from shift registers 292 to 295, respectively, and therefore the multiplexer MU11 outputs the first-bit distance signal M11 to the 1-bit stage 271. The multiplexers MU12 to MU1W output the first-bit distance signals $M1_2$ to $M1_W$ to the 1-bit stages 272 to 27W, respectively in the same manner.

The multiplexers MU21 to MU2W output the second-bit distance signals $M2_1$ to $M2_W$ to the 1-bit stages 281 to 28W, respectively in the same manner.

The enable signal EN is of "0" in timings before timing $t_4$, and therefore the EN selecting circuit 761 outputs a signal composed of "0" to the NAND circuit 762 and the NAND circuit 762 outputs a signal composed of "1" to the 1-bit stages 271 regardless of whether the signal from the stage number variable frequency divider 763 is "0" or "1".

As a result, when the number of the 1-bit stages 271 to 27W is even, the 1-bit stages 27W outputs a signal composed of "1" to the stage number variable frequency divider 763 in timings before timing t4. The stage number variable frequency divider 763 outputs a signal CH_1_out composed of "1" to the NAND circuit 762.

Thereafter, when the enable signal EN composed of "1" is input to the EN selecting circuit 761 from the control circuit for the associative memory 100A in timing t4, the selecting unit 7611 outputs the enable signal EN composed of "1" to the OR circuit 7613 since the signal SW_1 is composed of "0" and the OR circuit 7613 outputs the enable signal EN composed of "1" to the NAND circuit 762 since a signal received at the terminal EN2 is composed of "0".

The NAND circuit 762 receives the enable signal EN composed of "1" from the EN selecting circuit 761 and the signal CH_1_out composed of "1" from the stage number variable frequency divider 763. Then, the NAND circuit 762 operates the logical product of the enable signal EN composed of "1" and the signal CH_1_out composed of "1", inverts the operated logical product and outputs a signal composed of "0" to the 1-bit stage 271.

The 1-bit stage 271 delays the signal composed of "1" using a delay path selected in response to the distance signal $M1_1$, and outputs the delayed signal to the 1-bit stage 272. Then, the 1-bit stages 272 to 27W delay signals output from the 1-bit stages 271 to 27W−1 using delay paths selected by the distance signals $M1_2$ to $M1_W$, respectively, to output. The 1-bit stages 27W outputs the output signal CH_1_out through the nodes $N_{91}$ and $N_{92}$ of the stage number variable frequency divider 763 to the NAND circuit 762 and the NAND circuit 762 operates the logical product of the enable signal EN composed of "1" and the signal CH_1_out and inverts the operated logical product for output to the 1-bit stage 271.

As a result, the 1-bit stages 271 to 27W are connected in a ring shape through the stage number variable frequency divider 763 and the NAND circuit 762 and alternately receive a signal composed of "0" and a signal composed of "1" from the NAND circuit 762 and therefore oscillate an oscillation signal.

Note that when the number of the 1-bit stages 271 to 27W are odd, the 1-bit stage 27W outputs a signal composed of "0" in timing earlier than timing t4 to the stage number variable frequency divider 763 and the stage number variable frequency divider 763 outputs the signal CH_1_out composed of "0" to the NAND circuit 762. Then, in timing t4, the NAND circuit 762 outputs a signal composed of "1" to the 1-bit stage 271 based on the signal composed of "1" from the EN selecting circuit 761 and the signal CH_1_out composed of "0" from the stage number variable frequency divider 763. Then, the 1-bit stages 271 to 27W receive the signal composed of "0" and the signal composed of "1" alternately from the NAND circuit 762 as described above, and therefore oscillates an oscillation signal.

The 1-bit stages 271 to 27W oscillate an oscillation signal regardless of whether the number is an odd-number or an even-number.

On the other hand, the flip-flop 766 receives a signal Freq_out_1 composed of "0" from the stage number variable frequency divider 763 and outputs a signal EN_2 composed of "0" to the NAND circuit 768, and the NAND circuit 768 outputs a signal composed of consecutive "1" to the 1-bit stage 281, so that the oscillation circuit 752 is in a stopped state (see FIG. 41).

In the switching circuit 765, the OR circuit 7651 receives a signal FSEL_SET of a single pulse waveform and signals SW_1 and SW_2 composed of "0", and therefore outputs a signal FSEL_SET of a single pulse waveform to the terminal CLK of the shift register 7652. The shift register 7652 outputs the selection signal F_SEL17="1" and the selection signals F_SEL16 to F_SEL10="0" to the selectors 7654 and 7655 when the signal F_SEL_SET received at the terminal CLK rises and then falls.

The selector 7654 outputs selection signals F_SEL17="1", F_SEL15="0", F_SEL13="0", F_SEL11="0", and F_SEL10="0" to the stage number variable frequency divider 763 based on the selection signal F_SEL17="1" and the selection signals F_SEL16 to F_SEL10="0" and a signal even composed of "1".

The selector 7655 outputs selection signals F_SEL16="0", F_SEL14="0", F_SEL12="0", and F_SEL10="0" to the stage number variable frequency divider 769 based on the selection signal F_SEL17="1", the selection signals F_SEL16 to F_SEL10="0" and a signal even composed of Then, the stage number variable frequency divider 763 receives the selection signals F_SEL17="1", F_SEL15="0", F_SEL13="0", F_SEL11="0", and F_SEL10="0" from the switching circuit 765, so that the gates 7641, 7643, 7645, and 7647 are closed and only the gate 7649 is opened.

As a result, the oscillation signal CH_1_out output from the oscillation circuit 751 is frequency-divided by $2^7$ times by the frequency dividers 7633 to 7639, and the stage number variable frequency divider 763 outputs the signal Freq_out_1 to the delay circuit 764 and the flip-flop 766 in timing t5.

The delay circuit 764 delays the signal Freq_out_1 by $\tau$ to produce the signal SW_1 and outputs the produced signal SW_1 to the EN selecting circuit 761, the multiplexers MU11 to MU1W, the switching circuit 765, and the flip-flop 767.

The multiplexers MU11 to MU1W receive the signal SW_1. The shift register 292 outputs a signal $EN_{12}$ composed of "1" to the gate 296 when the signal SW_1 rise and then falls in timing t6, and the shift registers 291, 293, and 294 output signals EN11, EN13, and EN14 composed of "0", respectively to the gates 295, 297, and 298. As a result, the multiplexer MU11 outputs the third-bit distance signal $M3_1$ to the 1-bit stage 271 in timing t6. The multiplexers MU12 to MU1W similarly outputs the third-bit distance signals $M3_2$ to $M3_W$ to the 1-bit stages 272 to 27W in timing t6, respectively.

On the other hand, upon receiving the signal Freq_out_1 in timing t5 from the stage number variable frequency divider 763, the flip-flop 766 produces and outputs a signal EN_2 based on the signal Freq_out_1 to the NAND circuit 768 because the signal SW_2 is composed of "0".

The NAND circuit 768 operates the logical product of the signal EN_2 from the flip-flop 766 and the signal CH_2_out (="0") from the stage number variable frequency divider 769, inverts the operated logical product and outputs a signal composed of "1" to the 1-bit stages 281.

The 1-bit stages 281 to 28W have already received the second bit distance signals $M2_1$ to $M2_W$ from the multiplexers MU21 to MU2W, respectively. Therefore, the 1-bit stages 281 to 28W oscillates the oscillation signal CH_2_out based on a signal from the NAND circuit 768 and output the oscillated oscillation signal CH_2_out to the stage number variable frequency divider 769. In this case, the EN selecting circuit 761 receives the enable signal EN composed of "0" from the control circuit for the associative memory 100A and a signal composed of "0" from the flip-flop 767 and therefore outputs a signal composed of "0" to the NAND circuit 762 in timing t6 in which the signal SW_1 rises and then falls. The NAND circuit 762 receives the signal composed of "0" from the EN selecting circuit 761 and therefore outputs a signal composed of consecutive "1" to the 1-bit stage 271. Therefore, the oscillation circuit 751 does not oscillate an oscillation signal and is in a stopped state (see FIG. 42).

On the other hand, the shift register 7652 of the switching circuit 765 outputs selection signals F_SEL16="1", and F_SEL17=F_SEL15 to F_SEL10="0" to the selectors 7654 and 7655.

The selector 7654 outputs a selection signals F_SEL17=F_SEL15=F_SEL13=F_SEL11=F_SEL10="0" to the stage number variable frequency divider 763 based on the selection signals F_SEL16="1", F_SEL17=F_SEL15 to F_SEL10="0" and a signal even composed of "1". The selector 7655 outputs a selection signal F_SEL16="1" and a selection signals F_SEL14=F_SEL12=F_SEL="0" to the stage number variable frequency divider 769 based on the selection signals F_SEL16="1", F_SEL17=F_SEL15 to F_SEL10="0" and a signal even composed of "1".

Then, the stage number variable frequency divider 769 receives the selection signals F_SEL16="1" and F_SEL14=F_SEL12=F_SEL10="0", so that the gates 7641, 7644, and 7646 are closed and only the gate 7648 is opened.

The stage number variable frequency divider 769 frequency-divides the oscillation signal CH_2_out with six frequency dividers 7634 to 7639 and outputs a signal Freq_out_2 to the flip-flop 767 and the delay circuit 770 in timing t7.

The delay circuit 770 delays the signal Freq_out_2 by τ and outputs a signal SW_2 to the multiplexers MU21 to MU2W, the switching circuit 765 and the flip-flop 766.

The multiplexers MU21 to MU2W receive the signal SW_2. When the signal SW_2 rises and then falls in timing t8, the shift register 292 outputs a signal EN$_{12}$ composed of "1" to the gate 296 and the shift registers 291, 293, and 294 output signals EN11, EN13, and EN14 composed of "0" to the gates 295, 297, and 298, respectively. As a result, the multiplexer MU21 outputs the fourth bit distance signal M4$_1$ to the 1-bit stages 281 in timing t8. The multiplexer MU22 to MU2W similarly output the fourth bit distance signals M4$_2$ to M4$_W$ to the 1-bit stages 282 to 28W in timing t8.

On the other hand, upon receiving the signal Freq_out_2 in timing t7, the flip-flop 767 produces a signal EN_1 based on the received signal Freq_out_2 and outputs the produced signal EN_1 to the EN selection circuit 761.

In timing t7, the signal SW_1="0" and therefore the selecting unit 7611 outputs a signal composed of "0" to the OR circuit 7613 and the OR circuit 7613 outputs a signal EN_1 composed of "1" to the NAND circuit 762 based on the signal composed of "0" and the signal EN_1 composed of "1".

The NAND circuit 762 then operates the logical product of the signal EN_1 composed of "1" and the signal CH_1_out(="0") from the stage number variable frequency divider 763 and outputs a signal composed of "1" which is the inverse of the obtained logical product to the 1-bit stage 271.

The 1-bit stages 271 to 27W receive the third bit distance signals M3$_1$ to M3$_W$ from the multiplexers MU11 to MU1W, respectively in timing t6.

Therefore, the 1-bit stages 271 to 27W delay signals using delay paths selected in response to the third bit distance signals M3$_1$ to M3$_W$, oscillate the oscillation signal CH_1_out and outputs the oscillated oscillation signal CH_1_out to the stage number variable frequency divider 763. In this case, the flip-flop 766 receives a signal SW_2 composed of "0" from the delay circuit 770, and therefore outputs a signal EN_2 composed of "0" to the NAND circuit 768. As a result, the NAND circuit 768 outputs a signal composed of consecutive "1" to the 1-bit stage 281, so that the oscillation circuit 752 is in an inactive state (see FIG. 41).

On the other hand, when the signal SW_2 falls in timing t8, the shift register 7652 of the switching circuit 765 outputs selection signals F_SEL15="1", F_SEL17=F_SEL16=F_SEL14 to F_SEL11="0" to the selectors 7654 and 7655.

Upon receiving the signal even composed of "1" from the control circuit for the associative memory 100A, the selector 7654 outputs selection signals F_SEL15="1" and F_SEL=17=F_SEL13=F_SEL11=F_SEL10="0" to the stage number variable frequency divider 763 based on the selection signals F_SEL15="1" and F_SEL17=F_SEL16=F_SEL14 to F_SEL10="0" and the signal even composed of "1". The selector 7655 outputs selection signals F_SEL16=F_SEL14=F_SEL12=F_SEL10="0" to the stage number variable frequency divider 769 based on the selection signals F_SEL15="1" and F_SEL17=F_SEL16=F_SEL14 to F_SEL10="0" and the signal even composed of "1".

Then, the stage number variable frequency divider 763 receives the selection signals F_SEL15="1" and F_SEL17=F_SEL13=F_SEL11=F_SEL10="0", so that the gates 7641, 7643, and 7649 are closed and only the gate 7647 is opened.

The stage number variable frequency divider 763 frequency-divides the oscillation signal CH_1_out with five frequency dividers 7633 to 7637 and outputs a signal Freq_out_1 to the delay circuit 764 and the flip-flop 766 in timing t9.

The delay circuit 764 delays the signal Freq_out_1 by τ and output the signal SW_1 to the multiplexers MU11 to MU1W, the EN selection circuit 761, the switching circuit 765, and the flip-flop 767.

Thereafter, the above-described operation is repeatedly carried out and the oscillation circuits 751 and 752 alternately oscillate oscillation signals, the stage number variable frequency divider 763 frequency-divides an oscillation signal from the oscillation circuit 751 by $2^7$, $2^5$, $2^3$ and 2 times, and the stage number variable frequency divider 769 frequency-divides an oscillation signal from the oscillation circuit by $2^6$, $2^4$, $2^2$, and 1 times. When the frequency dividing in the stage number variable frequency divider 769 ends, the switching circuit 765 outputs selection signals F_SEL17=F_SEL15=F_SEL13=F_SEL11="0" and F_SEL10="1" to the stage number variable frequency divider 763 and selection signals F_SEL16=F_SEL14=F_SEL12="0" and F_SEL10="1" to the stage number variable frequency divider 769. The switching circuit 765 outputs F_SEL10="1" as a selection signal F_SEL_02 to the selecting unit 780.

Then, the stage number variable frequency divider 763 produces an oscillation signal produced by sequentially carrying out frequency dividing by $2^7$, $2^5$, $2^3$ and 2 times based on the selection signal F_SEL17=F_SEL15=F_SEL13=F_SEL11="0" and F_SEL10="1" and outputs the produced signal as a signal out_1 to the selecting unit 780. The stage number variable frequency divider 769 produces an oscillation signal produced by sequentially carrying out frequency dividing by $2^6$, $2^4$, $2^2$ and 1 times based on selection signals F_SEL16=F_SEL14=F_SEL12="0" and F_SEL10="1" and outputs the produced signal as a signal out_2 to the selecting unit 780.

The selecting unit 780 selects the signal out_2 in response to the selection signal F_SEL_02="1" and outputs the selected signal out_2 as an oscillation signal S$_1$ to the frequency divider circuit 20.

Note that the distance/time conversion circuits $DT'_2$ to $DT'_R$ each carry out the above-described operation to output oscillation signals $S_2$ to $S_R$, respectively to the frequency divider circuit 20.

The operation in the frequency divider circuit 20 and the time domain WTA circuit 30 is as described above.

As described above, when the distance/time conversion circuits $DT'_1$ to $DT'_R$ each consist of the distance/time conversion circuit $DT'_1B$ shown in FIG. 32, the oscillation circuit 751 oscillates an oscillation signal using a delay path selected in response to a distance signal for odd-number bits of each reference data piece and search data, and the oscillation circuit 752 oscillates an oscillation signal using a delay path selected in response to a distance signal for even-number bits of each reference data piece and search data. In this case, the oscillation circuits 751 and 752 each convert distance signals into oscillation signals sequentially from the distance signal for the most significant bits to the distance signal for the least significant bits.

The stage number variable frequency divider 763 receives, from the oscillation circuit 751, an oscillation signal produced by converting a first distance signal that represents a result of comparison between corresponding odd-numbered bits from the most significant bits of the reference data and search data, and frequency-divides the oscillation signal received from the oscillation circuit 751 by a smaller number as the first distance signal represents a result of comparison between lower bits and outputs the result to the oscillation circuit 752. The stage number variable frequency divider 769 receives, from the oscillation circuit 752, an oscillation signal produced by converting a second distance signal that represents a result of comparison between corresponding even-numbered bits from the most significant bits of the reference data and search data and frequency-divides the oscillation signal received from the oscillation circuit 752 by a smaller number as the second distance signal represents a result of comparison between lower bits and outputs the result to the oscillation circuit 751.

In this way, the oscillation circuit 751 and the stage number variable frequency divider 763, and the oscillation circuit 752 and the stage number variable frequency divider 769 operate alternately, frequency-divide an oscillation signal by a greater number for a more significant bit, and converts a distance signal into an oscillation signal.

Therefore, the time required for searching in the associative memory 100A can be reduced as described above.

Note that in the above description, the bit number K of the reference data and search data is 8 but the associative memory 100A including the distance/time conversion circuit $DT'_1B$ can search for reference data that matches the search data even if the bit number K is other than 8.

More specifically, when the bit number K of reference data and search data is 6, signals SHIFT_ODDBIT_SET and SHIFT_evenBIT_SET each consist of two consecutive pulse waveforms and a signal FSEL_SET consists of three consecutive pulse waveforms.

When the bit number K of both reference data and search data is 6, the multiplexer MU11 and MU1W receive odd-numbered bits, i.e., a third bit, a fifth bit, and a seventh bit from the path encoder $PE'_1$. When the bit number K of the reference data and search data is 6, the multiplexers MU21 to MU2W receive even-numbered bits, i.e., a fourth bit and a sixth bit from the path encoder $PE'_1$.

In each of the multiplexers MU11 to MU1W, the shift register 291 receives data composed of "1" at the terminal D from the control circuit for the associative memory 100A, and the shift registers 292 to 294 receive data composed of "0" from the shift registers 291 to 293 at the terminals D.

In each of the multiplexers MU11 to MU1W, the shift register 291 outputs data composed of "1" from the terminal Q to the shift register 292 and the gate 295 when the signal SHIFT_ODDBIT_SET rises and then falls according to the first pulse waveform. In each of the multiplexers MU11 to MU1W, the shift register 292 outputs data composed of "0" from the terminal Q to the shift register 293 and the gate 296 when the signal SHIFT_ODDBIT_SET rises and then falls according to the first pulse waveform, and the shift register 293 outputs data composed of "0" from the terminal Q to the shift registers 294 and the gate 297 when the SHIFT_ODDBIT_SET rises and then falls according to the first pulse waveform, and the shift register 294 outputs data composed of "0" from the terminal Q to the gate 298 when the signal SHIFT_ODDBIT_SET rises and then falls according to the first pulse waveform.

As a result, the multiplexers MU11 to MU1W outputs the first bit data (composed of "0" when the bit number K is 6) to the 1-bit stages 271 to 27W according to a signal $EN_{11}$ composed of "1", a signal $EN_{12}$ composed of "0", a signal $EN_{13}$ composed of "0", and a signal EN14 composed of "0".

Then, in each of the multiplexers MU11 to MU1W, the shift register 291 outputs data composed of "0" from the terminal Q to the shift register 292 and the gate 295 when the SHIFT_ODDBIT_SET rises and then falls according to the second pulse waveform. In each of the multiplexers MU11 to MU1W, the shift register 292 outputs data composed of "1" from the terminal Q to the shift register 293 and the gate 296 when the signal SHIFT_ODDBIT_SET rises and then falls according to the second pulse waveform, the shift register 293 outputs data composed of "0" from the terminal Q to the shift register 294 and the gate 297 when the signal SHIFT_ODDBIT_SET rises and then falls according to the second pulse waveform, and the shift register 294 outputs data composed of "0" from the terminal Q when the signal SHIFT_ODDBIT_SET rises and then falls according to the second pulse waveform.

As a result, the multiplexers MU11 to MU1W output the third bit as an odd-numbered bit to the 1-bit stages 271 to 27W according to a signal EN11 composed of "0", a signal EN12 composed of "1", a signal EN13 composed of "0" and a signal EN14 composed of "0".

Then, as described above, the multiplexers MU11 to MU1W sequentially output odd-numbered bits, i.e., the fifth bit and the seventh bit to the 1-bit stages 271 to 27W when the signal SW_1 rises and then falls.

As described above, when the bit number K of the reference data and search data is 6, the SHIFT_ODDBIT_SET in two consecutive pulse waveforms is input to the multiplexers MU11 to MU1W, so that the multiplexers MU11 to MU1W output the odd-numbered bit, i.e., the first bit composed of "0" to the 1-bit stages 271 to 27W and then immediately output the odd-numbered bit, i.e., the third bit (that represents a comparison result of search data and reference data) to the 1-bit stages 271 to 27W, respectively.

Similarly to the MU11 to MU1W, immediately after outputting the second bit, even bit (composed of "0" when the bit number K is 6) to the 1-bit stages 281 to 28W, the multiplexers MU21 to MU2W output the even-numbered bit, i.e., the fourth bit (that represents a result of comparison between search data and reference data) to the 1-bit stages 281 to 28W, respectively.

Therefore, when the bit number K of reference data and the search data is 6, the multiplexers MU11 to MU1W sequentially output odd bits i.e., the third bit, the fifth bit and the seventh bit to the 1-bit stages 271 to 27W in response to a signal SHIFT_ODDBIT_SET consisting of two consecutive pulse waveforms while substantially ignoring the first odd number bit, and the multiplexer MU21 to MU2W sequentially output even bits i.e., the fourth bit and the sixth bits to the 1-bit stages 281 to 28W in response to a signal SHIFT_evenBIT_SET consisting of two consecutive pulse waveforms while substantially ignoring the second even number bit.

On the other hand, when the bit number K is 6 for both reference data and search data, the shift register 7652 of the switching circuit 765 receives a signal FSEL_SET consisting of three consecutive pulse waveforms at the terminal CLK from the OR circuit 7651.

In the shift register 7652, the shift register 331 outputs a selection signal F_SEL17 consisting of "1" when the first pulse waveform of the signal FSEL_SET rises and then falls, and the shift registers 332 to 338 output selection signals F_SEL16 to F_SEL10 consisting of "0", respectively when the first pulse waveform of the signal FSEL_SET rises and then falls.

In the shift register 7652, the shift register 332 outputs a selection signal F_SEL16 consisting of "1" when the second pulse waveform of the signal FSEL_SET rises and then falls, and the shift registers 331 and 333 to 338 output selection signals F_SEL17 and F_SEL15 to F_SEL10 consisting of "0", respectively when the second pulse waveform of the signal FSEL_SET rises and then falls.

Then, in the shift register 7652, the shift register 333 outputs a selection signal F_SEL15 consisting of "1" when the third pulse waveform of the signal FSEL_SET rises and then falls, and the shift registers 331, 332 and 334 to 338 output selection signals F_SEL17, F_SEL16, and F_SEL14 to F_SEL10 consisting of "0", respectively when the third pulse waveform of the signal FSEL_SET rises and then falls. In this way, the shift register 7652 outputs the selection signals F_SEL17 to F_SEL10 in the three patterns in response to the three consecutive pulse waveform of the signal FSEL_SET.

Then, the selectors 7654 and 7655 each consecutively receive selection signals F_SEL17="1", F_SEL16=F_SEL15=F_SEL14=F_SEL13=F_SEL12=F_SEL11=F_SEL10="0", F_SEL16="1", F_SEL17=F_SEL15=F_SEL14=F_SEL13=F_SEL12=F_SEL11=F_SEL10="0", F_SEL15="1", and F_SEL17=F_SEL16=F_SEL14=F_SEL13=F_SEL12=F_SEL11=F_SEL10="0".

The selector 7654 receives a signal even consisting of "1" when it finally receives selection signals F_SEL15="1", F_SEL17=F_SEL16=F_SEL14=F_SEL13=F_SEL12=F_SEL11=F_SEL10="0", and therefore it outputs selection signals F_SEL1 (consisting of F_SEL15="1", F_SEL17="0", F_SEL 13="0", F_SEL11="0", and F_SEL 10="0") to the stage number variable frequency divider 763. Here, since the bit number K is 6 for the reference data and the search data, the selectors 7654 and 7655 receive a signal even consisting of "1" from the control circuit for the associative memory 100A.

When the selector 7655 finally receives selection signals F_SEL15="1", and F_SEL17=F_SEL16=F_SEL14=F_SEL13=F_SEL12=F_SEL11=F_SEL10="0", it receives a signal even consisting of "1", so that the selector 7655 outputs a selection signal F_SEL2 (consisting of F_SEL16="0", F_SEL14="0", F_SEL 12="0", and F_SEL 10="0") to the stage number variable frequency divider 769.

The 1-bit stages 271 to 27W of the oscillation circuit 751 delays a signal by a delay path selected in response to the odd bit at the third bit to produce an oscillation signal and the 1-bit stage 27W outputs the produced oscillation signal to the stage number variable frequency divider 763.

Then, the stage number variable frequency divider 763 frequency-divides the oscillation signal received from the 1-bit stages 27W by $2^5$ times with frequency dividers 7633 to 7637 in response to the selection signal F_SEL1 (consisting of F_SEL15="1" and F_SEL17="0", SEL13="0", F_SEL11="0", F_SEL10="0") and outputs the resultant signal to the NAND circuit 762 and the delay circuit 764 from node $N_{94}$.

On the other hand, the stage number variable frequency divider 769 stops operating in response to the selection signal F_SEL2 (of F_SEL16="0", F_SEL14="0", F_SEL 12="0", and F_SEL 10="0").

The shift register 7652 of the switching circuit 765 receives the signal SW_1 at the terminal CLK after the signal FSEL_SET falls according to the third pulse waveform and outputs a selection signal F_SEL14 consisting of "1", selection signals F_SEL17, F_SEL 15, and F_SEL 13 to F_SEL10 consisting of "0" when the signal SW_1 rises and then falls.

The selector 7654 in the switching circuit 765 receives a signal even consisting of "1" from the control circuit for the associative memory 100A. Then, the selector 7654 outputs a selection signal F_SEL1 (consisting of F_SEL17="0", F_SEL 15="0", F_SEL 13, F_SEL11="0", and F_SEL10="0") to the stage number variable frequency divider 763 based on the selection signal F_SEL14 consisting of "1", selection signals F_SEL17, F_SEL 15, and F_SEL 13 to F_SEL10 consisting of "0" and the signal even consisting of "1". The selector 7655 in the switching circuit 765 outputs a selection signal F_SEL2 (consisting of selection signals F_SEL16="0", F_SEL 14="1", F_SEL 12="0", and F_SEL10="0") to the stage number variable frequency divider 769 based on the selection signals F_SEL14 consisting of "1" the selection signals F_SEL17, F_SEL15, F_SEL13 to F_SEL10 consisting of "0", and the signal even consisting of "1".

The 1-bit stages 281 to 28W in the oscillation circuit 752 delay an oscillation signal though a delay path selected by the even bit at the fourth bit to produce an oscillation signal. Then, the 1-bit stage 28W outputs the produced oscillation signal to the stage number variable frequency divider 769.

Then, the stage number variable frequency divider 763 stops operating in response to the selection signal F_SEL1 (consisting of F_SEL17="0", F_SEL 15="0", F_SEL 13="0", F_SEL11="0", and F_SEL10="0"). On the other hand, the stage number variable frequency divider 769 frequency-divides the oscillation signal received from the 1-bit stages 28W by $2^4$ times with the frequency dividers 7634 to 7637 in response to the selection signal F_SEL2 (consisting of selection signals F_SEL16="0", F_SEL 14="1", F_SEL 12="0", and F_SEL10="0") and outputs the result to the NAND circuit 768 and the delay circuit 770 from the node $N_{94}$.

Then, the distance/time conversion circuit $DT'_1B$ carries out alternation between producing of an oscillation signal by the oscillation circuit 751 and frequency dividing of the oscillation signal by the stage number variable frequency divider 763, and producing of an oscillation signal by the oscillation circuit 752 and frequency dividing of the oscillation signal by the stage number variable frequency divider 769 and outputs an oscillation signal $S_1$ from the selecting unit 780 to the frequency divider circuit 20.

When the bit number K of search data and reference data is 6, the distance/time conversion circuit $DT'_2$ ($=DT'_1B$) to $DT'_R$($=DT'_1B$) produce oscillation signals $S_2$ to $S_R$, respectively, and output the produced oscillation signals $S_2$ to $S_R$ to the frequency divider circuit 20 by the above-described operation.

In this way, when the bit number K of the search data and reference data is 6, the distance/time conversion circuit $DT'_1$ (=$DT'_1B$) to $DT'_R$(=$DT'_1B$) produce the oscillation signals $S_1$ to $S_R$, respectively for output to the frequency divider 20 using the circuit configuration shown in FIG. 32 by substantially ignoring an odd number bit (the first bit) and an even number bit (the second bit) input to the distance/time conversion circuit $DT'_1$(=$DT'_1B$) to $DT'_R$(=$DT'_1B$) from the path encoders $PE_1$ to $PE'_R$ by the method described above.

When the bit number K of the search data and reference data is 4, the signals SHIFT_ODDBIT_SET and SHIFT_evenBIT_SET are each made of three consecutive pulse waveforms, and the signal FSEL_SET is made of five consecutive pulse waveforms, so that the distance/time conversion circuits $DT'_1$ (=$DT'_1B$) to $DT'_R$ (=$DT'_1B$) produce the oscillation signals $S_1$ to $S_R$, respectively for output to the frequency divider circuit 20 using the circuit configuration shown in FIG. 32 according to the method described above.

When the bit number K of search data and reference data is 2, the signals SHIFT_ODDBIT_SET and SHIFT_evenBIT_SET are each made of four consecutive pulse waveforms and the signal FSEL_SET is made of seven consecutive pulse waveforms, so that the distance/time conversion circuits $DT'_1$ (=$DT'_1B$) to $DT'_R$ (=$DT'_1B$) produce the oscillation signals $S_1$ to $S_R$, respectively for output to the frequency divider circuit 20 using the circuit configuration shown in FIG. 32 according to the method described above.

Therefore, regardless of whether the bit number K for search data and reference data is 2, 4, 6, or 8, the distance/time conversion circuits $DT'_1$ (=$DT'_1B$) to $DT'_R$ (=$DT'_1B$) can produce the oscillation signals $S_1$ to $S_R$, respectively for output to the frequency divider circuit 20 using the circuit configuration shown in FIG. 32 according to the method described above.

Figure 43:
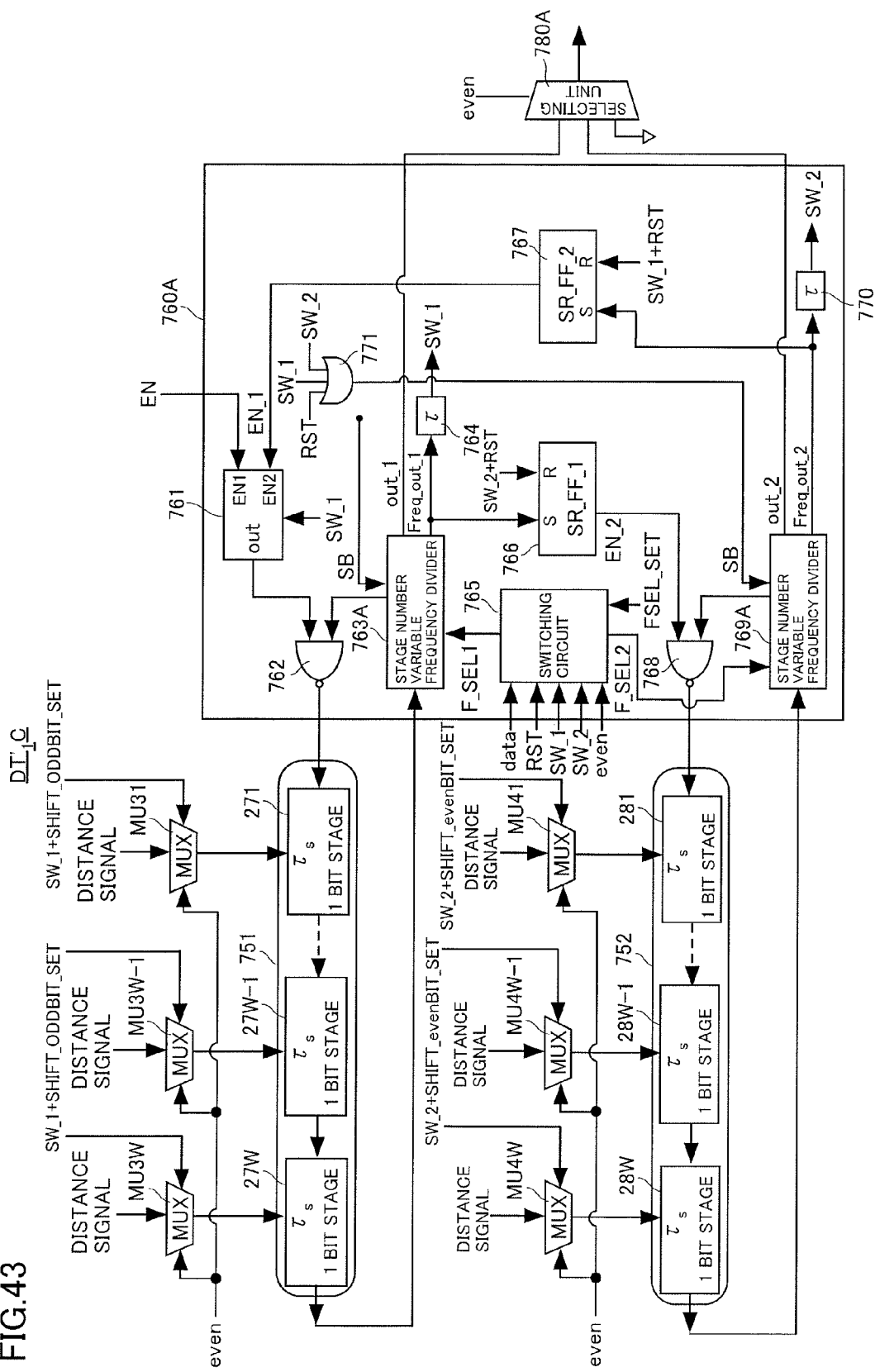
FIG. 43 is a block diagram of another configuration of the distance/time conversion circuit shown in FIG. 28.

FIG. 43 is a block diagram of another configuration of the distance/time conversion circuit shown in FIG. 28. The distance/time conversion circuit $DT'_1$ may be the distance/time conversion circuit $DT'_1C$ shown in FIG. 43.

Referring to FIG. 43, the distance/time conversion circuit $DT'_1C$ is substantially identical to the distance/time conversion circuit $DT'_1B$ except for that multiplexers MU11 to MU1W in the distance/time conversion circuit $DT'_1B$ in FIG. 32 are replaced by multiplexers MU31 to MU3W, the multiplexers MU21 to MU2W are replaced by multiplexers MU41 to MU4W, and the selecting unit 780 is replaced by the selecting unit 780A.

A switching control circuit 760A is substantially identical to the switching control circuit 760 shown in FIG. 32 except for that the stage number variable frequency dividers 763 and 769 in the switching control circuit 760 are replaced by stage number variable frequency dividers 763A and 769A, respectively.

In the distance/time conversion circuit $DT'_1C$, the selection signals $F\_SEL_1$ and $F\_SEL2$ each consist of selection signals F_SEL17 to F_SEL10, the switching circuit 765 outputs a selection signal F_SEL1 (=selection signals F_SEL17 to F_SEL10) to the stage number variable frequency divider 763A and a selection signal F_SEL2 (=selection signals F_SEL17 to F_SEL10) to the stage number variable frequency divider 769A.

The multiplexers MU31 to MU3W are provided corresponding to the 1-bit stages 271 to 27W. The multiplexers MU41 to MU4W are provided corresponding to the 1-bit stages 281 to 28W, respectively.

The multiplexer MU31 receives K-bit distance signals $M1_1, M2_1, \ldots, MK_1$ from the path encoder $PE'_1$, a signal SW_1 from the delay circuit 764, and a signal SHIFT_ODDBIT_SET and a signal even from the control circuit for the associative memory 100A. When the signal even is "1", the multiplexer MU31 sequentially outputs one of odd-numbered bit distance signals $M1_1, M3_1, M5_1, \ldots$ of the K bit distance signals $M1_1, M2_1, \ldots, MK_1$ to the 1-bit stage 271 every time the signal SHIFT_ODDBIT_SET or the signal SW_1 rises and then falls. When the signal even is "0", the multiplexer MU31 sequentially outputs one of even-numbered bit distance signals $M2_1, M4_1, M6_1, \ldots$ of the K bit distance signals $M1_1, M2_1, \ldots, MK_1$ to the 1-bit stage 271 every time the signal SHIFT_ODDBIT_SET or the signal SW_1 rises and then falls.

The multiplexer MU32 receives the K-bit distance signals $M1_2, M2_2, \ldots,$ and $MK_2$ from the path encoder $PE'_1$, the signal SW_1 from the delay circuit 764, and the signal SHIFT_ODDBIT_SET and the signal even from the control circuit (not shown) in the associative memory 100A. When the signal even is "1", the multiplexer MU32 outputs one of the odd-numbered bit distance signals $M1_2, M3_2, M5_2, \ldots$ of the K bit distance signals $M1_2, M2_2, \ldots,$ and $MK_2$ sequentially to the 1-bit stage 272 every time the signal SHIFT_ODDBIT_SET or the signal SW_1 rises and then falls. When the signal even is "0", the multiplexer MU32 outputs one of the even-numbered bit distance signals $M2_2, M4_2, M6_2, \ldots$ among the K bit distance signals $M1_2, M2_2, \ldots,$ and $MK_2$ sequentially to the 1-bit stages 272 every time the signal SHIFT_ODDBIT_SET or the signal SW_1 rises and then falls.

Thereafter, in the same manner, the multiplexer MU3W−1 receives K-bit distance signals $M1_{w-1}, M2_{w-1}, \ldots,$ and $MK_{w-1}$ from the path encoder $PE'_1$, the signal SW_1 from a delay circuit 764, and the signal SHIFT_ODDBIT_SET and the signal even from the control circuit (not shown) in the associative memory 100A. When the signal even is "1", the multiplexer MU3W−1 outputs one of the odd-number bit distance signals $M1_{w-1}, M3_{w-1}, M5_{w-1}, \ldots$ among the K bit distance signals $M1_{w-1}, M2_{w-1}, \ldots,$ and $MK_{w-1}$ sequentially to the 1-bit stage 27W−1 every time the signal SHIFT_ODDBIT_SET or the signal SW_1 rises and then falls. When the signal even is "0", the multiplexer MU3W−1 outputs one of the even-number bit distance signals $M2_{w-1}, M4_{w-1}, M6_{w-1}, \ldots$ among K bit distance signals $M1_{w-1}, M2_{w-1}, \ldots,$ and $MK_{w-1}$ sequentially to the 1-bit stage 27W−1 every time the signal SHIFT_ODDBIT_SET or the signal SW_1 rises and then falls.

The multiplexer MU3W receives K-bit distance signals $M1_w, M2_w,$ and $MK_w$ from the path encoder $PE'_1$, a signal SW_1 from the delay circuit 764, and a signal SHIFT_ODDBIT_SET and a signal even from the control circuit (not shown) in the associative memory 100A. When the signal even is "1", the multiplexer MU3W outputs one of odd-number bit distance signals $M1_w, M3_w, M5_w, \ldots$ among K-bit distance signals $M1_w, M2_w, \ldots,$ and $MK_w$ sequentially to the 1-bit stage 27W every time the signal SHIFT_ODDBIT_SET or the signal SW_1 rises and then falls. When the signal even is "0", the multiplexer MU3W outputs one of the even-number bit distance signals $M2_w, M4_w, M6_w, \ldots$ among K-bit distance signals $M1_w, M2_w, \ldots,$ and $MK_w$ sequentially to the 1-bit stage 27W every time the signal SHIFT_ODDBIT_SET or the signal SW_1 rises and then falls.

On the other hand, the multiplexer MU41 receives K bit distance signals $M1_1, M2_1, \ldots, MK_1$ from path encoder $PE'_1$, the signal SW_2 from the delay circuit 770, and a signal SHIFT evenBIT_SET and a signal even from the control circuit for the associative memory 100A. When the signal even is "1", the multiplexer MU41 outputs one of even-numbered bit distance signals $M2_1, M4_1, M6_1, \ldots$, among the K bit distance signals $M1_1, M2_1, \ldots MK_1$ sequentially to the 1-bit stage 281 every time the signal SHIFT_evenBIT_SET or the signal SW_2 rises and then falls. When the signal even is "0", the multiplexer MU41 outputs odd-numbered bit distance signals $M1_1, M3_1, M5_1, \ldots$ among the K bit distance signals $M1_1, M2_1, \ldots MK_1$ sequentially to the 1-bit stage 281 every time the SHIFT_evenBIT_SET or the signal SW_2 rises and then falls.

The multiplexer MU42 receives K-bit distance signals $M1_2, M2_2, \ldots$, and $MK_2$ from the path encoder PE'$_1$, the signal SW_2 from a delay circuit 770, and the signal SHIFT_evenBIT_SET and the signal even from the control circuit for the associative memory 100A. When the signal even is "1", the multiplexer MU42 outputs one of the even-number bit distance signals $M2_2, M4_2, M6_2, \ldots$ among the K bit distance signals $M1_2, M2_2, \ldots MK_2$ sequentially to the 1-bit stage 282 every time the SHIFT_evenBIT_SET or the signal SW_2 rises and then falls. When the signal even is "0", the multiplexer MU42 outputs one of the odd-number bit distance signals $M1_2, M3_2, M5_2, \ldots$ among the K bit distance signals $M1_2, M2_2, \ldots MK_2$ sequentially to the 1-bit stage 282 every time the SHIFT_evenBIT_SET or the signal SW_2 rises and then falls.

Thereafter, in the same manner, the multiplexer MU4W−1 receives K-bit distance signals $M1_{w-1}, M2_{w-1}, \ldots$, and $MK_{w-1}$ from the path encoder PE'$_1$, the signal SW_2 from the delay circuit 770, and the signal SHIFT_evenBIT_SET and the signal even from the control circuit (not shown) in the associative memory 100A. When the signal eve is "1", the multiplexer MU4W−1 outputs one of the even-number bit distance signals $M2_{w-1}, M4_{w-1}, M6_{w-1}, \ldots$ of K-bit distance signals $M1_{w-1}, M2_{w-1}, \ldots$, and $MK_{w-1}$ sequentially to the 1-bit stage 28W−1 every time the signal SHIFT_evenBIT_SET or the signal SW_2 rises and then falls. When the signal even is "0", the multiplexer MU4W−1 outputs odd-number bit distance signals $M1_{w-1}, M3_{w-1}, M5_{w-1}, \ldots$ among K-bit distance signals $M1_{w-1}, M2_{w-1}$, and $MK_{w-1}$ sequentially to the 1-bit stage 28W−1 every time the signal SHIFT_evnBIT_SET or the signal SW_2 rises and then falls.

The multiplexer MU4W receives K-bit distance signals $M1_W, M2_W$, and $MK_W$ from the path encoder PE'$_1$, the signal SW_2 from the delay circuit 770, and the signal SHIFT_evenBIT_SET and the signal even from the control circuit (not shown) in the associative memory 100A. When the signal even is "1", the multiplexer MU4W outputs one of the even-number bit distance signals $M2_1, M4_1, M6_1, \ldots$ of K-bit distance signals $M1_W, M2_W$, and $MK_W$ sequentially to the 1-bit stage 28W every time the signal SHIFT_evenBIT_SET or the signal SW_2 rises and then falls. When the signal even is "0", the multiplexer MU4W outputs one of odd-number bit distance signals $M1_W, M3_W, M4_W, \ldots$ among K-bit distance signals $M1_W, M2_W, \ldots$, and $MK_W$ sequentially to the 1-bit stage 28W every time the signal SHIFT_evenBIT_SET or the signal SW_2 rises and then falls.

Note that in the distance/time conversion circuit DT'$_1$C, when the signal even is "1", the pulse number of the signal SHIFT_ODDBIT_SET is the same as that of the signal SHIFT_evenBIT_SET, and when the signal even is "0", the pulse number of the signal SHIFT_evenBIT_SET is larger than that of the signal SHIFT_ODDBIT_SET by one.

The selecting unit 780A receives a signal even from the control circuit for the associative memory 100A, a signal out_1 from the stage number variable frequency divider 763A, and a signal out_2 from the stage number variable frequency divider 769A.

When the signal even is "0", the selecting unit 780A outputs the signal out_1 as an oscillation signal $S_1$ to the frequency divider circuit 20. When the signal even is "1", the selecting unit 780A outputs the signal out_2 as an oscillation signal $S_1$ to the frequency divider circuit 20.

Note that the distance/time conversion circuits DT'$_2$ to DT'$_R$ each have the same configuration as that of the distance/time conversion circuit DT'$_1$C shown in FIG. 43.

Figure 44:
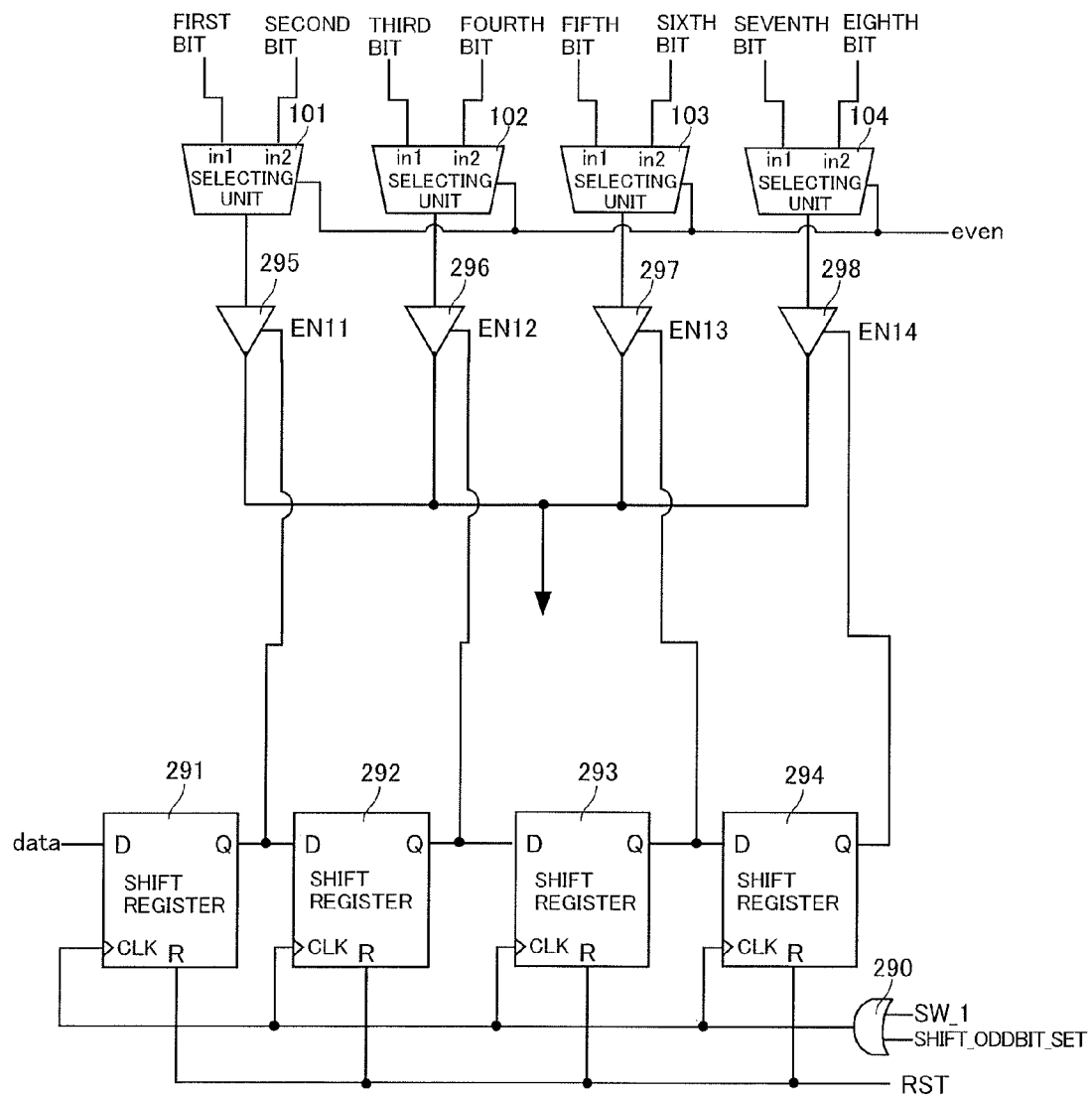
FIG. 44 is a circuit diagram of a multiplexer shown in FIG. 43.

FIG. 44 is a circuit diagram of a multiplexer MU31 shown in FIG. 43. Referring to FIG. 44, the multiplexer MU31 is identical to the multiplexer MU11 except for that selecting units 101 to 104 are additionally provided to the multiplexer MU11 shown in FIG. 33.

The selecting units 101 to 104 are connected to gates 295 to 298, respectively. The selecting unit 101 receives first bit and second bit distance signals from the path encoder PE'$_1$ at their terminals in1 and in2, respectively and a signal even from the control circuit for the associative memory 100A. When the signal even is "1", the selecting unit 101 outputs the first bit distance signal to the gate 295. When the signal even is "0", the selecting unit 101 outputs the second bit distance signal to the gate 295.

The selecting unit 102 receives the third bit and fourth bit distance signal from the path encoder PE'$_1$ at their terminals in1 and in2 respectively and a signal even from the control circuit for the associative memory 100A. When the signal even is "1", the selecting unit 102 outputs the third distance signal to the gate 296. When the signal even is "0", the selecting unit 102 outputs the fourth distance signal to the gate 296.

The selecting unit 103 receives the fifth bit and sixth bit distance signal from the path encoder PE'$_1$ at their terminals in1 and in2, respectively and a signal even from the control circuit for the associative memory 100A. When the signal even is "1", the selecting unit 103 outputs the fifth distance signal to the gate 297. When the signal even is "0", the selecting unit 103 outputs the sixth distance signal to the gate 297.

The selecting unit 104 receives the seventh and eighth bit distance signals from the path encoder PE'$_1$ at the terminals in1 and in2, respectively and a signal even from the control circuit for the associative memory 100A. When the signal even is "1", the selecting unit 104 outputs the seventh bit distance signal to the gate 298. When the signal even is "0", the selecting unit 104 outputs the eighth bit distance signal to the gate 298.

Note that the multiplexers MU32 to MU3W and MU41 to MU4W shown in FIG. 43 each have the same circuit configuration as that of the multiplexer MU31. In each of the multiplexers MU41 to MU4W, the selecting units 101 to 104 carries out the reversed operation from the operation in the multiplexers MU31 to MU3W. More specifically, in each of the multiplexers MU41 to MU4W, when the signal even is "1", the selecting units 101 to 104 output a signal received at the terminal in2 and when the signal even is 0, the selecting units 101 to 104 output a signal received at the terminal in1. In the multiplexers MU41 to MU4W, an OR circuit 290 operates the logical sum of the signal SW_2 and the signal SHIFT_evenBIT_SET and output the operated logical sum to the terminals CLK of the shift registers 291 to 294.

Figure 45:
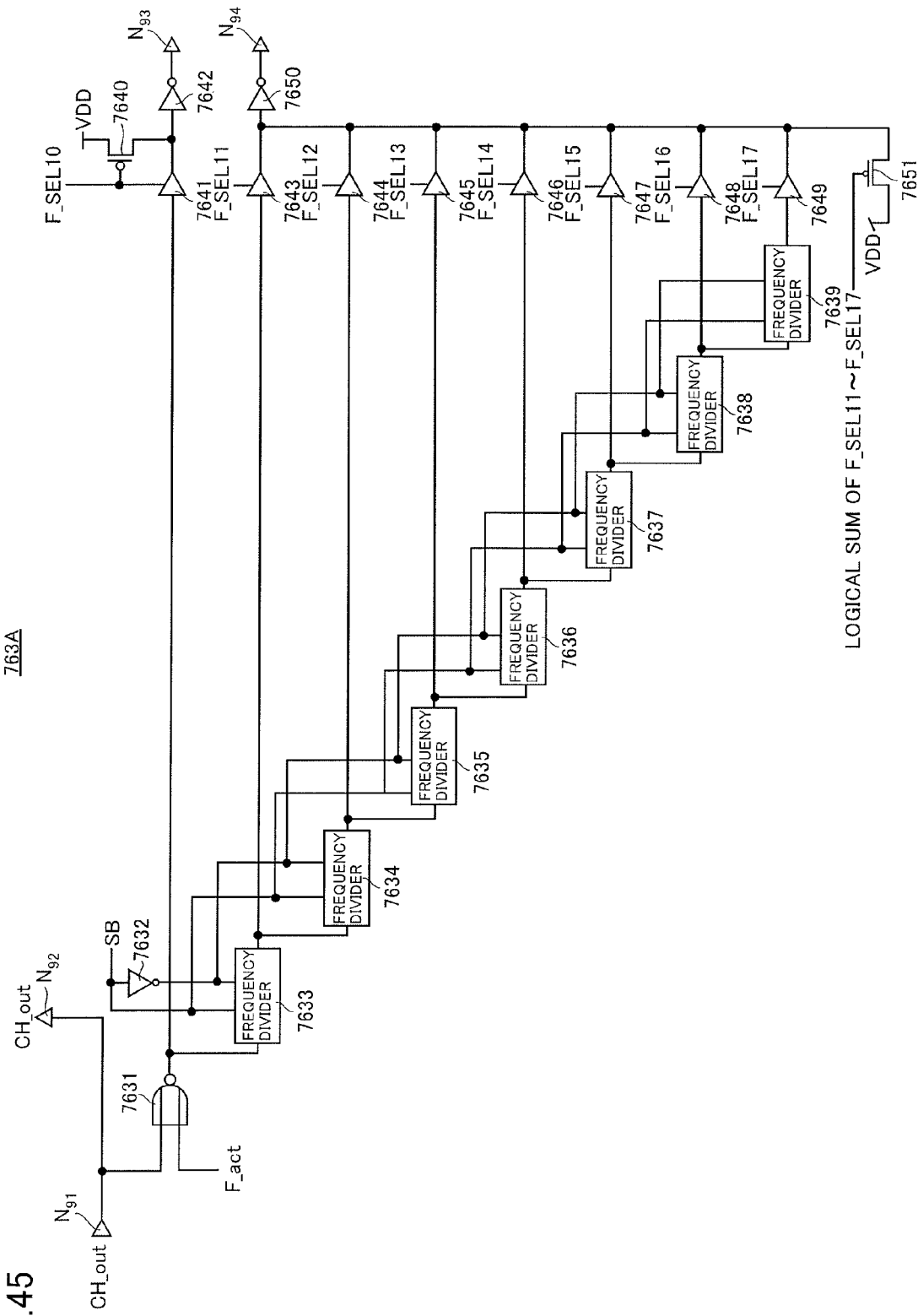
FIG. 45 is a circuit diagram of the stage number variable frequency divider shown in FIG. 43.

FIG. 45 is a circuit diagram of the stage number variable frequency divider 763A shown in FIG. 43. Referring to FIG. 45, the stage number variable frequency divider 763A is identical to the stage number variable frequency divider 763 except for that gates 7644, 7646, and 7648 are additionally provided to the stage number variable frequency divider 763.

In the stage number variable frequency divider 763A, the frequency divider 7634 and the gate 7644 are connected in series between the output of the frequency divider 7633 and the input of the inverter 7650. The frequency divider 7635 and the gate 7645 are connected in series between the output of the frequency divider 7634 and the input of the inverter 7650. The frequency divider 7636 and the gate 7646 are connected in series between the output of the frequency divider 7635 and the input of the inverter 7650. The frequency divider 7637 and the gate 7647 are connected in series between the output of the frequency divider 7636 and the input of the inverter 7650. The frequency divider 7638 and the gate 7648 are connected in series between the output of the frequency divider 7637 and the input of the inverter 7650. The frequency divider 7639 and the gate 7649 are connected in series between the output of the frequency divider 7638 and the input of the inverter 7650.

The gates 7644, 7646, and 7648 receive selection signals F_SEL12, F_SEL14, and F_SEL16 from the switching circuit 765, respectively and are opened/closed in response to the received selection signals F_SEL12, F_SEL14, and F_SEL16. More specifically, the gates 7644, 7646, and 7648 are opened in response to the selection signals F_SEL12, F_SEL14, and F_SEL16 consisting of "1", respectively and closed in response to the selection signals F_SEL12, F_SEL14, and F_SEL16 consisting of "0", respectively.

When the stage number variable frequency divider 763A is driven, a signal F_act consisting of "0" is input to the NOR circuit 7631 and a search start signal SB consisting of "0" and an inverted signal /SB consisting of "1" are input to the frequency dividers 7634 to 7639.

Upon receiving the selection signal F_SEL11 consisting of "1" at the gate 7643, the stage number variable frequency divider 763A frequency-divides a signal CH_out (the oscillation signal) received from the NOR circuit 7631 by 2 times using the frequency divider 7633 and outputs the result to the delay circuit 764 and the flip-flop 766 from the node $N_{94}$.

Upon receiving a selection signal F_SEL12 consisting of "1" at the gate 7644, the stage number variable frequency divider 763A frequency-dividers the signal CH_out (the oscillation signal) received from the NOR circuit 7631 by $2^2$ times and outputs the result to the delay circuit 764 and the flip-flop 766 from the node $N_{94}$.

Upon receiving a selection signal F_SEL13 consisting of "1" at the gate 7645, the stage number variable frequency divider 763A frequency-divides the signal CH_out (the oscillation signal) received from the NOR circuit 7631 by $2^3$ times with the frequency dividers 7633 to 7635 and outputs the result to the delay circuit 764 and the flip-flop 766 from the node $N_{94}$.

Upon receiving the selection signal F_SEL14 consisting of "1" at the gate 7646, the stage number variable frequency divider 763A frequency-divides the signal CH_out (the oscillation signal) received from the NOR circuit 7631 by $2^4$ times with the frequency dividers 7633 to 7636 and outputs the result to the delay circuit 764 and the flip-flop 766 from the node $N_{94}$.

Upon receiving a selection signal F_SEL15 consisting of "1" at the gate 7647, the stage number variable frequency divider 763A frequency-divides the signal CH_out (the oscillation signal) received from the NOR circuit 7631 by $2^5$ times with the frequency dividers 7633 to 7637 and outputs the result to the delay circuit 764 and the flip-flop 766 from the node $N_{94}$.

Upon receiving the selection signal F_SEL16 consisting of "1" at the gate 7648, the stage number variable frequency divider 763A frequency-divides the signal CH_out (the oscillation signal) received from the NOR circuit 7631 by $2^6$ times with the frequency dividers 7633 to 7638 and outputs the result to the delay circuit 764 and the flip-flop 766 from the node $N_{94}$.

Upon receiving the selection signal F_SEL17 consisting of "1" at the gate 7649, the stage number variable frequency divider 763A frequency-divides the signal CH_out (the oscillation signal) received from the NOR circuit 7631 by $2^7$ times with the frequency dividers 7633 to 7639 and outputs the result to the delay circuit 764 and the flip-flop 766 from the node $N_{94}$.

As a result, the stage number variable frequency divider 763A receives the selection signals F_SEL11 to F_SEL17 consisting of "1" at the gates 7643 to 7649, respectively and frequency-divides an oscillation signal by 2, $2^2$, $2^3$, $2^4$, $2^5$, $2^6$, and $2^7$ times and outputs the result to the delay circuit 764 and the flip-flop 766.

Upon receiving the selection signal F_SEL10 consisting of "1" at the gate 7641, the stage number variable frequency divider 763A outputs an oscillation signal to the frequency divider circuit 20 from the node $N_{93}$.

In this way, the stage number variable frequency divider 763A switches the frequency dividing numbers in response to the selection signals F_SEL11 to F_SEL17 to frequency-divide the oscillation signal.

Note that the stage number variable frequency divider 769A shown in FIG. 43 has the same circuit configuration as that of the stage number variable frequency divider 763A shown in FIG. 45.

Search starts in the associative memory 100A including the distance/time conversion circuit $DT'_1C$, the unit comparator circuits $UC'_{11}$ to $UC'_{1W}$ output distance signals $M1_1M2_1$ ... $MK_1$, $M1_2M2_2$ ... $MK_2$, and ... $M1_WM2_W$ ... $MK_W$ to the path encoder $PE'_1$. The unit comparator circuit $UC'_{21}$ to $UC'_{2W}$, $UC'_{R1}$ to $UC'_{RW}$ similarly output distance signals $M1_1M2_1$ ... $MK_1$, $M1_2M2_2$ ... $MK_2$, and ... $M1_WM2_W$ ... $MK_W$ to the path encoders $PE'_2$ to $PE'_R$.

The path encoder $PE'_1$ produces distance signals $M1_1M1_2$ ... $M1_W$, $M2_1M2_2$ ... $M2_W$, ... and $MK_1MK_2$ ... $MK_W$ based on the distance signals $M1_1M2_1$ ... $MK_1M1_2$, $M2_2$ ... $MK_2$, ..., and $M1_WM2_W$ ... $MK_W$. The path encoder $PE'_1$ sequentially output the distance signals $M1_1M1_2$ ... $M1_W$, $M2_1M2_2$, $M2_W$, ..., and $MK_1MK_2$, ... $MK_W$ to the multiplexers MU31 to MU3W, the distance signals $M1_1M1_2$ ... $M1_W$, $M2_1M2_2$ ... $M2_W$, ..., and $MK_1MK_2$ ... $MK_W$ to the multiplexers MU41 to MU4W. The path encoders $PE'_2$ to $PE'_R$ operate in the same manner.

In the distance/time conversion circuit $DT'_1$ (=distance/time conversion circuit $DT'_1C$), the multiplexer MU31 sequentially receives the distance signals $M1_1$, $M2_1$, $M3_1$, $M4_1$, $M5_1$, ..., $MK_1$ and thereafter, in the same manner, the multiplexer 3W–1 sequentially receives distance signals $M1_{W-1}$, $M2_{W-1}$, $M3_{W-1}$, $M4_{W-1}$, $M5_{W-1}$, ..., and $MK_{W-1}$, and the multiplexer MU3W sequentially receives distance signals $M1_W$, $M2_W$, $M3_W$, $M4_W$, $M5_W$, and $MK_W$.

The multiplexers MU41 to MU4W sequentially receive the same signals as those received by the multiplexers MU31 to MU3W, respectively.

Furthermore, the multiplexers MU31 to MU3W and MU41 to MU4W, and a switching circuit 765 receive a signal even consisting of "1" from the control circuit for the associative memory 100A.

In the multiplexer MU31, the selecting unit 101 receives the first bit distance signal M11 and the second bit distance signal M21, the selecting unit 102 receives the third bit distance signal M31 and the fourth bit distance signal M41, the selecting unit 103 receives the fifth bit distance signal $M5_1$ and the sixth bit distance signal M61, the selecting unit 104 receives the seventh bit distance signal M71 and the eight bit distance signal M81. The selecting units 101 to 104 receive a signal even consisting of "1" and therefore output the first bit distance signal $M1_1$, the third bit distance signal M31, the fifth bit distance signal M51 and the seventh bit distance signal M71, respectively to the gates 295 to 298.

On the other hand, the gate 295 receives a signal EN11 consisting of "1" from the shift register 291, and therefore the multiplexer MU31 outputs the first bit distance signal M11 to the 1-bit stage 271. The gates 296 to 298 receive signals EN12 to EN14 consisting of "0", respectively, from the shift registers 292 to 294 and therefore do not output any signal. As a result, the multiplexer MU31 outputs the first bit distance signal $M1_1$ to the 1-bit stage 271. The multiplexers MU32 to MU3W similarly output the first bit distance signal M12 to $M1_W$, respectively to the 1-bit stages 272 to 27W.

The multiplexers MU41 to MU4W similarly output the first bit distance signals M11 to $M1_W$ to the 1-bit stages 281 to 28W.

Thereafter, when the enable signal EN consisting of "1" is input to an EN selecting circuit 761, since the signal SW_1 is composed of "0", the selecting unit 7611 outputs an enable signal EN consisting of "1" to the OR circuit 7613 and the OR circuit 7613 outputs the enable signal EN consisting of "1" to the NAND circuit 762 since the signal EN_1 received at the terminal EN2 is composed of "0".

The NAND circuit 762 receives the enable signal EN consisting of "1" from the EN selecting circuit 761 and the signal CH_1_out consisting of "0" from the stage number variable frequency divider 763A. Then, the NAND circuit 762 operates the logical product of the enable signal EN consisting of "1" and the signal CH_1_out consisting of "0", inverts the operated logical product and outputs the signal consisting of "1" to the 1-bit stage 271.

The 1-bit stage 271 delays the signal consisting of "1" using a delay path selected based on the distance signal $M1_1$ and outputs the delayed signal to the 1-bit stage 272. The 1-bit stages 272 to 27W delay output signals from the 1-bit stages 271 to 27W−1 using delay paths selected based on the distance signals $M1_2$ to $M1_W$ to output. The 1-bit stage 27W outputs the output signal CH_1_out to the NAND circuit 762 through the nodes $N_{91}$ and $N_{92}$ of the stage number variable frequency divider 763A and the NAND circuit 762 operates the logical product of the enable signal EN consisting of "1" and the signal CH_1_out and inverts the operated logical product to output to the 1-bit stage 271.

As a result, the 1-bit stages 271 to 27W are connected in a ring shape through the stage number variable frequency divider 763A and the NAND circuit 762 and oscillate an oscillation signal. In this case, the oscillation circuit 752 is in a stopped state as described above.

In the switching circuit 762, when the signal FSEL_SET rises and then falls, the shift register 7652 outputs a selection signal F_SEL17="1" and selection signals F_SEL 16 to F_SEL10="0" to the selectors 7654 and 7655. The selectors 7654 and 7655 receive a signal even consisting of "1" from the control circuit for the associative memory 100A.

The selector 7654 outputs selection signals F_SEL17="1" and F_SEL16=F_SEL15=F_SEL14=F_SEL13=F_SEL12=F_SEL11=F_SEL10="0" based on the selection signals F_SEL16 to F_SEL 10="0" and the signal even consisting of "1" to the stage number variable frequency divider 763A.

The selector 7655 outputs selection signals F_SEL17=F_SEL16=F_SEL15=F_SEL14=F_SEL13=F_SEL12=F_SEL11=F_SEL10="0" based on the selection signals F_SEL17="1" and F_SEL16 to F_SEL 10="0" and the signal even consisting of "1" to the stage number variable frequency divider 769A.

Then, the stage number variable frequency divider 763A receives the selection signals F_SEL17="1" and F_SEL16=F_SEL15=F_SEL14=F_SEL13=F_SEL12=F_SEL11=F_SEL10="0" from the switching circuit 765, so that the gate 7641 and 7643 to 7648 are closed and only the gate 7649 is opened.

As a result, the oscillation signal CH_1_out output from the oscillation circuit 751 is frequency-divided by $2^7$ times by the frequency dividers 7633 to 7639 and the stage number variable frequency divider 763A outputs the signal Freq_out_1 frequency-divided by $2^7$ times to the delay circuit 764 and the flip-flop 766 from the node $N_{94}$.

The delay circuit 764 delays the signal Freq_out_1 by τ to produce a signal SW_1 and outputs the produced signal SW_1 to the EN selecting circuit 761, the multiplexers MU31 to MU3W, the switching circuit 765, and the flip-flop 767.

Then, the multiplexers MU31 to MU3W receive the signal SW_1. When the signal SW_1 rises and then falls, the shift register 292 outputs a signal EN12 consisting of "1" to the gate 296 and the shift registers 291, 293, and 294 output signals EN11, EN13, and EN14 consisting of "0", respectively to the gates 295, 297, and 298. As a result, the multiplexer MU31 outputs the third bit distance signal $M3_1$ to the 1-bit stage 271. The multiplexers MU32 to MU3W similarly output the third bit distance signals $M3_2$ to $M3_W$ to the 1-bit stages 272 to 27W, respectively.

On the other hand, upon receiving the signal Freq_out_1 from the stage number variable frequency divider 763A, the flip-flop 766 produces a signal EN_2 based on the signal Freq_out_1 for output to the NAND circuit 768 since the signal SW_2 is composed of "0".

The NAND circuit 768 operates the logical product of the signal EN_2 form the flip-flop 766 and the signal CH_2_out (="0") from the stage number variable frequency divider 769A, inverts the operated logical product and outputs a signal consisting of "1" to the 1-bit stage 281.

The multiplexers MU41 to MU4W outputs the second bit distance signals $M2_1$ to $M2_W$ to the 1-bit stages 281 to 28W, respectively.

Upon receiving the second bit distance signals $M2_1$ to $M2_W$ from the multiplexers MU41 to MU4W, the 1-bit stages 281 to 28W delay a signal from the NAND circuit 768 using a delay path in response to the second bit distance signals M21 to $M2_W$ to oscillate an oscillation signal CH_2_out, and outputs the oscillated oscillation signal CH_2_out to the stage number variable frequency divider 769A. In this case, the oscillation circuit 751 is in a stopped state as described above.

On the other hand, when the signal SW_1 falls, the shift register 7652 of the switching circuit 765 outputs selection signals F_SEL16="1", and F_SEL17=F_SEL15 to F_SE10="0" to the selectors 7654 and 7655.

The selector 7654 outputs selection signals F_SEL16="1" and F_SEL17=F_SEL15=F_SEL14=F_SEL13=F_SEL12=F_SEL11=F_SEL10="0" to the stage number variable frequency divider 763A based on the selection signals F_SEL16="1" and F_SEL17=F_SEL15 to F_SEL 10="0" and the signal even consisting of "1". The selector 7655 outputs selection signals F_SEL16="1" and F_SEL17=F_SEL15=F_SEL14=F_SEL13=F_SEL12=F_SEL11=F_SEL10="0" to the stage number variable frequency divider 769A based on the selection signals F_SEL16="1" and F_SEL17=F_SEL15 to F_SEL10="0" and a signal even consisting of "1".

Then, the stage number variable frequency divider 769A receives F_SEL16="1" and F_SEL17=F_SEL15=F_SEL14=F_SEL13=F_SEL12=F_SEL11=F_SEL10="0", the gates 7641, 7643 to 7647, and 7649 are closed and only the gate 7648 is opened.

The stage number variable frequency divider 769A frequency-divides the oscillation signal CH_2_out by $2^6$ times with six frequency dividers 7633 to 7638 and outputs a signal Freq_out_2 from the node $N_{94}$ to the flip-flop 767 and the delay circuit 770.

The delay circuit 770 delays the signal Freq_out_2 by % and outputs the signal SW_2 to the multiplexers MU41 to MU4W, the switching circuit 765 and the flip-flop 766.

The multiplexers MU41 to MU4W receive the signal SW_2. When the signal SW_2 rises and then falls, the shift register 292 outputs a signal $EN_{12}$ consisting of "1" to the gate 296 and the shift registers 291, 293, and 294 output signals EN11, EN13, and EN14 consisting of "0", respectively to the gates 295, 297, and 298. As a result, the multiplexer MU41 outputs the fourth bit distance signal M41 to the 1-bit stage 281. The multiplexers MU42 to MU4W similarly output the fourth bit distance signals $M4_2$ to $M4_W$ to the 1-bit stages 282 to 28w.

On the other hand, upon receiving the signal Freq_out_2, the flip-flop 767 produces the signal EN_1 based on the received signal Freq_out_2 and outputs the produced signal EN_1 to the EN selecting circuit 761.

Then, since the signal SW_1="0", the selecting unit 7611 outputs a signal consisting of "0" to the OR circuit 7613 and the OR circuit 7613 outputs a signal EN_1 consisting of "1" to the NAND circuit 762 based on the signal consisting of "0" and the signal EN_1 consisting of "1".

The NAND circuit 762 operates the logical product of the signal EN_1 consisting of "1" and the signal CH_1_out (="0") from the stage number variable frequency divider 763A, and outputs the inverse of the operated logical product as a signal consisting of "1" to the 1-bit stage 271.

The 1-bit stages 271 to 27W receive the third bit distance signal $M3_1$ to $M3_W$ from the multiplexers MU11 to MU1W, respectively.

Therefore, the 1-bit stages 271 to 27W delay signals using delay paths selected based on the third bit distance signals M31 to $M3_W$ to oscillate the oscillation signal CH_1_out and output the oscillated oscillation signal CH_1_out to the stage number variable frequency divider 763A. In this case, the oscillation circuit 752 is in a stopped state as described above.

On the other hand, the shift register 7652 of the switching circuit 765 outputs selection signals F_SEL15="1" and F_SEL17=F_SEL16=F_SEL14 to F_SEL10="0" to the selectors 7654 and 7655 when the signal SW_2 falls.

The selector 7654 outputs selection signals F_SEL15="1" and selection signals F_SEL17=F_SEL16=F_SEL14=F_SEL13=F_SEL12=F_SEL11=F_SEL10="0" to the stage number variable frequency divider 763A based on the selection signals F_SEL15="1" and F_SEL17=F_SEL16=F_SEL14 to F_SEL10="0" and a signal even consisting of "1". The selector 7655 outputs selection signals F_SEL15="1" and F_SEL17=F_SEL16=F SEL14=F_SEL13=F SEL12=F_SEL11=F_SEL10="0" to the stage number variable frequency divider 769A based on the selection signals F_SEL15="1", F_SEL17=F_SEL16=F_SEL14 to F_SEL10="0" and the signal even consisting of "1".

Then, the stage number variable frequency divider 763A receives the selection signals F_SEL 15="1" and F_SEL17=F_SEL16=F_SEL14=F_SEL13=F_SEL12=F_SEL11=F_SEL10="0", so that the gates 7641, 7643 to 7646, 7648, and 7649 are closed and the only gate 7647 is opened.

The stage number variable frequency divider 763A frequency-divides the oscillation signal CH_1_out by $2^5$ times with the five frequency dividers 7633 to 7637 and outputs the signal Freq_out_1 to the delay circuit 764 and the flip-flop 766 from the node $N_{94}$.

The delay circuit 764 delays the signal Freq_out_1 by τ and outputs the signal SW_1 to the multiplexers MU31 to MU3W, the EN selecting circuit 761, the switching circuit 765A and the flip-flop 767.

Thereafter, the above-described operation is repeatedly carried out, the oscillation circuits 751 and 752 alternately oscillate oscillation signals, the stage number variable frequency divider 763A frequency-divides the oscillation signals from the oscillation circuit 751 by $2^7, 2^5, 2^3$, and 2 times, and the stage number variable frequency divider 769A frequency-divides the oscillation signals from the oscillation circuit 752 by $2^6, 2^4, 2^2$, and 1 times. When the frequency dividing in the stage number variable frequency divider 769A ends, the switching circuit 765 outputs the selection signals F_SEL17 to F_SEL11="0" and the selection signal F_SEL10="1" to the stage number variable frequency dividers 763A and 769A.

Then, the stage number variable frequency divider 763A outputs the oscillation signal after the sequential frequency dividing by $2^7, 2^5, 2^3$, and 2 times as a signal out_1 to the selecting unit 780A. The stage number variable frequency divider 769A outputs the oscillation signal after the sequential frequency dividing by $2^6, 2^4, 2^2$, and 1 times as a signal out_2 to the selecting unit 780A.

The selecting unit 780A selects the signal out_2 in response to the signal even consisting of "1" and outputs the selected signal out_2 as an oscillation signal $S_1$ to the frequency divider circuit 20.

Note that the distance/time conversion circuits $DT'_2$ to $DT'_R$ each carry out the above-described operation and output oscillation signals $S_2$ to $S_R$ to the frequency divider circuit 20, respectively.

The operation in the frequency divider 20 and the time domain WTA circuit 30 is as described above.

In the above description, the K bit distance signal is an 8-bit signal, while the signal does not have to an 8-bit signal, and the associative memory 100A including the distance/time conversion circuit $DT'_1C$ can search for reference data similar to search data if the Manhattan distance is any of 7, 6, 5, 4, 3, and 2 bits.

Whether the Manhattan distance is 8, 7, 6, 5, 3 or 2 bits is set based on the pulse number of the signals SHIFT_ODDBIT_SET and SHIFT_evenBIT_SET.

Now, the above will be described more specifically.

When the Manhattan distance is any of 8, 6, 4, and 2 bits, the signal even is composed of "1", the pulse number of the signals SHIFT_ODDBIT_SET and SHIFT_evenBIT_SET is 1, 2, 3, and 4 respectively. More specifically, when the Manhattan distance consists of an even bit number, the pulse number of the signal SHIFT_evenBIT_SET is the same as that of the signal SHIFT_ODDBIT_SET.

When the Manhattan distance is any of 7, 5, and 3 bits, the signal even is composed of "0" and the pulse number of SHIFT_ODDBIT_SET is 1, 2, and 3 while the pulse number of the signal even is 2, 3, and 4, respectively. More specifically, the Manhattan distance consists of an odd-number bit, the pulse number of the signal SHIFT_evenBIT_SET is greater than that of the SHIFT_ODDBIT_SET by one.

When the Manhattan distance is eight bits, the signal even is "1", and the pulse number of the signals SHIFT_ODDBIT- _SET and SHIFT_evenBIT_SET is one. In this case, reference data similar to search data can be searched for by the above-described operation.

Search when the Manhattan distance is 7 bits

When the Manhattan distance is 7 bits, the signal even is composed of "0", the pulse number of signal SHIFT_ODDBIT_SET is 1, and the pulse number of the signal SHIFT_evenBIT_SET is 2. The multiplexers MU31 to MU3W sequentially output the second bit distance signal, the fourth bit distance signal, the sixth bit distance signal and the eighth bit distance signal to the 1-bit stages 271 to 27W in response to the signal even consisting of "0" and the SHIFT_ODDBIT_SET whose pulse number is 1.

On the other hand, the multiplexers MU41 to MU4W sequentially output the third bit, the fifth bit, and the seventh bit distance signals to the 1-bit stages 281 to 28W in response to the signal even consisting of "0" and the SHIFT_evenBIT_SET whose pulse number is 2. In this case, in each of the multiplexers MU41 to MU4W, since the shift register 291 is skipped by two pulses (substantially ignored), the multiplexer MU41 to MU4W can sequentially output the third bit, fifth bit, and seventh bit distance signals to the 1-bit stages 281 to 28W, respectively.

Therefore, when the Manhattan distance is 7 bits, reference data similar to search data can be searched for by the above-described operation. In this case, the selecting unit 780A outputs the signal out_1 from the stage number variable frequency divider 763A as an oscillation signal $S_1$ to the frequency divider circuit 20 in response to the signal even consisting of "0".

Search when the Manhattan distance is 6 bits

When the Manhattan distance is 6 bits, the signal even is composed of "1" and the pulse number of signals SHIFT_ODDBIT_SET and SHIFT_evenBIT_SET is two. The multiplexers MU31 to MU3W sequentially output the third bit distance signal, the fifth bit distance signal and the seventh bit distance signal, respectively to the 1-bit stages 271 to 27W based on the signal even consisting of "1" and the signal SHIFT_ODDBIT_SET whose pulse number is 2. In this case, in each of the multiplexers MU31 to MU3W, the shift register 291 is skipped by the two pulses (substantially ignored), so that the multiplexers MU31 to MU3W sequentially output the third bit distance signal, the fifth bit distance signal and the seventh bit distance signal to the 1-bit stage 271 to 27W, respectively.

On the other hand, the multiplexers MU41 to MU4W sequentially output the fourth bit distance signal, the sixth bit distance signal and the eighth bit distance signal, respectively to the 1-bit stages 281 to 28W based on the signal even consisting of "1" and the signal SHIFT_evenBIT_SET whose pulse number is 2. In this case, in each of the multiplexers MU41 to MU4W, the shift register 291 is skipped by the two pulses (substantially ignored), so that the multiplexers MU41 to MU4W sequentially output the fourth bit distance signal, the sixth bit distance signal and the eighth bit distance signal to the 1-bit stages 281 to 28W, respectively.

Therefore, when the Manhattan distance is 6 bits, reference data similar to search data can be searched for by the above-described operation. In this case, the selecting unit 780A outputs the signal out_2 from the stage number variable frequency divider 769A as an oscillation signal $S_1$ to the frequency divider circuit 20 in response to the signal even consisting of "1".

Search when the Manhattan distance is 5 bits

When the Manhattan distance is 5 bits, the signal even is composed of "0", the pulse number of the signal SHIFT_ODDBIT_SET is 2, and the pulse number of SHIFT_evenBIT_SET is 3. The multiplexers MU31 to MU3W sequentially outputs the fourth bit distance signal, the sixth bit distance signal and the eighth bit distance signal, respectively to the 1-bit stages 271 to 27W based on the signal even consisting of "0" and the signal SHIFT_ODDBIT_SET whose pulse number is 2. In this case, in each of the multiplexers MU31 to MU3W, the shift register 291 is skipped by the two pulses (substantially ignored), so that the multiplexers MU31 to MU3W sequentially output the fourth bit distance signal, the sixth bit distance signal and the eighth bit distance signal to the 1-bit stages 271 to 27W.

On the other hand, the multiplexers MU41 to MU4W sequentially output the fifth bit and seventh bit distance signals to the 1-bit stages 281 to 28W in response to the signal even consisting of "0" and the signal SHIFT_evenBIT_SET whose pulse number is 3. In this case, in each of the multiplexers MU41 to MU4W, the shift registers 291 and 292 are skipped (substantially ignored) by the three pulses, so that the multiplexers MU41 to MU4W sequentially output the fifth bit distance signal and the seventh bit distance signal to the 1-bit stages 281 to 28W.

Therefore, the Manhattan distance is 5 bits, reference data similar to the search data can be searched for by the above-described operation. In this case, the selecting unit 780A outputs the signal out_1 from the stage number variable frequency divider 763A as an oscillation signal $S_1$ to the frequency divider circuit 20 in response to the signal even consisting of "0".

Search when Manhattan distance is 4 bits

When the Manhattan distance is 4 bits, the signal even is composed of "1" and the pulse number of the signals SHIFT_ODDBIT_SET and SHIFT_evenBIT_SET is 3. The multiplexers MU31 to MU3W sequentially output the fifth bit distance signal and the seventh bit distance signal to the 1-bit stages 271 to 27W in response to the signal even consisting of "1" and the signal SHIFT_ODDBIT_SET whose pulse number is 3. In this case, in each of the multiplexers MU31 to MU3W, since the shift registers 291 and 292 are skipped (substantially ignored) by three pulses, the multiplexers MU31 to MU3W sequentially output the fifth bit distance signal and the seventh bit distance signal to the 1-bit stages 271 to 27W.

On the other hand, the multiplexers MU41 to MU4W sequentially output the sixth bit distance signal and the eighth bit distance signal to the 1-bit stages 281 to 28W in response to the signal even consisting of "1" and the signal SHIFT_evenBIT_SET whose pulse number is 3. In this case, in each of the multiplexers MU41 to MU4W, since the shift registers 291 and 292 are skipped (substantially ignored) by three pulses, the multiplexers MU41 to MU4W sequentially output the sixth bit distance signal and the eighth bit distance signal to the 1-bit stages 281 to 28W, respectively.

Therefore, when the Manhattan distance is 4 bits, reference data similar to the search data can be searched for by the above-described operation. In this case, the selecting unit 780A outputs the signal out_2 from the stage number variable frequency divider 769A as an oscillation signal S1 to the frequency divider circuit 20 in response to the signal even consisting of "1".

Search when the Manhattan distance is 3 bits

When the Manhattan distance is 3 bits, the signal even is composed of "0", the pulse number of the signal SHIFT_ODDBIT_SET is 3 and the pulse number of the SHIFT_evenBIT_SET is 4. The multiplexers MU31 to MU3W sequentially output the sixth bit distance signal and the eighth bit distance signal to the 1-bit stages 271 to 17W in response to the signal even consisting of "0" and the signal SHIFT_OD- DBIT_SET whose pulse number is 3. In this case, in each of the multiplexers MU31 to MU3W, the shift registers 291 and 292 are skipped (substantially ignored) by three pulses, the multiplexers MU31 to MU3W sequentially output the sixth bit distance signal and the eighth bit distance signal to the 1-bit stages 271 to 27W.

On the other hand, the multiplexers MU41 to MU4W output the seventh bit distance signal to the 1-bit stages 281 to 28W in response to the signal even consisting of "0" and the signal SHIFT_evenBIT_SET whose pulse number is 4. In this case, in each of the multiplexers MU41 to MU4W, since the shift registers 291 to 293 are skipped (substantially ignored) by three pulses, the multiplexers MU41 to MU4W output the seventh bit distance signal to the 1-bit stages 281 to 28W, respectively.

Therefore, when the Manhattan distance is 3 bits, reference data similar to search data can be searched for by the above-described operation. In this case, the selecting unit 780A outputs the signal out_1 from the stage number variable frequency divider 763A as an oscillation signal $S_1$ to the frequency divider circuit 20 in response to the signal even consisting of "0".

Search when the Manhattan distance is two bits

When the Manhattan distance is 2 bits, the signal even is composed of "1" and the pulse number of the signals SHIFT_ODDBIT_SET and SHIFT_evenBIT_SET is 4. The multiplexers MU31 to MU3W output the seventh bit distance signal to the 1-bit stages 271 to 17W in response to the signal even consisting of "1" and the signal SHIFT_ODDBIT_SET whose pulse number is 4. In this case, in each of the multiplexers MU31 to MU3W, since the shift registers 291 to 293 are skipped (substantially ignored) by four pulses, the multiplexers MU31 to MU3W output the seventh bit distance signal a to the 1-bit stages 271 to 27W, respectively.

On the other hand, the multiplexers MU41 to MU4W output the eighth bit distance signal to the 1-bit stages 281 to 28W in response to the signal even consisting of "1" and the signal SHIFT_evenBIT_SET whose pulse number is 4. In this case, in each of the multiplexers MU41 to MU4W, since the shift registers 291 to 293 are skipped (substantially ignored) by four pulses, the multiplexers MU41 to MU4W output the eighth bit distance signal to the 1-bit stages 281 to 28W, respectively.

Therefore, when the Manhattan distance is 2 bits, reference data similar to search data can be searched for by the above-described operation. In this case, the selecting unit 780A outputs the signal out_2 from the stage number variable frequency divider 769A as an oscillation signal $S_1$ to the frequency divider circuit 20 in response to the signal even consisting of "1".

In this way, when the Manhattan distance is two bits or more, the associative memory 100A including the distance/time conversion circuit $DT'_1C$ can search for reference data similar to search data.

In the foregoing description, the maximum bit number of the Manhattan distance is eight, but the number is not limited to this according to the embodiment of the invention, and the bit number of the Manhattan distance needs only be an arbitrary number not less than 2. When the bit number of the Manhattan distance is greater than eight, the numbers of shift registers, gates, and selecting units in the multiplexers MU31 to MU3W and MU41 to MU4W may be increased depending on the bit number of the Manhattan distance.

Also in the foregoing description, the unit comparator circuits $UC'n$ to $UC'_{1W}$, $UC'_{21}$ to $UC'_{2W}$, . . . , and $UC'_{R1}$ to $UC'_{RW}$ calculate the distance between reference data and search data using the Manhattan distance, but the embodiment of the invention is not limited to the arrangement and the unit comparator circuits $UC'_{11}$ to $UC'_{1W}$, $UC'_{21}$ to $UC'_{2W}$, . . . , and $UC'_{R1}$ to $UC'_{RW}$ may calculate the distance between reference data and search data using any of Euclidean distance, standard Euclidean distance, Mahalanobis distance, Chebyshev distance, and Minkowski distance.

The description of the first embodiment applies to the other part of the second embodiment.

It is to be understood that the embodiments disclosed herein are illustrative and not restrictive. The scope of the invention is defined by the appended claims rather than by the description preceding them, and all modifications that fall within the scope of claims and equivalence thereof are intended to be embraced by the claims.

The invention claimed is:

1. An associative memory, comprising:
a reference data storage cell circuit that stores R reference data pieces each having a W bit length, R being an integer not less than 2, W being an integer not less than 2;
a comparator circuit that compares search data to be searched for and having a W bit length to each of said R reference data pieces on a bit basis and outputs R distance signals each representing a distance between said search data and said reference data and having bit values for W bits as a comparison result between said search data and said R reference data;
R conversion circuits provided corresponding to said R distance signals and each having an oscillation circuit including k delay circuits connected in a ring shape, k being an integer that satisfies W/N or (W/N)+1, N being an integer not less than 3;
R selection circuits provided corresponding to said R distance signals and said R conversion circuits and each including k path selection circuits; and
a detecting circuit that detects an earliest changing output signal among R output signals output from said R conversion circuits and outputs the detected signal as a signal representing the most similar reference data to said search data, wherein
said R selection circuits each produce k selection signals used to select one delay path from N+1 delay paths in each of said k delay circuits based on said corresponding W-bit distance signal so that delay time in said k delay circuits is shorter as a distance represented by a corresponding W-bit distance signal is smaller and delay time in said k delay circuits is longer as the distance represented by said corresponding W-bit distance signal is greater and outputs the produced k selection signals to said corresponding conversion circuit, and
upon receiving said k selection signals from said corresponding selection circuit, said R conversion circuits each oscillate through k delay paths selected by the received k selection signals and outputs the oscillated oscillation signals as an output signal to said detection circuit.

2. The associative memory according to claim 1, further comprising a frequency divider that frequency-divides R output signals output from said R conversion circuits and outputs the R frequency-divided output signals to said detection circuits.

3. The associative memory according to claim 1, wherein said k path selection circuits are provided corresponding to said k delay circuits,
said k path selection circuits each receive an N bit distance signal of a W bit distance signal output to a selecting circuit including said k path selection circuits, produces a selection signal used to select one delay path from said N+1 delay paths so that delay time is shorter as a distance represented by the received N bit distance signal is smaller and delay time is longer as the distance represented by said received N bit distance signal is greater, and outputs the produced selection signal to said corresponding delay circuit, and said k delay circuits each include said N+1 delay paths and, upon receiving said selection signal from said corresponding path selection circuit, said k delay circuits each delay a signal by said one delay path selected by said received selection signal.

4. The associative memory according to claim 3 wherein each of said k delay circuits includes:
an input node;
an output node;
a first delay path including a first gate connected between said input node and said output node; and
N delay paths each including a second gate provided on said input node side, a third gate connected to said output node, and a delay unit connected between said second gate and said third gate, wherein
said second gate of a second delay path adjacent to said first delay path among said N delay paths is connected to said input node,
N−1 said second gates included in N−1 delay paths other than said second delay path among said N delay paths are connected to an output side of said delay unit included in an adjacent delay path on said first delay path side, respectively,
said first gate, said N second gates and said N third gates are opened/closed by said selection signal so that when a distance represented by said N bit distance signal is d, a signal is output to said output node through d said delay units from said input node, d being any of 0, 1, 2, . . . N.

5. The associative memory according to claim 4, wherein each of said k path selection circuits includes:
N−1 first selection signal producing circuits connected in series; and
a second selection signal producing circuit that produces, based on N output signals output from the N−1-th first selection signal producing circuit from the input side among said N−1 first selection signal producing circuits, N−1 first selection signals used to open/close N−1 said third gates excluding said first gate and said third gate included in the N+1-th delay path provided in a location furthest from said first delay path and N second selection signals used to open/close said N second gates, wherein
said N−1 first selection signal producing circuit includes:
a first signal producing circuit producing two selection signals based on bit values for the first and second bit among said W bit distance signal; and
N−2 second signal producing circuits each producing m+1 selection signals based on m selection signals and a bit value for the n-th bit in said W bit distance signal, m being an integer satisfying 2≤m≤N−1, n being an integer satisfying 3≤n≤N, wherein
each of said N−2 second signal producing circuits receives said m selection signals from said first signal producing circuit or the second signal producing circuit on said first signal producing circuit side,
said second selection signal producing circuit outputs said N−1 first selection signal to said N−1 third gates, outputs said N second selection signals to said N second gates, outputs an inverted signal of said second selection signal to be output to said second gate included in said second delay path to said first gate, and outputs the same signal as said second selection signal to be output to said second gate included in said N+1-th delay path to said third gate included in said N+1-th delay path.

6. An associative memory, comprising:
a reference data storage cell circuit that stores W×R reference data pieces composed of W reference data pieces having K bit length being arranged in a column direction and R reference data pieces being arranged in a row direction, W being an integer not less than 2, R being an integer not less than 2,
a comparator circuit that compares search data to be searched for and having a K bit length with each of said W×R reference data pieces on a bit basis, and outputs W×R distance signals each representing a distance between said search data and said reference data and each including a bit value for K bit as a comparison result between said search data and said W×R reference data pieces;
R conversion circuits provided corresponding to R distance signals that represent a result of comparison between W reference data pieces each arranged in said column direction and said search data;
R selection circuits provided corresponding to said R distance signals and said R conversion circuits, and
a detection circuit that detects an earliest changing output signal among R output signals output from said R conversion circuits and outputs the detected output signal as a signal representing reference data the most similar to said search data, wherein
each of said R selection circuits produces, based on W×K bit values of a corresponding distance signal among said R distance signals, a selection signal used to select a first delay path having first delay time when the same order bits of said reference data and said search data are different and to select a second delay path having second delay time shorter than said first delay time when said same order bits are matched each other, and
each of said R conversion circuits converts said distance signal into an oscillation signal sequentially from a first distance signal to a second distance signal using said first or second delay paths selected by a selection signal received from said corresponding selection circuit so that delay time is sequentially reduced and frequency is sequentially raised from said first distance signal that represents a distance between the most significant bits of said reference data and said search data to said second distance signal that represents a distance between the least significant bits of said reference data and said search data, and outputs the converted oscillation signal to said detection circuit as an output signal.

7. The associative memory according to claim 6, wherein each of said R conversion circuits includes:
K oscillation circuits each including W delay circuits connected in a ring shape and provided corresponding to K bit positions of said reference data and said search data;
K−1 selecting units each provided between two adjacent oscillation circuits and connecting said K oscillation circuits in series; and
an activating circuit provided between an oscillation circuit on end of said series connected K oscillation circuits and an oscillation circuit on the other end of said series connected K oscillation circuits to output an activation signal used to activate the conversion circuit to the oscillation circuit on said one end, wherein
each of said K−1 selecting units outputs an output signal from one oscillation circuit of said two oscillation circuits as an input signal to said one oscillation circuit, and outputs an output signal from said one oscillation circuit to the other oscillation circuit of said two oscillation circuits when the number output to said one oscillation circuit reaches a desired magnitude, each of said W delay circuits has said first and second delay paths, delays an input signal using said first or second delay path selected by said selection signal and outputs the delayed signal to an adjacent delay circuit, in said K oscillation circuits, said first delay time in said first delay path is sequentially reduced from the oscillation circuit on said one end to the oscillation circuit on said other end, and each of said R selecting circuits produces K W-bit signals representing a result of comparison of bits of said W reference data pieces and said search data in the same bit order position, produces K selection signals used to select said first or second delay path based on the produced K W bit distance signals so that delay time is longer as a distance represented by said W bit distance signal is larger and delay time is shorter as the distance represented by said W bit distance signal is smaller, and outputs said produced K selection signals to said K oscillation circuits so that each selection signal is output to an oscillation circuit provided corresponding to each bit position.

8. The associative memory according to claim 6, wherein each of said R conversion circuits includes:

K oscillation circuits each including W delay circuits connected in a ring shape and provided corresponding to K bit positions of said reference data and said search data;

K−1 frequency dividers each provided between two oscillation circuits adjacent to each other and connecting said K oscillation circuits in series; and an activation circuit provided between an oscillation circuit on one end of K oscillation circuits connected in series and an oscillation circuit on the other end of said K oscillation circuits connected in series to output an activation signal used to activate the conversion circuit to the oscillation circuit on said one end, wherein each of said K−1 frequency dividers frequency-divides an output signal from one oscillation circuit of said two oscillation circuits to output to said one oscillation circuit, and outputs the frequency-divided signal to the other oscillation circuit of said two oscillation circuits when the number of frequency-dividing reaches a desired number of times, each of said W delay circuits has said first and second delay paths, delays an input signal using said first or second delay path selected by said selection signal and outputs the delayed signal to an adjacent delay circuit, W said first delay time in W said first delay paths included in said W delay circuit is equal, in said K−1 frequency dividers, the number of frequency-dividing is reduced in the direction from a frequency divider that receives an output signal from the oscillation circuit on said one end to a frequency divider that outputs a signal to the oscillation circuit on the other end, and each of said R selection circuits produces K W bit distance signals that represent a comparison result between the same order bits of said W reference data pieces and said search data based on said W×K bit values, produces K selection signals used to select said first or second delay path based on the produced K W bit distance signals so that delay time is longer as a distance each represented by said W bit distance signal is larger, and the delay time is shorter as the distance represented by said W bit distance signal is smaller, and outputs said produced K selection signals to said K oscillation circuits, respectively, so that each selection signal is output to an oscillation circuit provided corresponding to each bit position.

9. The associative memory according to claim 6, wherein each of said R conversion circuits includes:

a first oscillation circuit each having said first and second delay paths and including W delay circuits connected in a ring shape;

a second oscillation circuit each having said first and second delay paths and including W delay circuits connected in a ring shape;

a first frequency divider that frequency-divides an output signal from said first oscillation circuit a desired number of times and outputs the frequency-divided signal to said second oscillation circuit;

a second frequency divider that frequency-divides an output signal from said second oscillation circuit a desired number of times and outputs the frequency-divided signal to said first oscillation circuit; and an activation circuit provided between said second frequency divider and said first oscillation circuit to output an activation signal used to activate the conversion circuit to said first oscillation circuit, wherein said first frequency divider receives, from the first oscillation circuit, an oscillation signal produced by converting the first distance signal that represents a result of comparison between odd-number bits from the most significant bits of said reference data and said search data, frequency-divides said received oscillation signal by such a small number that said first distance signal represents a result of comparison between the lower order bits and outputs the frequency-divided signal to said second oscillation circuit, said second frequency divider receives, from the second oscillation circuit, an oscillation signal produced by converting the second distance signal representing a result of comparison between even-number bits of said reference data and said search data from the most significant bit, frequency-divides said received oscillation signal by such a number that said second distance signal represents a result of comparison between low order bits and outputs the frequency-divided signal to said first oscillation circuit, and each of said R selection circuits produces K W bit distance signals that represent a result of comparison between the same order bits of said W reference data pieces and said search data based on said W×K bit values, produces K selection signals used to select said first or second delay path based on the produced K W bit distance signals so that delay time is longer as a distance represented by said W bit distance signal is larger and delay time is shorter as the distance represented by said W bit distance signal is smaller, and outputs said K selection signals alternately to said first and second oscillation circuits so that a selection signal produced based on said first distance signal is output to said first oscillation circuit, and a selection signal produced based on said second distance signal is output to the second oscillation circuit.

* * * * *